(12) United States Patent
Akagawa et al.

(10) Patent No.: US 7,890,203 B2
(45) Date of Patent: Feb. 15, 2011

(54) WIRING FORMING SYSTEM AND WIRING FORMING METHOD FOR FORMING WIRING ON WIRING BOARD

(75) Inventors: Masatoshi Akagawa, Nagano (JP); Kazunari Sekigawa, Nagano (JP); Shinichi Wakabayashi, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 2313 days.

(21) Appl. No.: 10/444,974

(22) Filed: May 27, 2003

(65) Prior Publication Data

US 2003/0224266 A1 Dec. 4, 2003

(30) Foreign Application Priority Data

May 28, 2002 (JP) .............................. 2002-154119
Dec. 12, 2002 (JP) .............................. 2002-360774

(51) Int. Cl.
G06F 19/00 (2006.01)
G03F 9/00 (2006.01)
G03F 1/00 (2006.01)
G03F 7/20 (2006.01)
G03C 5/00 (2006.01)

(52) U.S. Cl. ........................... 700/121; 430/22; 430/30; 430/5; 430/296; 430/396; 355/53; 355/67; 355/77

(58) Field of Classification Search ................... 355/53, 355/67, 77
See application file for complete search history.

(56) References Cited

U.S. PATENT DOCUMENTS

| | | | |
|---|---|---|---|
| 4,498,010 A * | 2/1985 | Biechler et al. .......... 250/492.2 |
| 4,623,256 A | 11/1986 | Ikenaga et al. | |
| 4,761,561 A | 8/1988 | Fujiwara et al. | |
| 4,810,095 A | 3/1989 | Kawauchi et al. | |
| 5,020,219 A * | 6/1991 | Leedy .......................... 29/846 |
| 5,124,927 A * | 6/1992 | Hopewell et al. ........... 700/121 |

(Continued)

FOREIGN PATENT DOCUMENTS

JP        7-202430        8/1995

(Continued)

OTHER PUBLICATIONS

J. B. Szczech et al, "Fine-Line Conductor Manufacturing Using Drop-on-Demand PZT Printing Technology," IEEE Transactions on Electronics Packaging Manufacturing, IEEE Service Center, 2002, pp. 26-33.

(Continued)

*Primary Examiner*—Albert Decady
*Assistant Examiner*—Sunray R Chang
(74) *Attorney, Agent, or Firm*—Staas & Halsey LLP

(57) ABSTRACT

A wiring forming system comprises: maskless exposure unit which directly exposes an unexposed board by using exposure data generated based on design data relating to an wiring board; post-development inspect unit which tests the board after development, by using the exposure data and the image data of the board exposed and developed by the maskless exposure unit; etching unit which etches the developed board; and post-etching inspect unit which tests an etching pattern formed on the etched board, by using etching inspect data generated based on the design data and the image data of the board etched by the etching unit.

31 Claims, 35 Drawing Sheets

U.S. PATENT DOCUMENTS

| | | | |
|---|---|---|---|
| 5,198,986 A | | 3/1993 | Ikeda et al. |
| 5,472,828 A | | 12/1995 | Akins et al. |
| 5,592,211 A | * | 1/1997 | Porter et al. ............... 347/260 |
| 5,717,204 A | * | 2/1998 | Meisburger et al. ......... 250/310 |
| 5,763,123 A | | 6/1998 | Shishido et al. |
| 5,798,529 A | * | 8/1998 | Wagner ................. 250/492.21 |
| 5,811,223 A | * | 9/1998 | Bae ........................... 430/312 |
| 5,827,775 A | * | 10/1998 | Miles et al. ................ 438/622 |
| 5,870,176 A | * | 2/1999 | Sweatt et al. ................. 355/53 |
| 6,069,971 A | | 5/2000 | Kanno et al. |
| 6,312,134 B1 | * | 11/2001 | Jain et al. ................... 359/855 |
| 6,374,397 B1 | * | 4/2002 | Miyamoto et al. ............ 716/21 |
| 6,389,323 B1 | | 5/2002 | Yang et al. |
| 6,498,685 B1 | * | 12/2002 | Johnson ..................... 359/626 |
| 6,544,698 B1 | * | 4/2003 | Fries ........................... 430/22 |
| 6,627,362 B2 | * | 9/2003 | Stivers et al. .................. 430/5 |
| 2001/0035267 A1 | * | 11/2001 | Savareigo ................... 156/345 |
| 2001/0053243 A1 | * | 12/2001 | Norioka et al. ............. 382/145 |
| 2002/0037462 A1 | | 3/2002 | Ogata et al. |
| 2003/0173713 A1 | * | 9/2003 | Huang ....................... 264/401 |
| 2004/0222197 A1 | | 11/2004 | Hiramatsu |

FOREIGN PATENT DOCUMENTS

| | | |
|---|---|---|
| JP | 10-156570 | 6/1998 |
| JP | 10-177589 | 6/1998 |
| JP | 10-186683 | 7/1998 |
| JP | 10-282684 | 10/1998 |
| JP | 2000-99736 | 4/2000 |
| JP | 2000-122303 | 4/2000 |
| JP | 2001-044601 | 2/2001 |
| JP | 2001-44601 | 2/2001 |
| JP | 2002-44601 | 2/2001 |
| JP | 2001-337461 | 12/2001 |
| KR | 2002-0025732 | 4/2002 |

OTHER PUBLICATIONS

T. Piironen et al., "Automatic Visual Inspection System for PCB-Fabrication Process," ACTA Polytechnica Scandinavica. PH, Applied Physics Series, Finnish Academy of Technical Sciences, 1985, pp. 37-40.
English language Abstract of JP 10-282684 filed Oct. 23, 1998.
English language Abstract of JP 2001-337461 filed Dec. 7, 2001.
Office Action mailed on Nov. 27, 2007 and issued in corresponding Japanese Patent Application No. 2002-360774.
Office Action mailed on May 20, 2008 and issued in corresponding Japanese Patent Application No. 2002-360774.
First Page of Chinese Patent No. 100386854 issued on May, 2008 and corresponding to the present application.
Chinese Office Action, dated Sep. 8, 2006, and issued in related Chinese Patent Application No. 03138379.3.
Korean Office Action for corresponding Korean Patent Application No. 10-2003-0033581 dated Nov. 3, 2009.

* cited by examiner

WIRING FORMING SYSTEM AND WIRING FORMING METHOD FOR FORMING WIRING ON WIRING BOARD

BACKGROUND OF THE INVENTION

1. Field of the Invention

The present invention relates to a wiring forming system and wiring forming method for forming wiring on a wiring board including a semiconductor package or another type of board.

2. Description of the Related Art

With the trend toward higher miniaturization and higher complexity of wiring patterns formed on wiring boards, there has developed a need for high-precision wiring forming techniques.

Further, the shrinking size and increasing performance of various kinds of components are driving the trend toward multilayer wiring boards. A multilayer wiring board is constructed by stacking a plurality of boards on top of another. In particular, a technique generally known as the buildup technique has come into common use in recent years; in this technique, a rigid layer containing glass cloth is formed as the center board of the multilayer board, on top of which thin insulating layers are stacked sequentially, with fine-featured wiring formed thereon, and again thin insulating layers are stacked in like manner, the process being repeated to complete the fabrication of the multilayer board.

In such multilayer boards, as vias interconnecting the wiring patterns on the respectively stacked layers are formed in addition to the wiring formed on the surface of each layer, particularly high precision is required in the formation of wiring for the multilayer board.

Generally, wiring is formed on a multilayer board by exposing the board based on design data defining a wiring pattern, and by developing it to print the desired pattern on the board and etching away unwanted portions.

FIG. 33 is a flowchart illustrating a prior art wiring forming process.

Usually, in the manufacturing process of a wiring board such as a semiconductor package, wiring for a plurality of packages or wiring boards is formed on a single large-sized board, and the large-sized board is then cut into individual unit packages or unit wiring boards.

First, in step S901, the circuit wiring for the unit wiring board is designed by CAD to generate circuit design data. That is, the circuit design data means data containing circuit design information for one unit. The wiring pattern to be formed on the wiring board is made up of conductive portions (generally called the lines) and regions (generally called the spaces) between the conductors.

Next, in step S902, considering etching line width in addition to job deck information describing how the circuit design data for each unit wiring board should be arranged on the large-sized wiring board, board layout design (an imposition job) is performed using CAM, to create board design data.

In step S903, a set of photomask is made based on the board design data created in step S902. More specifically, either the lines or the spaces are chosen as the portions to be exposed or not exposed on the board, and the portions not to be exposed are masked.

In step S904, a resist layer is exposed to light through the photomask. In this specification, the thus exposed board is called the "post-exposure board".

Usually, in the board exposing process, a post-exposure board that exactly matches the board design data cannot always be obtained because physical and chemical parameters greatly affect the exposure process. FIG. 34 is a top plan view showing a distorted board as an example. Deformation such as distortion, shrinkage/expansion, etc. occurs in the board 200 itself because of the ambient temperature, the mechanical stress applied to the board, etc.

FIGS. 35 and 36 are diagrams schematically explaining the situation when exposure is performed on a distorted board: FIG. 35 shows the post-exposure board 201 which was exposed in an ideal condition free from distortion, and FIG. 36 shows the post-exposure board 202 which was exposed in a distorted condition.

When the distortion-free ideal board 201 shown in FIG. 35 is subjected to exposure faithfully to the board design data, the pattern 250 can be formed in each designated area. On the other hand, when the distorted board 202 is subjected to exposure faithfully to the board design data, the pattern 250 is not formed in the designate area but is displaced as shown in FIG. 36. Accordingly, when forming wiring on a wiring board, the shrinkage/expansion of the board must be considered in advance. In the conventional wiring forming process, the amount of displacement existing between the exposure pattern on the post-exposure board and the board design data is calculated, and data (called "a scaling correction value") for correcting the board design data is created. This scaling correction value is fed back to the CAM process in step S902, to apply the scaling correction to the board design data. Then, the mask is remade using the corrected board design data, and the exposure is performed. By repeating this process several times, the design data is found that can accommodate the board shrinkage/expansion and distortion which can occur during the exposure process.

When the desired post-exposure board has successfully been obtained by exposing it using the design data created by considering the shrinkage/expansion and distortion of the board then, in step S905, this post-exposure board is developed, and unwanted portions of the resist layer are removed to form a resist pattern. In the case of a subtractive process, the resist pattern is left in the shape of the wiring pattern to be formed. In a semi-additive process, the resist pattern is formed in such a manner as to expose the underlying conductive layer in the shape of the wiring pattern to be formed.

Then, in step S906, the thus developed post-exposure board is etched. In this specification, the board subjected to etching is called the "post-etching board". In the case of the subtractive process, the portions of the conductive layer which are exposed through the resist pattern are removed by etching, and then the resist pattern is removed to form the wiring. In the case of the semi-additive process, a metal that forms the wiring is deposited by plating (copper plating) onto the conductive layer portions exposed through the resist pattern, and a metallization pattern is formed to form the wiring on the conductive layer. Then, the resist pattern is removed, and the portions of the conductive layer which are exposed through the metallization pattern forming the wiring are etched away, thus completing the formation of the wiring.

The etching process, like the exposure process, is greatly affected by physical or chemical parameters, and the etching cannot always be accomplished faithfully to the board design data. For example, the etching may be displaced, or the etching lines may be formed too thick or too thin, compared with the board design data. In this specification, such errors relating to etching are called "etching errors".

In the prior art, to eliminate etching errors, the amount of displacement existing between the etching pattern on the post-etching board and the board design data is calculated, and data (called the "etching correction value") for correcting the board design data is created. This etching correction value is fed back to the CAM process in step S902, to apply the etching correction to the board design data. Then, the post-etching board is obtained through the steps S903 to S906 by using the thus corrected board design data. By repeating this process, the board design data that minimizes the etching error can be obtained. Then, using the thus obtained optimum board design data, a wiring board having a plurality of unit wiring boards each having the intended wiring formed thereon is mass-produced.

As described above, in the prior art wiring forming process, scaling correction is applied for the board distortion and shrinkage/expansion that can occur during the exposure process, and etching correction is applied for etching errors that occur during the etching process, thereby correcting the board design data as needed and finding the optimum board design data through trial and error, and the wiring board is mass-produced using the thus obtained board design data.

As described above, the prior art process is time consuming, because the series of scaling correction processes consisting of mask making, exposure, and post-exposure board test has to be repeated several times in order to obtain the board design data considering the board distortion and shrinkage/expansion that can occur during the exposure process. Furthermore, the prior art process is uneconomical and wasteful as the process involves producing unusable boards.

Further, while the correction is applied so as to generate the board design data that can accommodate the distortion and shrinkage/expansion of the board as explained with reference to FIGS. 34 to 36, this correction is unique to the trial board currently being produced, and is, so to speak, a "fixed" correction value. Accordingly, in the trial production of an entirely different new board, the previously used scaling correction may be useful to a certain extent to obtain a rough trend, but it is inefficient because an entirely new scaling correction has to be applied to a new board.

What has been said of the scaling correction above is also true of the etching correction for etching errors; that is, it is inefficient and uneconomical to determine, after etching is completely finished, whether the board design data used for the etching was really appropriate data or not.

Furthermore, the exposure using a photomask involves the cost of making the photomask not only in mass production of the board but also in trial production. In particular, if the completed board does not match the design data, the mask specifically made for the board by applying the scaling correction during the trial production is rendered defective and has to be discarded, which is uneconomical.

In the prior art wiring forming system, the board during the wiring forming process can be tested only after the exposure and after the etching, and cannot be tested, for example, after developing the post-exposure board; therefore, there is still room for improving the accuracy in wiring formation.

Moreover, in the prior art wiring forming system, in the case of a multilayer board, not only is it difficult to align the plurality of layers, but it is also difficult to grasp the wiring condition on each of the stacked layers and to form interconnections between the layers. This poses a problem in the future when further miniaturization of wiring is expected.

In view of the above-outlined problems, it is an object of the present invention to provide a high-precision wiring forming system that can perform the design, testing, and formation of wiring easily and at high speed, can reduce the cost involved in the wiring formation and wiring design, can accommodate further miniaturization of wiring, and can flexibly cope with design changes.

SUMMARY OF THE INVENTION

To achieve the above object, according to a first aspect of the present invention, there is provided a wiring forming method for forming wiring on a wiring board, comprising: a post-development inspect step for testing a board exposed without using a photomask and developed, by using design data that is used for maskless exposure of an unexposed board; and a post-etching inspect step for testing an etched board produced by etching said developed board, by using said design data.

According to a second aspect of the present invention, there is provided a wiring forming method for forming wiring on a wiring board, comprising: a post-patterning inspect step for testing a wiring pattern formed on the board by inkjet technology, by using design data that is used to form the wiring pattern by inkjetting on a pre-drawing board.

First, the first aspect of the present invention will be described below.

FIG. 1 is a flowchart illustrating the wiring forming method for forming wiring on a wiring board according to the first aspect of the present invention.

The wiring forming method according to the first aspect of the present invention comprises: a maskless exposure step S101 for directly exposing an unexposed board by using exposure data generated based on design data relating to the wiring board; a post-development inspect step S102 for testing the board after development, by using the exposure data and the image data of the board exposed and developed in the maskless exposure step S101; an etching step S103 for etching the developed board; and a post-etching inspect step S104 for testing an etching pattern formed on the etched board, by using etching inspect data generated based on the design data and the image data of the board etched in the etching step.

Preferably, the wiring forming method according to the first aspect of the invention further comprises a design data generating step S100 for generating the design data.

Also, preferably, the wiring forming method further comprises a resizing rule generating step S105, based on the design data and the image data of the etched board, for estimating optimum design data for obtaining the etched board with a desired result, and generating a resizing rule that indicates how the design data currently used should be corrected to obtain the optimum design data.

FIG. 2 is a schematic block diagram showing a wiring forming system according to the first aspect of the present invention.

The wiring forming system 1 according to the present invention comprises: maskless exposure unit 11 which directly exposes an unexposed board by using exposure data generated based on design data relating to the wiring board; post-development inspect unit 12 which tests the board after development, by using the exposure data and the image data of the board exposed and developed by the maskless exposure unit 11; etching unit 13 which etches the developed board; and post-etching inspect unit 14 which tests an etching pattern formed on the etched board, by using etching inspect data generated based on the design data and the image data of the board etched by the etching unit 13.

Preferably, the wiring forming system according to the first aspect of the invention further comprises design data generating unit 10 which generates the design data.

Also preferably, the wiring forming system further comprises resizing rule generating unit 15 which, based on the design data and the image data of the etched board, estimates optimum design data for obtaining the etched board with a desired result, and generates a resizing rule that indicates how the design data currently used should be corrected to obtain the optimum design data.

Further preferably, the wiring forming system further comprises dynamic routing rules data generating unit 16 which, based on the design data and the position on the etched board at which each component is to be mounted on a unit wiring board, generates dynamic routing rules data that indicates how the wiring should be changed to achieve a desired interconnection pattern.

The maskless exposure unit 11 includes scaling correction value generating unit 17 which measures shrinkage/expansion of the developed board relative to the unexposed board and generates a scaling correction value for correcting the position and shape of the exposure data based on the measured shrinkage/expansion.

The wiring forming system 1 further comprises a raster image processor 18 which takes as inputs the design data, the resized design data produced by correcting the design data in accordance with the resizing rule, the dynamic routing rules data, the scaling correction value, etc., and the maskless exposure, the post-development inspect, and the post-etching inspect are performed using the various kinds of data stored in the raster image processor 18.

FIG. 3 is a schematic block diagram showing a modification of the wiring forming system according to the first aspect of the invention shown in FIG. 2.

To verify the accuracy of the post-development inspect and the accuracy of the post-etching inspect performed in the wiring forming system of the first aspect of the invention, the modification comprises, in addition to the various units shown in FIG. 2, a verification raster image processor 19 which generates verification exposure data and/or verification etching inspect data based on an algorithm different from the algorithm of the raster image processor 18, exposure data verification unit 20 which verifies the exposure data generated based on the design data, and etching inspect data verification unit 21 which verifies the etching inspect data generated based on the design data. Here, only one of the verification unit, the exposure data verification unit 20 or the etching inspect data verification unit 21, may be provided.

Next, the second aspect of the present invention will be described.

FIG. 4 is a flowchart illustrating the wiring forming method for forming wiring on a wiring board according to the second aspect of the present invention.

The wiring forming method according to the second aspect of the present invention comprises: an inkjet patterning step S1001 for forming a wiring pattern by inkjetting on a pre-drawing board by using drawing data generated based on design data relating to the wiring board; and a post-patterning inspect step S1002 for testing the wiring pattern formed by inkjetting on the board, by using design data and the image data of the post-patterning board on which the wiring pattern has been formed in the inkjet patterning step S1001.

Preferably, the wiring forming method according to the second aspect of the invention further comprises a design data generating step S1000 for generating the design data.

Further preferably, the wiring forming method further comprises a resizing rule generating step S1003 for, based on the design data and the image data of the post-patterning board, estimating optimum design data for obtaining the post-patterning board with a desired result, and generating a resizing rule that indicates how the design data currently used should be corrected to obtain the optimum design data.

FIG. 5 is a schematic block diagram showing a wiring forming system according to the second aspect of the present invention.

The wiring forming system 501 according to the present invention comprises: inkjet patterning unit 511 which forms a wiring pattern by inkjetting on a pre-drawing board by using drawing data generated based on design data relating to the wiring board; and post-patterning inspect unit 512 which tests the wiring pattern formed by inkjetting on the board, by using the design data and the image data of the post-patterning board on which the wiring pattern has been formed by the inkjet patterning unit 511.

Preferably, the wiring forming system according to the second aspect of the invention further comprises design data generating unit 510 which generates the design data.

Also, preferably, the wiring forming system further comprises resizing rule generating unit 515 which, based on the design data and the image data of the post-patterning board, estimates optimum design data for obtaining the post-patterning board with a desired result, and generates a resizing rule that indicates how the design data currently used should be corrected to obtain the optimum design data.

Further, preferably, the wiring forming system further comprises dynamic routing rules data generating unit 516 which, based on the design data and the position on the post-patterning board at which each electronic component is to be mounted or formed on a unit wiring board, generates dynamic routing rules data that indicates how the wiring should be changed to achieve a desired interconnection pattern.

The inkjet patterning unit 511 includes scaling correction value generating unit 517 which measures shrinkage/expansion of the post-patterning board relative to the pre-patterning board and generates a scaling correction value for correcting the position and shape of the drawing data based on the measured shrinkage/expansion.

The wiring forming system 501 further comprises a raster image processor 518 which takes as inputs the design data, the resized design data produced by correcting the design data in accordance with the resizing rule, the dynamic routing rules data, the scaling correction value, etc., and the inkjet patterning process and the post-patterning inspect are performed using the various kinds of data stored in the raster image processor 518.

FIG. 6 is a schematic block diagram showing a modification of the wiring forming system according to the second aspect of the invention shown in FIG. 5.

To verify the accuracy of the post-patterning inspect performed in the wiring forming system of the second aspect of the invention, the modification comprises, in addition to the various units shown in FIG. 5, a verification raster image processor 519 which, based on an algorithm different from the algorithm of the raster image processor 518 for generating the drawing data, generates drawing data and outputs the same as verification drawing data; and drawing data verification unit 520 which verifies the accuracy of the drawing data by using the drawing data and the verification drawing data.

According to the present invention, the design, inspection, and formation of high-precision wiring can be accomplished easily and at high speed, and the present invention can sufficiently address the need for further miniaturization of wiring expected in the future. Further, by eliminating the need for a photomask, the cost involved in the wiring formation and wiring design is reduced and, besides, as the process of the invention does not involve discarding unnecessary boards during the scaling correction, resources can be saved. Furthermore, as the scaling correction and the routing are performed dynamically, the invention can flexibly cope with design changes.

BRIEF DESCRIPTION OF THE DRAWINGS

The present invention will be more clearly understood from the description as set forth below with reference to the accompanying drawings, wherein:

FIG. 35 shows the post-exposure board which was exposed in an ideal condition free from distortion, and FIG. 36 shows the post-exposure board which was exposed in a distorted condition.

DESCRIPTION OF THE PREFERRED EMBODIMENTS

First, a wiring forming system according to a first embodiment of the present invention will be described.

FIGS. 7 to 12 are system block diagrams showing the wiring forming system according to the first embodiment of the present invention.

Generally, in a wiring forming system for a wiring board such as a semiconductor package, a plurality of packages are designed on a single large-sized board, and the wiring is formed simultaneously over the entire board; after forming the wiring, the board is cut and the individual packages or unit wiring boards having the desired wiring formed thereon are obtained simultaneously.

The first embodiment of the present invention will be described below by taking as an example the wiring forming system for an electronic component (IC) package, but it will be appreciated that the first embodiment of the invention is applicable not only to the production of semiconductor packages but also to the production of conventional wiring boards.

Figure 1:
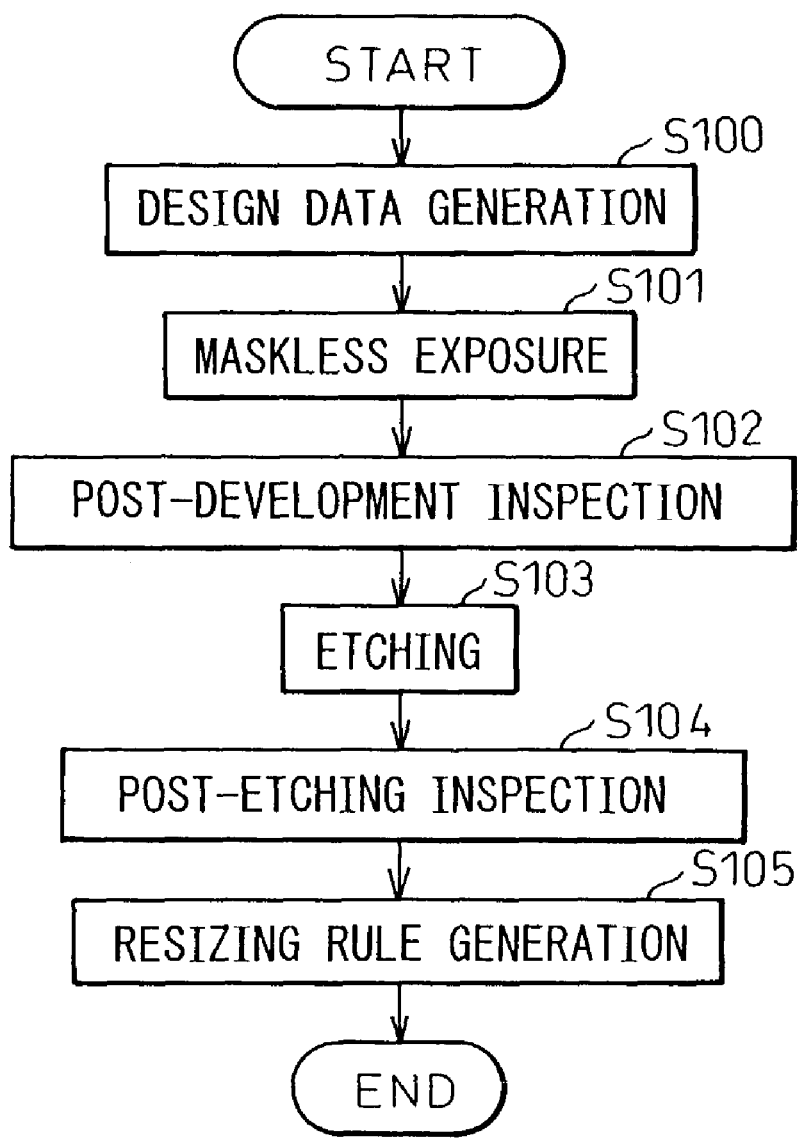
FIG. 1 is a flowchart illustrating a wiring forming method for forming wiring on a wiring board according to a first aspect of the present invention.
Figure 2:
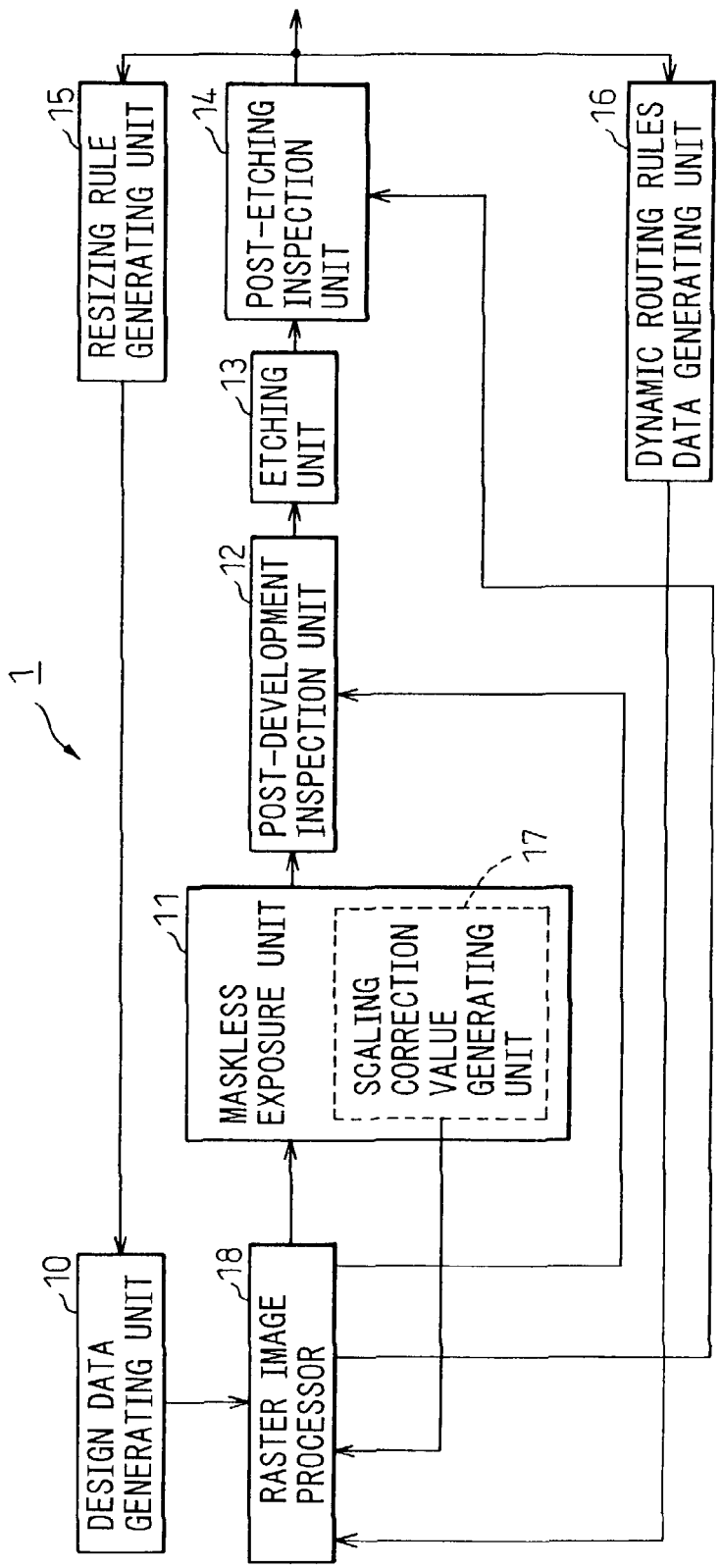
FIG. 2 is a schematic block diagram showing a wiring forming system according to the first aspect of the present invention.
Figure 3:
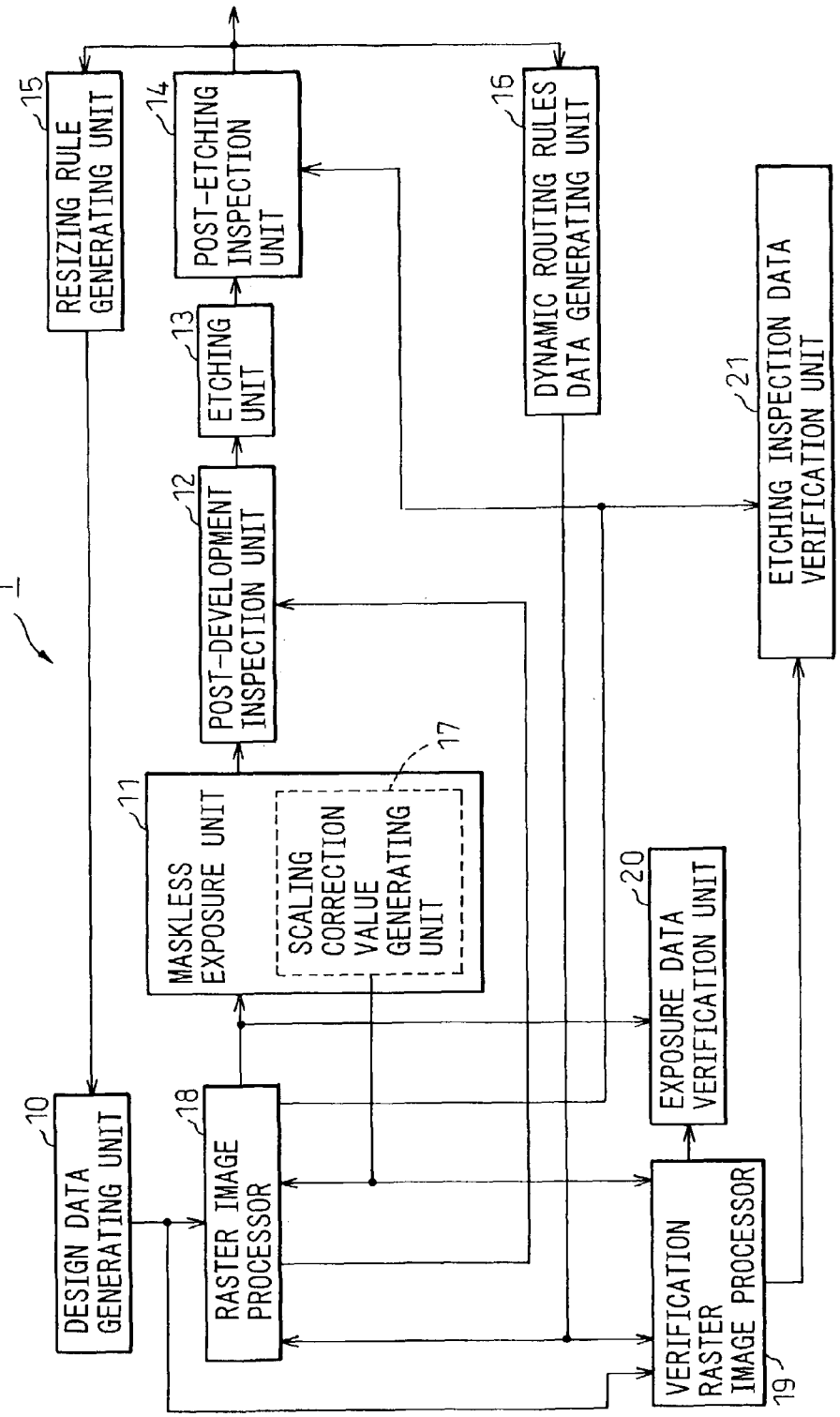
FIG. 3 is a schematic block diagram showing a modification of the wiring forming system according to the first aspect of the invention shown in FIG. 2.
Figure 4:
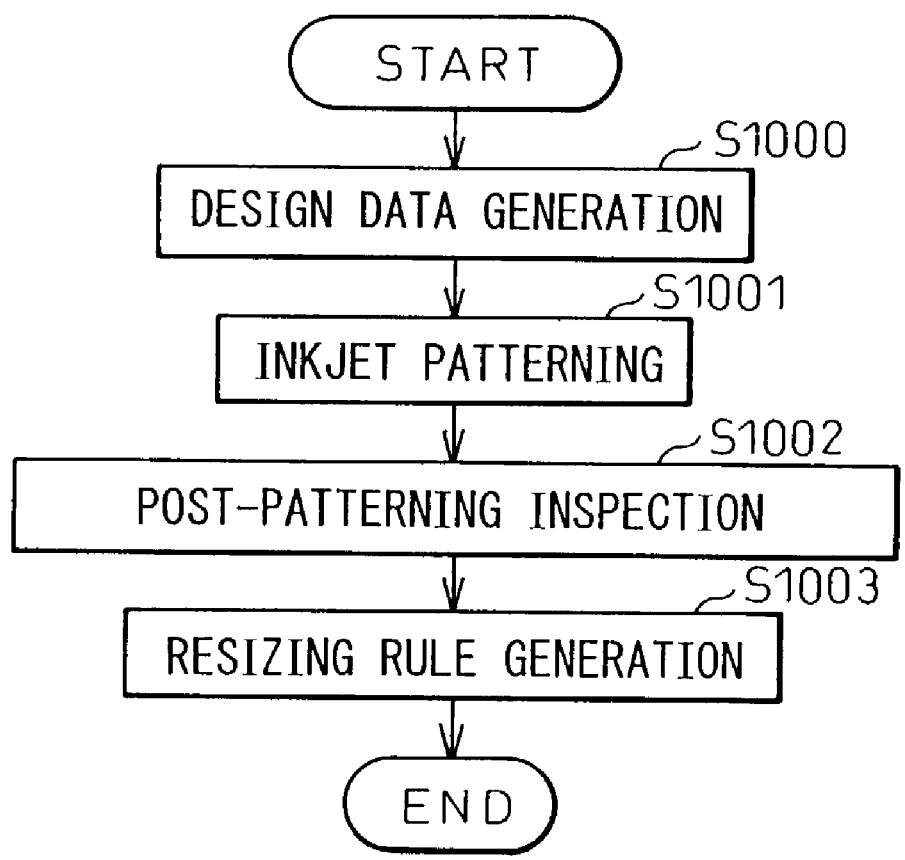
FIG. 4 is a flowchart illustrating a wiring forming method for forming wiring on a wiring board according to a second aspect of the present invention.
Figure 5:
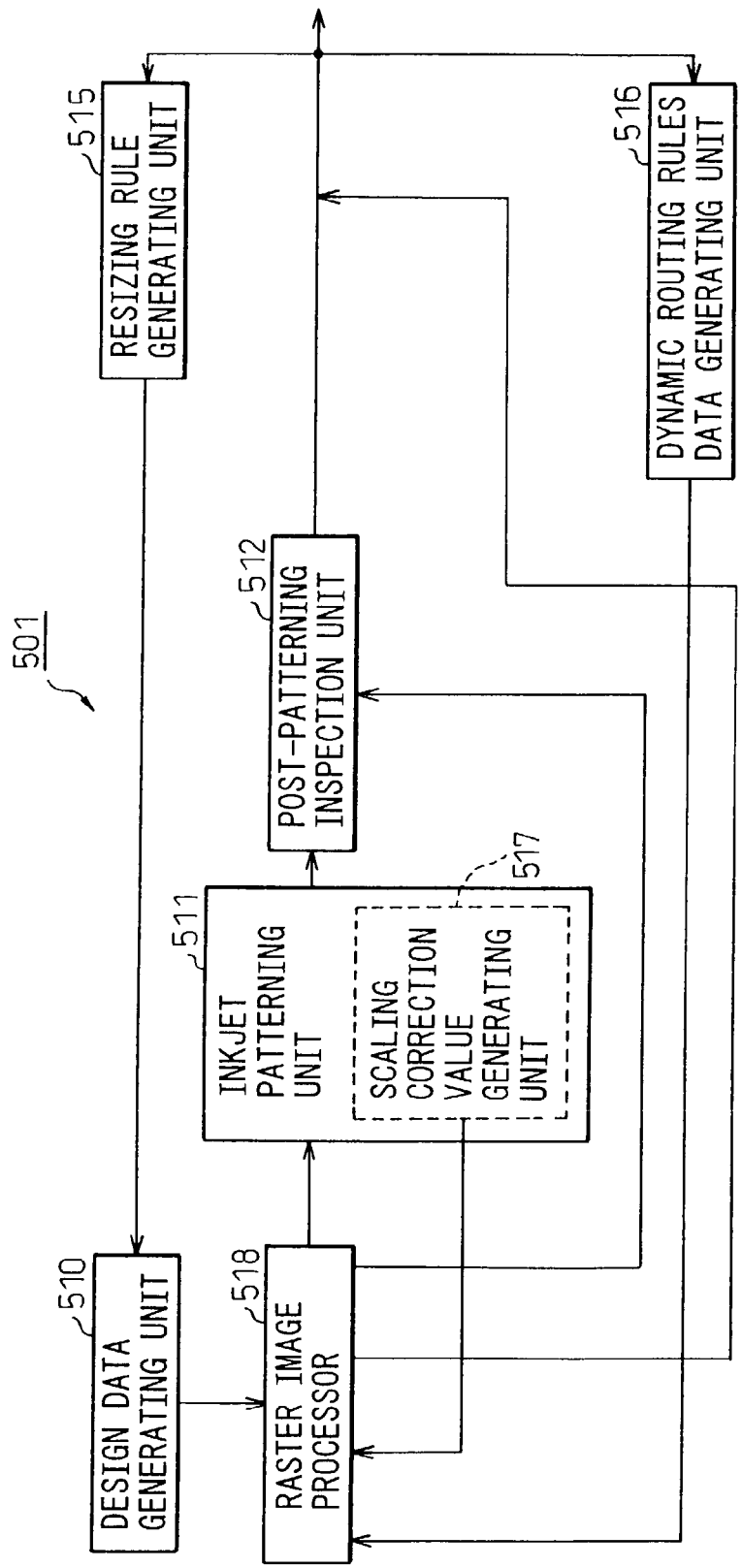
FIG. 5 is a schematic block diagram showing a wiring forming system according to the second aspect of the present invention.
Figure 6:
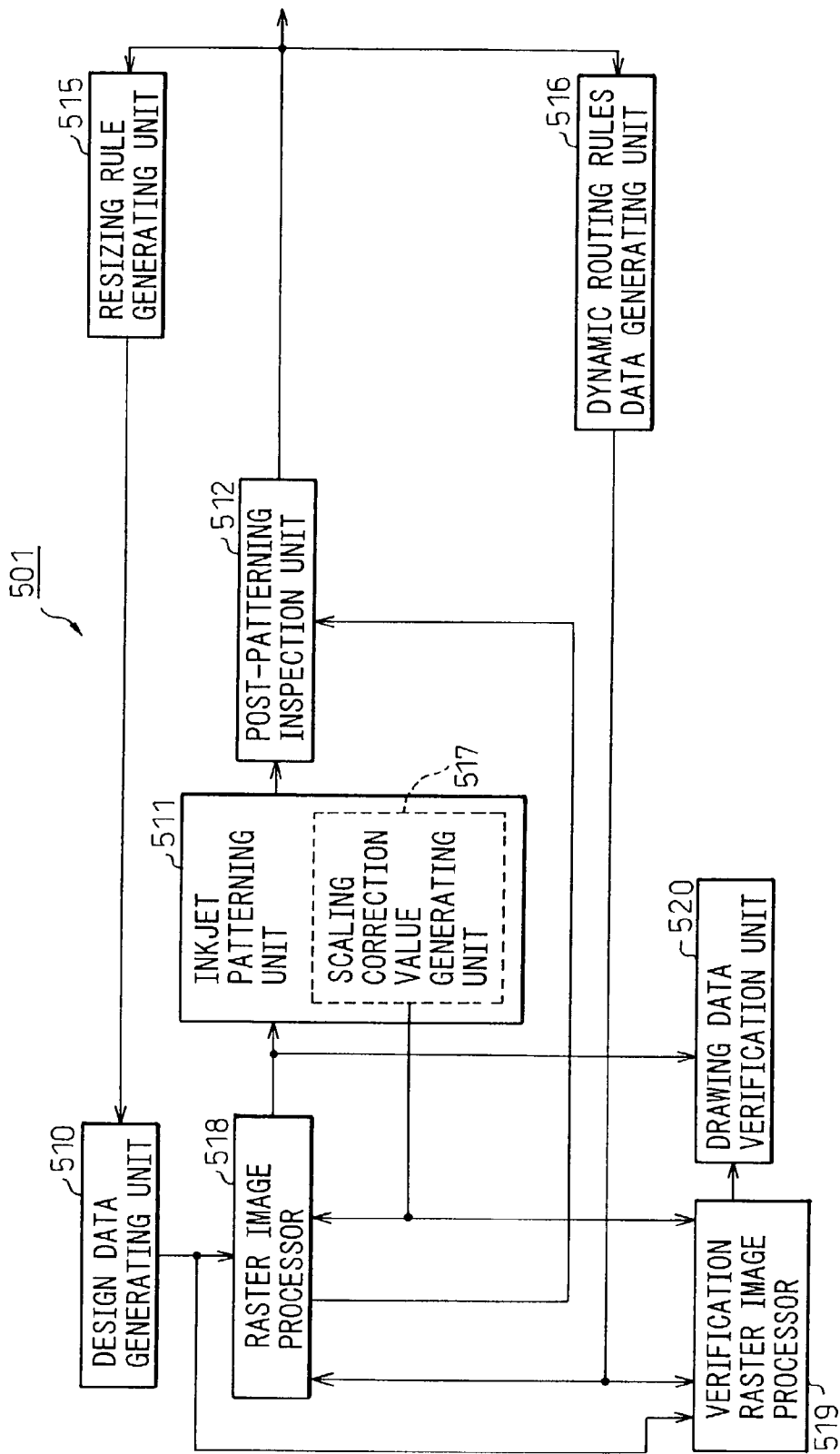
FIG. 6 is a schematic block diagram showing a modification of the wiring forming system according to the second aspect of the invention shown in FIG. 5.
Figure 7:
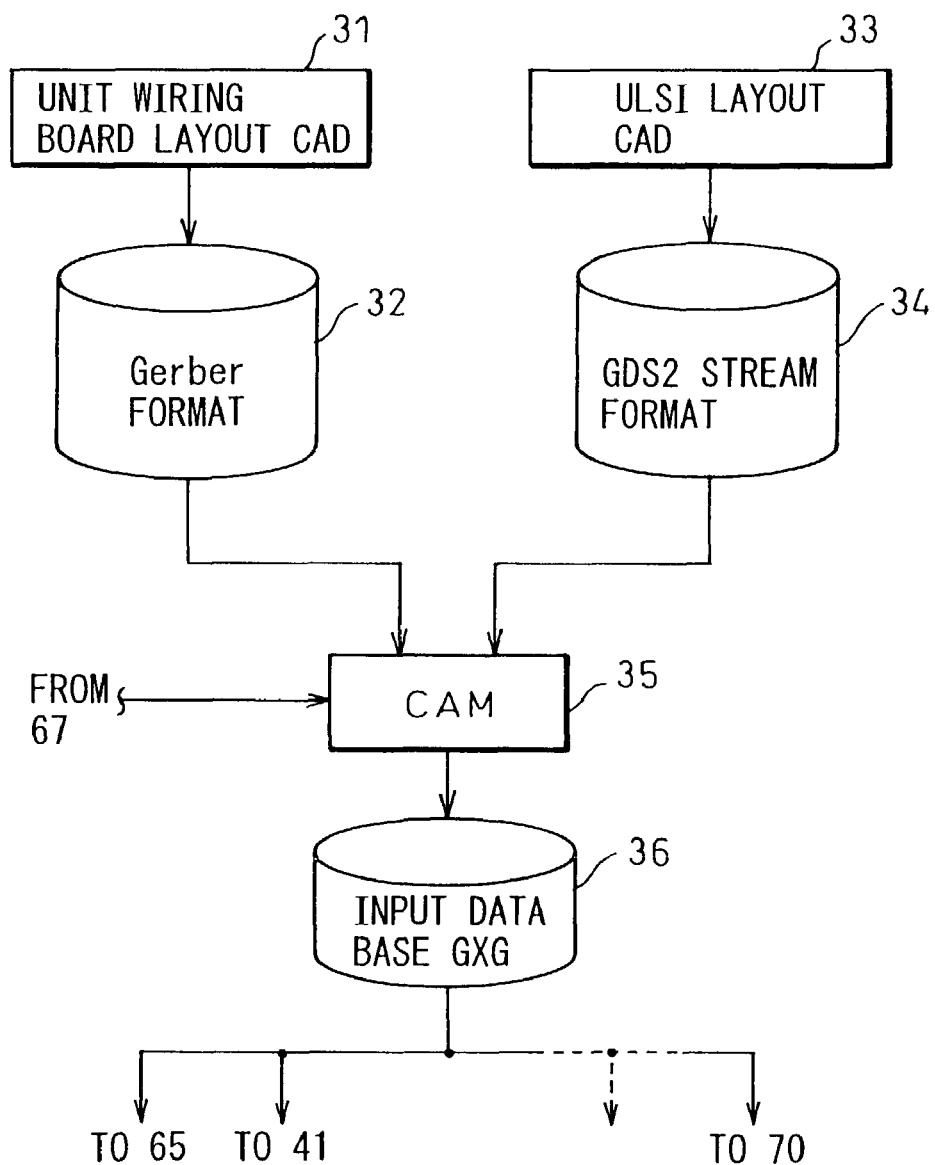
FIG. 7 is a system block diagram (part 1) showing a wiring forming system according to a first embodiment of the present invention.

First, in FIG. 7, a unit wiring board layout CAD block 31 performs electrical characteristic simulation and routing for a semiconductor package or a unit wiring board on a wiring board. The resultant design data is output in a standard Gerber format 32. This design data constitutes main input data for the wiring forming system.

The electronic component (IC) package is used to mount an IC chip on the unit wiring board. Layout information for the pads to be formed where the IC chip is to be mounted is generated by a ULSI layout CAD block 33 in FIG. 7. The resultant design data is output in a GDS2 stream format 34 which is generally used in IC layout design.

A CAM block 35 takes as inputs the Gerber format 32 and the GDS2 stream format 34, and receives a resizing rule from a resizing rule data base 67 to be described later and performs variable resizing (hereinafter referred to as the "resizing") in order to apply an etching correction to correct for the dimensional change of the wiring due to etching. In this way, "resized design data" is obtained by correcting the above design data in accordance with the etching rule. The details of the resizing (i.e., the etching correction) will be described later.

Further, the CAM block 35 edits data relating to job deck information by performing a job generally known as "imposition" which defines "how the data relating to each unit wiring board should be arranged on the large-sized wiring board." As previously described, in the prior art wiring forming system, the imposition job (corresponding to the scaling correction) is performed by assuming the displacement of the unit wiring board itself, slight displacement of the wiring within the unit wiring board, etc. which occur when the exposure of the single large-sized wiring board is completed; in contrast, the imposition job performed in the present invention is simple since it is only necessary to determine the rows and columns in which the individual unit wiring boards are arranged on the wiring board.

The CAM block 35 also edits data relating to additional information such as alignment information.

In this way, in the first embodiment of the present invention, non-resized design data, resized design data, job deck information data, and additional information data are consolidated as input data to the wiring forming system 1. Here, as earlier described, the design data includes predetermined wiring information for the plurality of unit wiring boards to be formed on the large-sized wiring board and predetermined pad layout information for the electronic component (IC) to be mounted on each unit wiring board. These data are stored in consolidated form in an input data base (GXG) 36. When a passive component such as a capacitor is to be mounted on the unit wiring board together with the electronic component such as the IC chip described above, schematic data for such a component is also stored in the input data base 36.

A maskless exposure unit 50 (shown in FIG. 9) used in the present invention comprises one or more exposure heads (that is, exposure engines) which are arranged so as to expose designated areas on the surface of an unexposed board, that is, a board yet to be exposed, and which perform exposure in a parallel fashion. With the respective exposure heads arranged to expose the designated areas in parallel fashion, the exposure can be accomplished at faster speed than the conventional exposure means. A DMD (Digital Micromirror Device) or an electron beam exposure device or the like can be used as the maskless exposure unit.

For the maskless exposure unit having such a plurality of exposure heads, the input data base 36 stores each of the above-listed data by spatially dividing it so that the data can be allocated to each designated exposure head.

Figure 8:
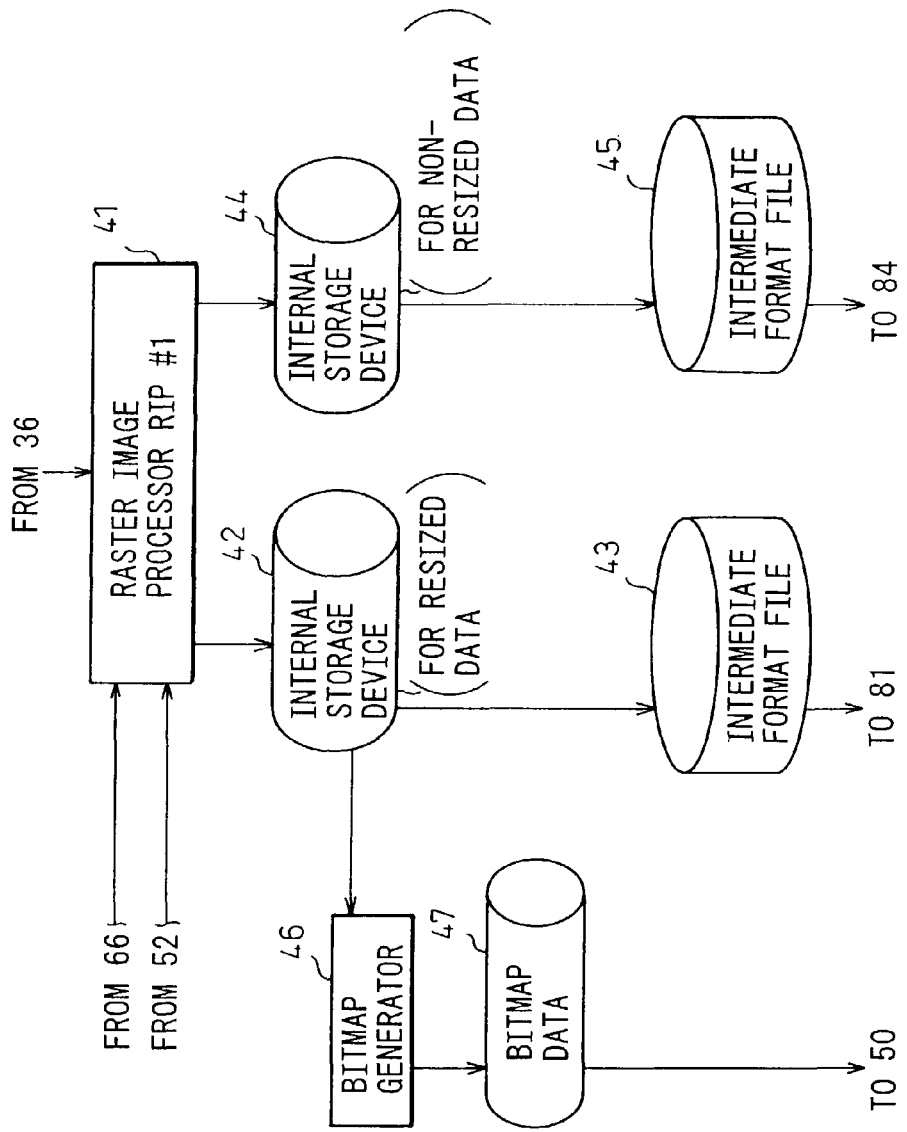
FIG. 8 is a system block diagram (part 2) showing the wiring forming system according to the first embodiment of the present invention.

Raster image processors 41 are data processing systems which are allocated to the respective exposure heads of the maskless exposure unit, and which perform the exposure operation in parallel fashion. In this specification, only one raster image processor (RIP #1) is shown in FIG. 8 for simplicity of illustration, but actually, there are at least as many raster image processors as there are the exposure heads.

Each raster image processor 41 includes a reading unit which, in synchronism with the operation of the maskless exposure unit, reads out the design data and resized design data allocated to the exposure head, the scaling correction value to be described later, and the dynamic routing rules data to be described later.

Using the auto scaling data 52 (that is, the scaling correction value) and the dynamic routing rules data 66 to be described later, the raster image processor 41 distorts graphic data of the resized design data, dislocates the position of the graphic data, and thus generates the exposure data for the designated exposure area on the unexposed board surface. The exposure data is generated by pairing the resized graphic data with the data (hereinafter called the "bias data") used to compensate for the dislocation and distortion. This data has a vector data format extracting the contour of the graphic, that is, it contains geometrical information. By using the vector data format, the amount of data can be reduced, and hence the processing speed of the processor can be increased. The maskless exposure unit directly exposes the unexposed board based on the exposure data.

Here, the auto scaling data 52 is data for making delicate corrections to the position and shape of the graphic data to be used for exposure (that is, for drawing); the method of generating this data will be described later. On the other hand, the dynamic routing rules data is data that estimates how the wiring should be changed to achieve the desired interconnection pattern, based on the design data and the information concerning the dislocation between the position on an etched board, i.e., the post-etching board, at which each component is mounted and the position at which the component should normally be mounted; the method of generating this data will also be described later.

The exposure data generated by the raster image processor 41, that is, the resized data pair, is stored in an internal storage device 42, and also in an intermediate format file 43 for use in a subsequent process. The internal storage device 42 and the intermediate format file 43 are provided for each individual raster image processor, but in this specification, like the raster image processor 41, only one of each is shown for simplicity of illustration.

In the raster image processor 41, the graphic data distortion and dislocation are also applied to the non-resized data, that is, the raw design data, by using the above-described bias data. The non-resized data to which the dislocation and distortion have been applied is used as etching inspect data in the post-etching inspect; the details will be described later.

Similarly to the exposure data described above, the etching inspect data is generated by pairing the non-resized raw graphic data with the bias data used to compensate for the dislocation and distortion. This data has a vector data format extracting the contour of the graphic, that is, it contains geometrical information.

The etching inspect data generated by the raster image processor 41 is stored in an internal storage device 44, and also in an intermediate format file 45 for use in a subsequent process. The internal storage device 44 and the intermediate format file 45 are provided for each individual raster image processor, but in this specification, like the raster image processor, only one each is shown for simplicity of illustration.

A bitmap generator 46 in FIG. 8 reads out the exposure data stored in the internal storage device 42, and converts the data, which was in the vector data format, into bitmap data 47 as needed. This bitmap data 47 is the resized graphic data and the biased data described above.

Figure 9:
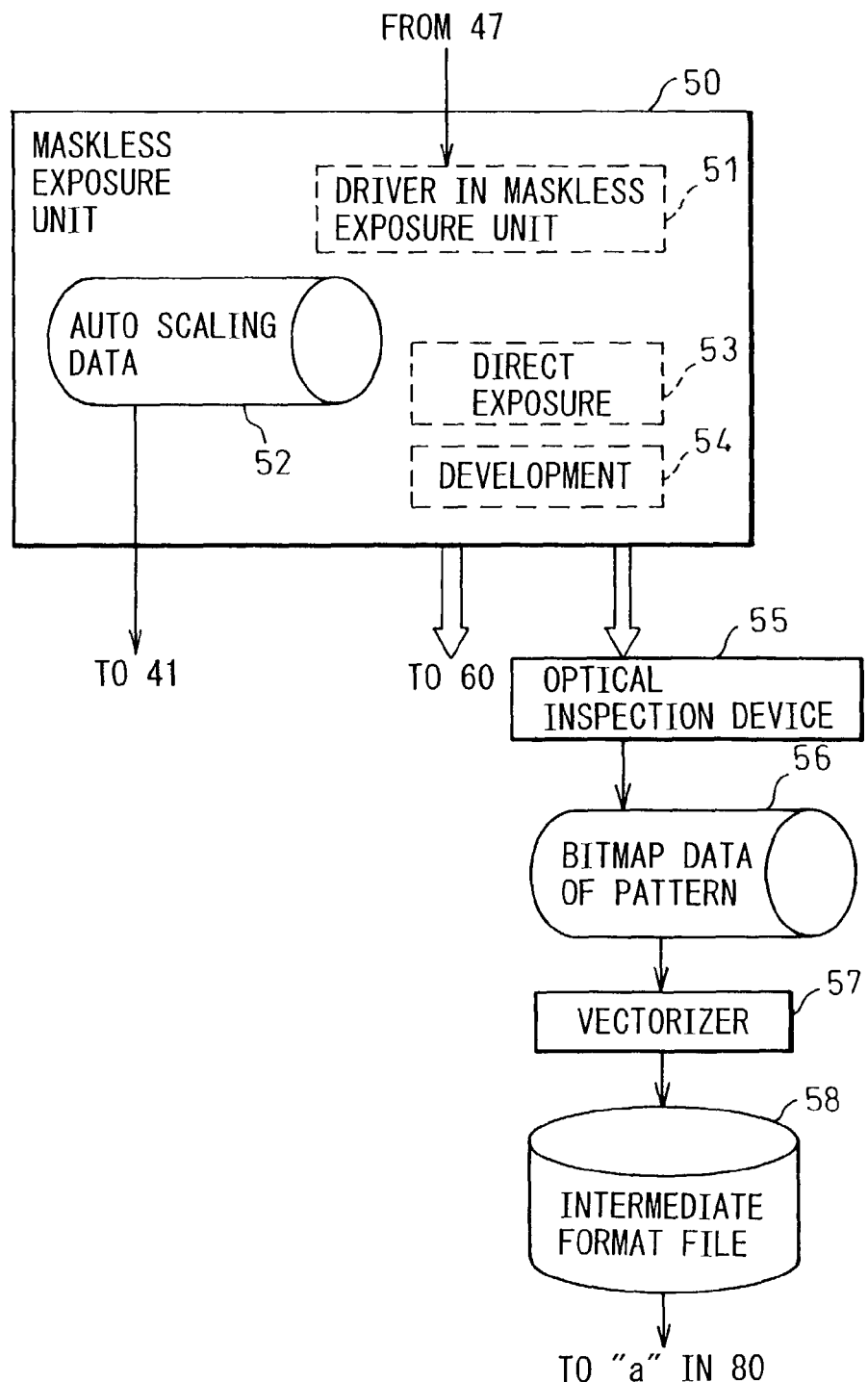
FIG. 9 is a system block diagram (part 3) showing the wiring forming system according to the first embodiment of the present invention.

The bitmap data 47 in FIG. 8 is sent to a driver 51, i.e., each exposure head driving system in the maskless exposure unit 50 in FIG. 9, and direct exposure 53 is performed. The maskless exposure unit 50 used in the first embodiment of the present invention has the function of measuring the condition, such as shrinkage/expansion and distortion, of the board during the exposure. This function calculates how much the data obtained by capturing the image of the board differs from the reference data, and detects the result as information relating to the shrinkage or expansion, distortion, etc. of the board. In the present embodiment, the auto scaling data 52 for making delicate corrections to the position and shape of the graphic data to be used for exposure (that is, for drawing) is generated from the thus obtained information relating to the condition such as the shrinkage or expansion and distortion. The auto scaling data 52 is sent to the raster image processor 41 in FIG. 8.

An optical inspect device 55 reads the pattern on the post-exposure board by means of a camera, and creates bitmap data 56 of the pattern.

A vectorizer 57 reads the bitmap data 56, extracts the contour of the graphic, and converts it into vector data format. The converted data is stored in an intermediate format file 58.

Figure 12:
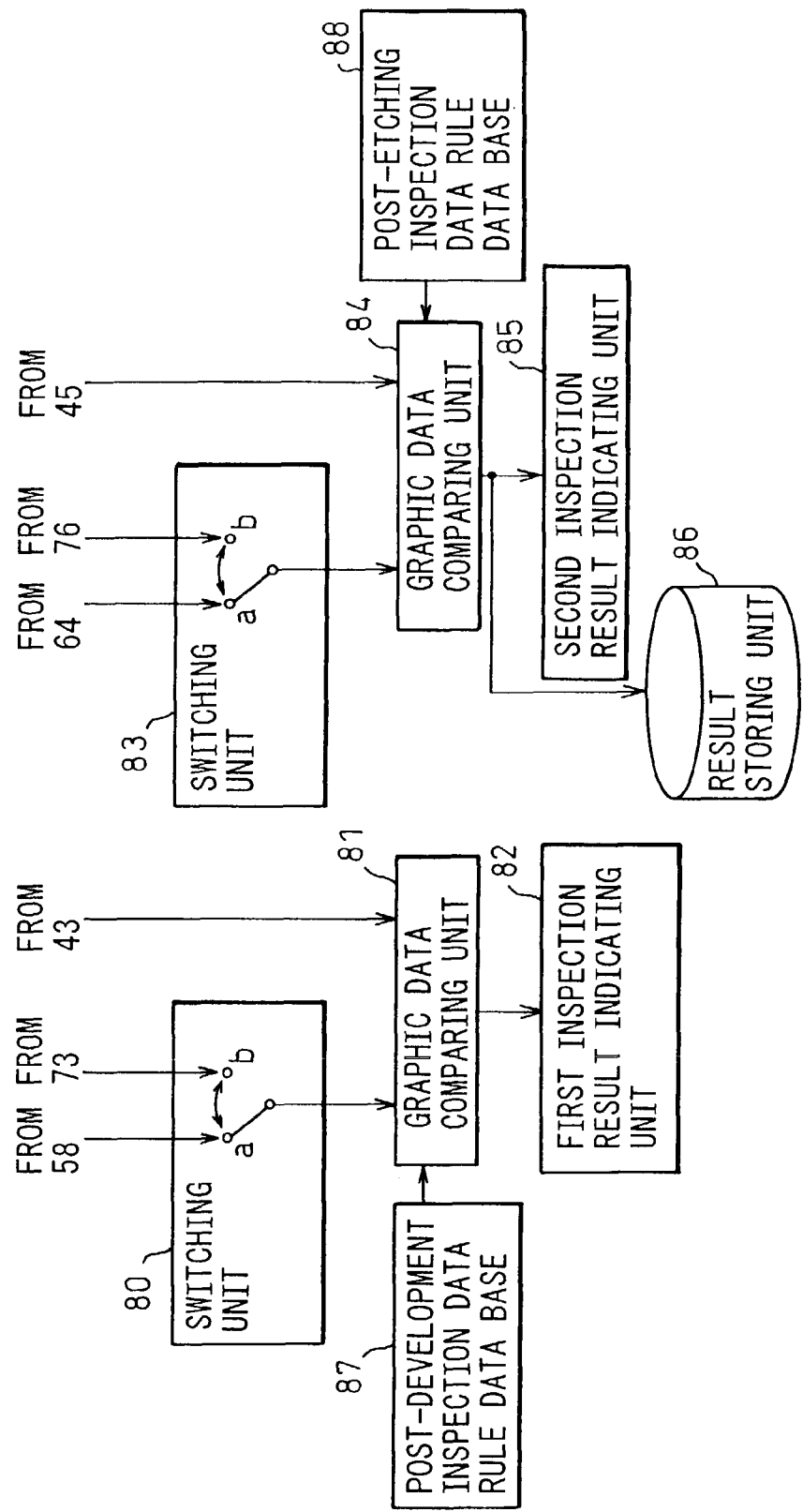
FIG. 12 is a system block diagram (part 6) showing the wiring forming system according to the first embodiment of the present invention.

A graphic data comparing unit 81 in FIG. 12 constitutes a post-development inspect unit which inspects the developed board by using the exposure data and the image data of the developed board.

The graphic data comparing unit 81 reads a post-development inspect rule for the post-development inspect from a post-development inspect rule data base 87. Then, based on the post-development inspect rule, the data of the intermediate format file 58 in FIG. 9, received via a in switching unit 80, that is, the image data of the developed board, is compared with the data of the intermediate format file 43 in FIG. 8, that is, the exposure data.

Here, as the exposure data created by processing the design data is the data actually used when performing the maskless exposure, as described above, ideally the image data of the exposed and developed board should coincide with the exposure data.

However, during the exposure process, the board may suffer distortion or shrinkage or expansion due to physical or chemical factors, or foreign matter may be mixed therein. In reality, therefore, a difference can occur between the exposure data and the image data of the developed board. As the maskless exposure unit 50 has the function of measuring the condition, such as shrinkage or expansion and distortion, of the board being exposed, as earlier noted, the maskless exposure unit 50 generates the auto scaling data 52 from the information relating to the condition such as the shrinkage or expansion and distortion, and feeds it back to the raster image processor 41 so that the result can be reflected in the scaling correction of the exposure data. Accordingly, the accuracy is greatly improved compared with the prior art, and at the same time, the time and cost required in the exposure data correction process is significantly reduced.

Further, as described above, the data of the intermediate format file 43 has a vector data format structure, and the intermediate format file 58 is already converted by the vectorizer 57 into data that has a vector data format structure. As the vector data format is data that contains geometrical information including the contour abstracted from the graphic, the amount of data is very small compared with the graphic data in bitmap format. Further, the intermediate format file 43 contains a data structure for high-speed searching for the positional relationship between the detected difference and the design pattern. Accordingly, the graphic data comparing unit 81 can perform comparisons at high speed, which also serves to ease the burden on computing devices.

If there is a geometrical difference in information contents between the image data of the developed board and the exposure data, a decision is made based on the readout post-development inspection rule as to whether the difference is allowable or not. If it is not allowable, an error is reported.

For example, if any foreign matter gets fallen (on the board) and adheres between patterns during the exposure process, it will be detected as a difference. However, if the difference is sufficiently small in size, or if it is relatively large, but there is a sufficient space between it and its neighboring patterns, the difference might be allowable in the fabrication process. Decision rules for such inspection are stored in the post-development inspect rule data base 87.

If an unallowable error is detected by the graphic data comparing unit 81, a first inspect result indicating unit 82 indicates the result of the detection. The first inspect result indicating unit 82 may report the result to the user by outputting text information or an image to a printer or a display monitor or the like, or may also store the result of the detection in a data base.

If it is determined in the above post-development inspect that the developed board contains an error, the photoresist on the board surface should be removed, and the exposure process should be repeated once again. As the board containing an error is not passed onto the subsequent process, the accuracy of the wiring forming system improves; furthermore, reusing the board serves to save the resources.

Figure 10:
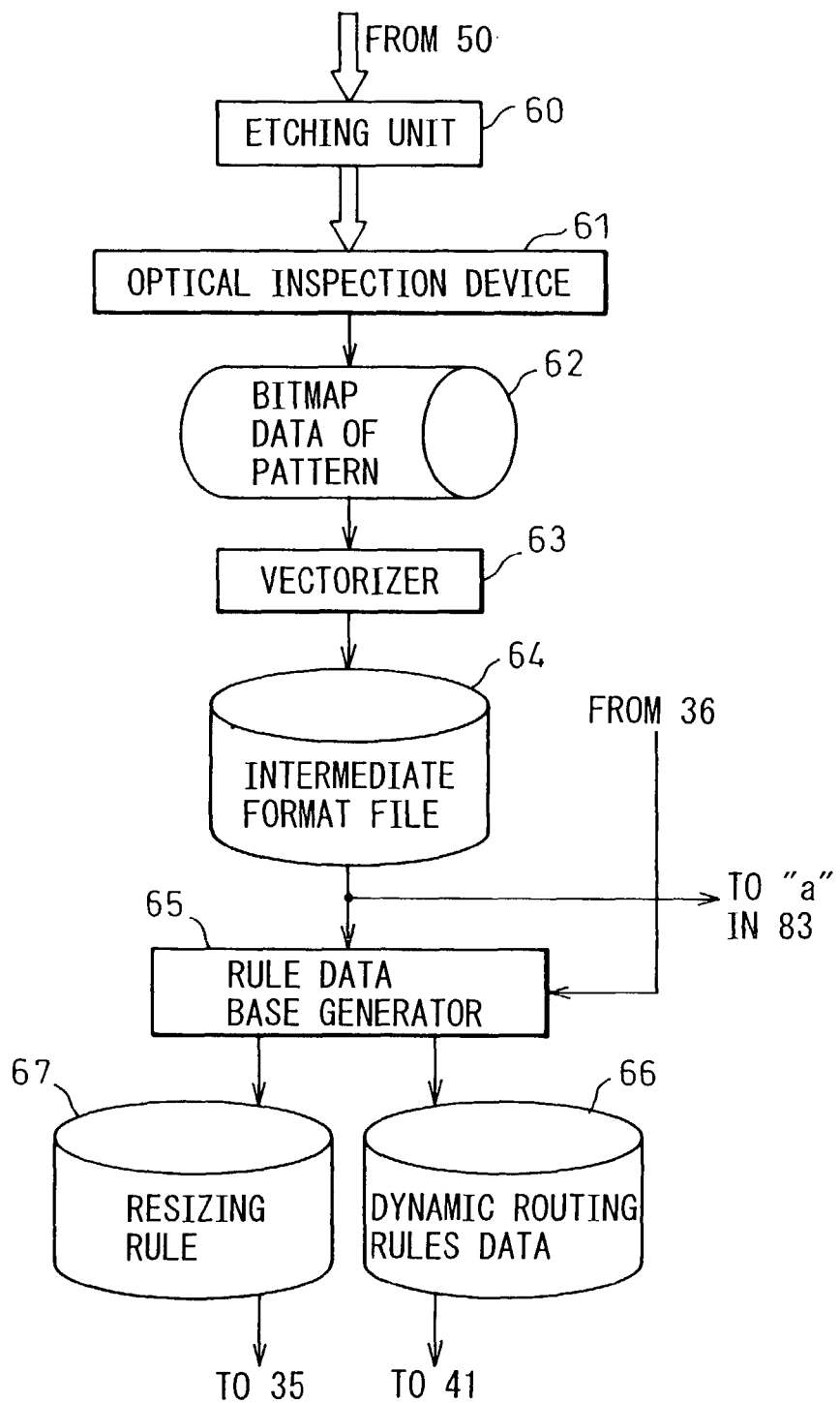
FIG. 10 is a system block diagram (part 4) showing the wiring forming system according to the first embodiment of the present invention.

The developed board that passed the post-development inspect is sent to an etching unit 60 in FIG. 10 where the board is etched using the same technique as used in the prior art.

The post-etching board etched by the etching unit 60 is tested by an optical inspect device 61.

The optical inspect device 61 reads the wiring pattern on the post-etching board by means of a camera, and creates bitmap data 62 of the pattern.

A vectorizer 63 reads the bitmap data 62, extracts the contour of the graphic, and converts it into vector data format. The converted data is stored in an intermediate format file 64 as the vector format image data of the post-etching board.

The image data of the post-etching board stored in the intermediate format file 64 is subjected to the post-etching inspect.

A graphic data comparing unit 84 in FIG. 12 constitutes a post-etching inspect unit which tests the post-etching board by using the etching inspect data and the image data of the post-etching board.

The graphic data comparing unit 84 reads a post-etching inspect rule for the post-etching inspect from a post-etching inspect rule data base 88. Then, based on the post-etching inspect rule, the data of the intermediate format file 64 in FIG. 10, received via "a" in a switching unit 83, that is, the image data of the post-etching board, is compared with the data of the intermediate format file 45 in FIG. 8, that is, the etching inspect data.

The etching inspect data here is created by processing the design data as earlier described. More specifically, in the raster image processor 41 in FIG. 8, distortion and dislocation are applied to the non-resized data, that is, the raw design data, by using the bias data, and the resulting data is paired with the bias data used to compensate for the dislocation and distortion and is stored as the etching inspect data in the intermediate format file 45. This data has a vector data format including the contour abstracted from the graphic.

The reason that the intermediate format file 45 is used for comparison in the post-etching inspect is as follows.

As previously described, the CAM block 35 takes as inputs the Gerber format 32 and the GDS2 stream format 34, and performs the resizing (etching correction) to correct for the dimensional change of the wiring due to etching. If this resizing is correctly done, the image data of the post-etching board should closely resemble the etching inspect data which is non-resized data. However, the resizing has no relevance to the shrinkage/expansion and distortion of the board, and when performing the post-etching inspect, the shrinkage/expansion and distortion of the board must be taken into account.

Figure 13:
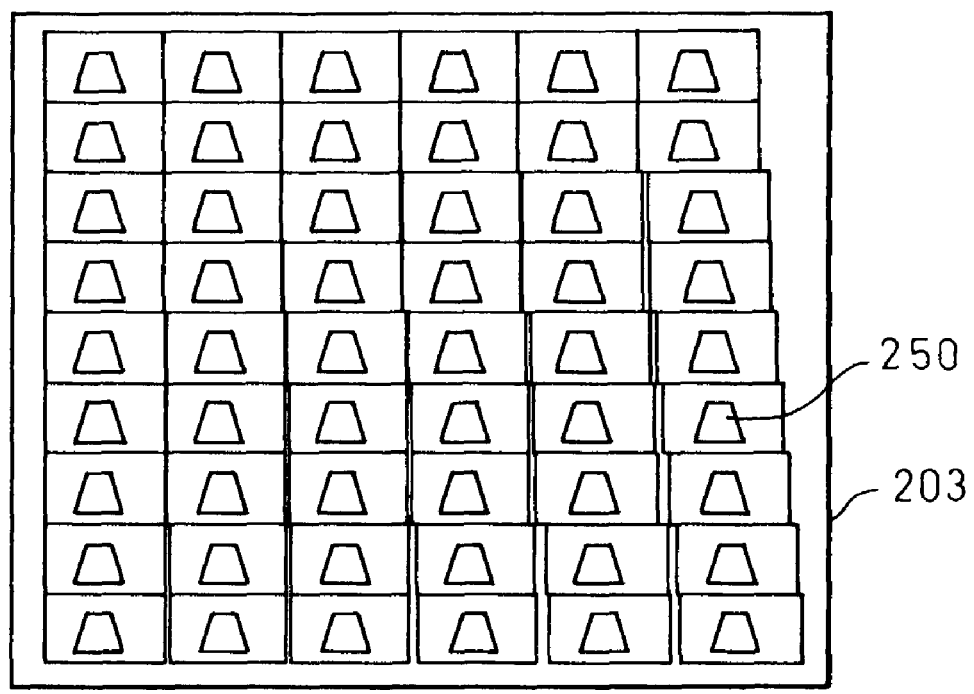
FIG. 13 is a diagram schematically showing a post-etching board produced by the wiring forming system of the present invention.

FIG. 13 is a diagram schematically showing the post-etching board produced by the wiring forming system of the present invention.

In the present invention, as the exposure data generated by correcting the design data using the resizing rule, auto scaling, dynamic routing rule, etc. is used in the exposure, development, and etching processes, the wiring pattern is formed without being displaced from the region allocated to each unit wiring board, even if the post-etching board 203 is distorted. However, if the image data of such a post-etching board 203, generated by photographing the entire surface of the board using the optical inspect device 61, is directly compared with the original layout design data to inspect the post-etching board 203 for the correctness of the etching without considering the distortion of the board, then even when the etching itself is correctly done, the board will be determined as containing an error because of the distortion or shrinkage/expansion of the board. In this specification, such an error is called a false error.

As previously described, the maskless exposure unit 50 has the function of measuring the condition, such as shrinkage/expansion and distortion, of the board during exposure; therefore, if the bias data used to compensate for the distortion and deformation measured here is used as-is in the post-etching inspect, the chance of incurring false errors can be reduced to a minimum.

For the above reason, in the present invention, the intermediate format file 45, i.e., the etching inspect data consisting of the non-resized graphic data and the bias data used to compensate for the distortion and deformation, is used in the post-etching inspect.

As described above, the data of the intermediate format file 45 has a vector data format structure, and the intermediate format file 64 also is already converted by the vectorizer 63 into data that has a vector data format structure. Further, the intermediate format file 45 contains a data structure for high-speed searching for the positional relationship between the detected difference and the design pattern. Accordingly, the graphic data comparing unit 84 can perform comparisons at high speed, which also serves to ease the burden of computing devices.

If there is a difference between the image data of the post-etching board and the etching inspect data, a decision is made based on the readout post-etching inspect rule as to whether the difference is allowable or not. If it is not allowable, an error is reported.

For example, if any foreign matter gets fallen (on the board) and adheres between patterns during the etching process, it will be detected as a difference. However, if the difference is sufficiently small in size, or if it is relatively large, but there is a sufficient space between it and its neighboring wiring patterns, the difference might be allowable in the fabrication process. Decision rules for such testing are stored in the post-etching inspect rule data base 88.

If an unallowable error is detected by the graphic data comparing unit 84, a second inspect result indicating unit 85 indicates the result of the detection. The second inspect result indicating unit 85 may report the result to the user by outputting text information or an image to a printer or a display monitor or the like. If it is determined in the above post-etching inspect that the post-etching board contains an error, the board is rendered defective and sorted out from non-defectives, and the result is stored in a result storing unit 86.

As previously described, the pattern of the post-etching board is stored in the vector data format in the intermediate format file 64. The data stored in the intermediate format file 64 is not only subjected to the post-etching inspect described above, but it is also input to a rule data base generator 65 in FIG. 10.

Based on the design data and the position on the post-etching board at which each component is to be mounted on the designated unit wiring board, the rule data base generator 65 generates dynamic routing rules data 66 that indicates how the wiring should be changed to achieve the desired interconnection pattern. More specifically, the dynamic routing rules data 66 is generated using the image data of the post-etching board, stored in the intermediate format file 64, and the non-resized data stored in the input data base 36. The rule data base 65 is also used to generate dynamic routing rules data 66 that indicates how the wiring on an upper layer should be changed so as to align with the wiring on a lower layer for connection when forming the wiring on the multilayer wiring board. The generated dynamic routing rules data 66 is sent to the raster image processor 41 in FIG. 8.

As earlier noted, it is desirable that the image data of the post-etching board be very close to the non-resized data and ideally, coincide with it.

If the various data input to the wiring forming system and the various parameters acting on them can be modeled, and the resulting post-etching board can be predicted (simulated), then it would become possible to estimate ideal design data.

However, in general, as the exposure and etching processes in the wiring forming process are greatly affected by chemical parameters, modeling of the system is extremely difficult, and hence, it is difficult to estimate the optimum design data through simulation.

In view of this, in the present embodiment, in order to optimize the resizing (etching correction), there is further provided the rule data base generator 65 as a resizing rule generating unit that generates a resizing rule for obtaining optimum design data by solving an inverse problem of how the input data should be modified in order to achieve the desired result, while fixing all the parameters related to the exposure and etching.

The rule data base generator 65 first performs a plurality of comparisons between the image data of the post-etching board, stored in the intermediate format file 64, and the non-resized data stored in the input data base 36. Based on the results of the comparisons, the inverse problem of how the current design data should be corrected in order to obtain design data optimum for obtaining the desired post-etching board is solved by using a known mathematical technique; then, based on the solution thus obtained, the correction to be applied to the design data is converted into a rule, which is stored as the resizing rule 67.

In the wiring forming system of the present invention, the resizing rule 67 is used off-line, and is sent to the CAM block 35 in FIG. 7. That is, the CAM block 35 applies the resizing (etching correction) to the design data by using the resizing rule 67.

The above has described the system from the design data creation to the post-etching inspect in the wiring forming system according to the first embodiment of the present invention.

Next, a description will be given a system for verifying the accuracy of the wiring forming system according to the first embodiment of the present invention.

When changing the design data, or when forming wiring for an entirely new board, in particular, it is preferable from the standpoint of maintaining system reliability to verify the accuracy of the newly constructed wiring forming system.

Figure 11:
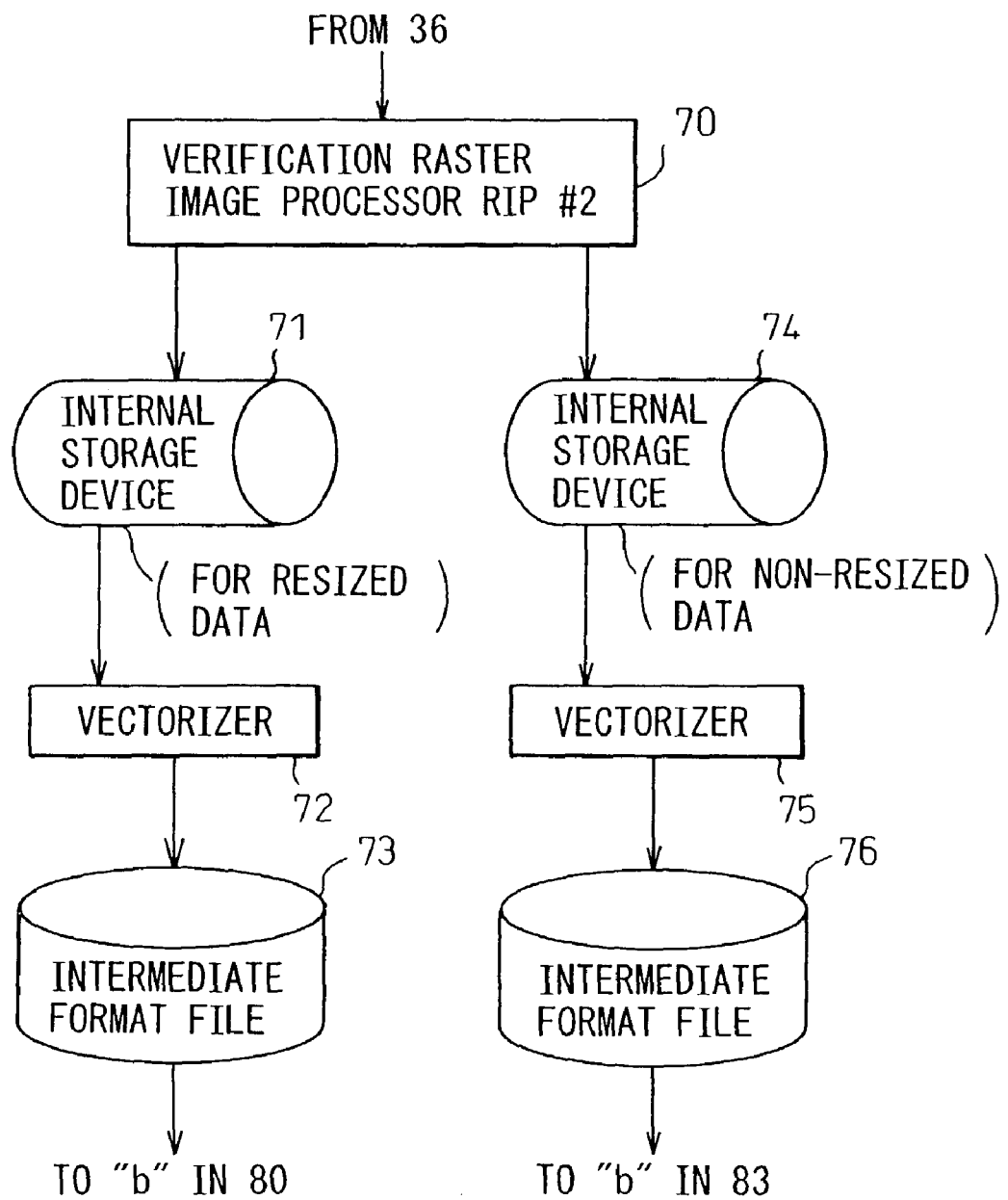
FIG. 11 is a system block diagram (part 5) showing the wiring forming system according to the first embodiment of the present invention.

A verification raster image processor 70 in FIG. 11 has an entirely different algorithm from that of the raster image processor 41 in FIG. 8. More specifically, a system corresponding to the bitmap data generator 46 is assumed. The verification raster image processor 70 is functionally the same as the raster image processor 41 for the generation of bitmap data, but the algorithm for its operation and the method of its implementation are entirely different. In the present embodiment, the same functions of the computing devices are realized using different algorithms and different implementation methods, and the accuracy of the post-development inspect and the post-etching inspect in the wiring forming system of the invention is verified by checking whether the data created using the computing devices having entirely different algorithms match each other. The verification raster image processor 70 generates exposure data and etching inspect data by using the same inputs as those to the raster image processor 41. These data are called the verification exposure data and the verification etching inspection data, respectively.

Each data is spatially divided and stored in the input data base 36 in FIG. 7 and is also supplied to the verification raster image processor (RIP #2) 70 in FIG. 11.

The verification raster image processor 70 reads the resized design data stored in the input data base 36 in FIG. 7, and converts it into bitmap data, which is stored in an internal storage device 71. The bitmap data is further converted by a vectorizer 72 into data having a vector data format structure. This data is stored as the verification exposure data in an intermediate format file 73.

Further, the verification raster image processor 70 reads the non-resized design data stored in the input data base 36 in FIG. 7, and converts it into bitmap data, which is stored in an internal storage device 74. The bitmap data is further converted by a vectorizer 75 into data having a vector data format structure. The converted data is stored as the verification etching inspect data in an intermediate format file 76.

On the other hand, as already explained, the intermediate format file 43 and the intermediate format file 45 are created using the raster image processor 41 in FIG. 8. As previously described, the data in the intermediate format file 43 corresponds to the exposure data, and the data in the intermediate format file 45 corresponds to the etching verification data; both data have a vector data format structure.

When verifying the exposure process of the wiring forming system of the present invention, an exposure data verification unit such as described below is activated. First, the switch in the switching unit 80 of FIG. 12 is switched from "a" to "b". The data to be input to the graphic data comparing unit 81 together with the exposure data is thus switched from the image data of the developed board to the verification exposure data.

The graphic data comparing unit 81 compares the exposure data, that is, the data of the intermediate format file 43 in FIG. 8, with the verification exposure data, that is, the data of the intermediate format file 73 in FIG. 11, input via "b" in the switching unit 80.

If it is determined that the exposure data and the verification exposure data match each other, this means that the exposure process of the wiring forming system is reliable; on the other hand, if it is determined that they do not match, this means that there may be some problem in the exposure process including data processing.

When verifying the etching process of the wiring forming system according to the first embodiment of the present invention, an etching inspect data verification unit such as described below is activated. First, the switch in the switching unit 83 of FIG. 12 is switched from "a" to "b". The data to be input to the graphic data comparing unit 84 together with the etching inspect data is thus switched from the image data of the post-etching board to the verification etching inspect data.

The graphic data comparing unit 84 compares the etching inspect data, that is, the data of the intermediate format file 45 in FIG. 8, with the verification etching inspect data, that is, the data of the intermediate format file 76 in FIG. 11, input via "b" in the switching unit 83.

If it is determined that the etching inspect data and the verification etching inspect data match each other, this means that the etching process of the wiring forming system is reliable; on the other hand, if it is determined that they do not match, this means that there may be some problem in the etching process.

By verifying the accuracy of the wiring forming system of the present embodiment as described above, the reliability of the system can be enhanced. In particular, when the design data is changed, or when forming wiring for an entirely new board, for example, if the above verification process is executed before putting the wiring forming system into full operation, the wiring can be formed with higher precision. After the verification is done, the switches in the respective switching unit are switched back to the positions for the post-development inspect and the post-etching inspect, respectively.

In the present embodiment, the verification unit has been implemented using a single verification raster image processor having a different algorithm from that of the raster image processor, but it will be recognized that two or more verification raster image processors may be provided; in that case, as the number of verification processors increases, the reliability of the verification process increases correspondingly.

Further, only one of the verification unit, the exposure data verification unit or the etching inspect data verification unit, may be provided.

In the present embodiment, the switching unit 80 and 83 are provided so that the graphic data comparing unit 81 and 84 used for the post-development inspect and the post-etching inspect can also be used for the exposure data verification and the etching inspect data verification, respectively, but instead, dedicated graphic data comparing unit may be provided for the exposure data verification and the etching inspect data verification, respectively.

Figure 14:
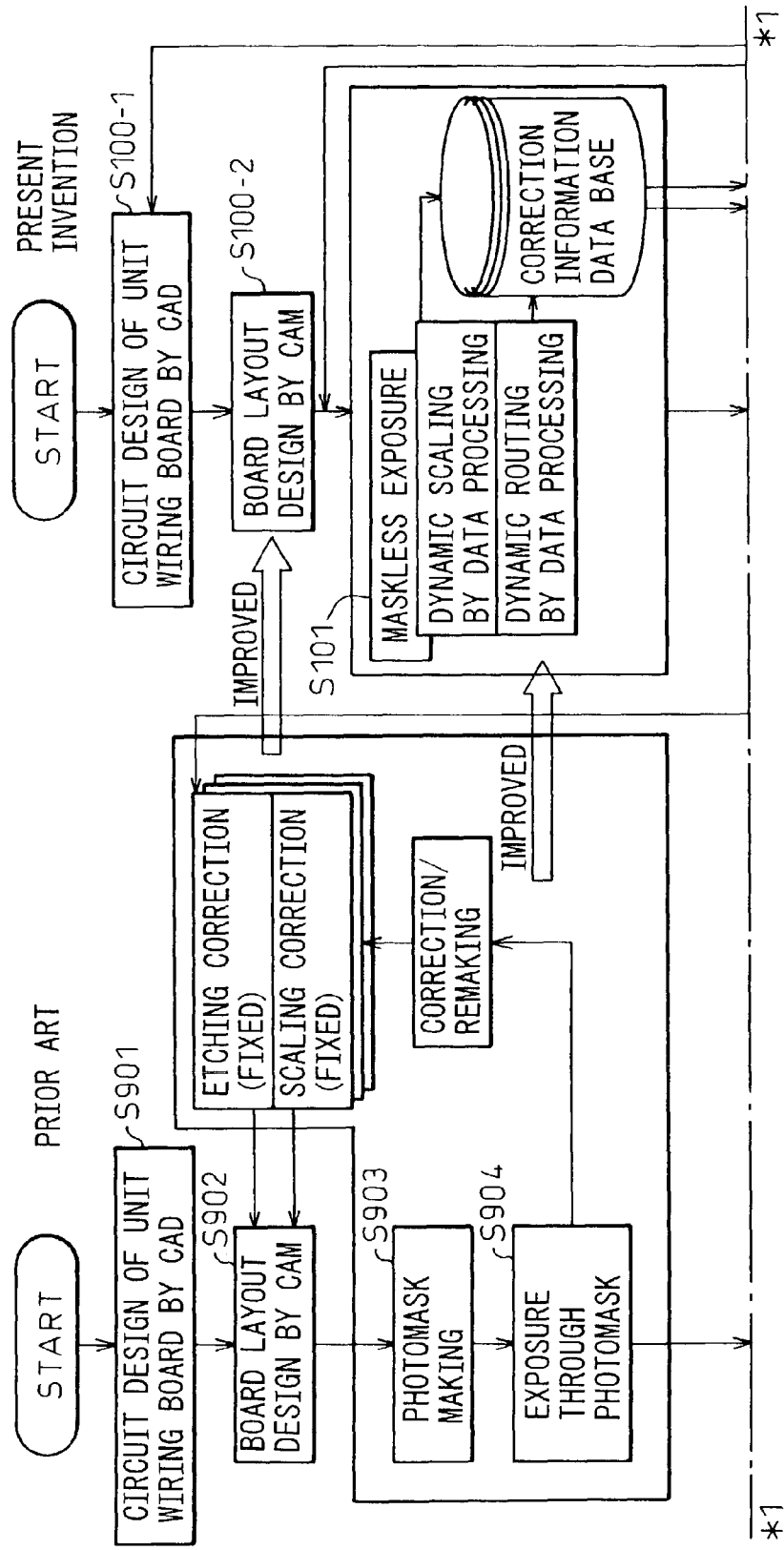
FIGS. 14 and 15 are diagrams for explaining the wiring forming system according to the first embodiment of the present invention in comparison with a prior art example.
Figure 15:
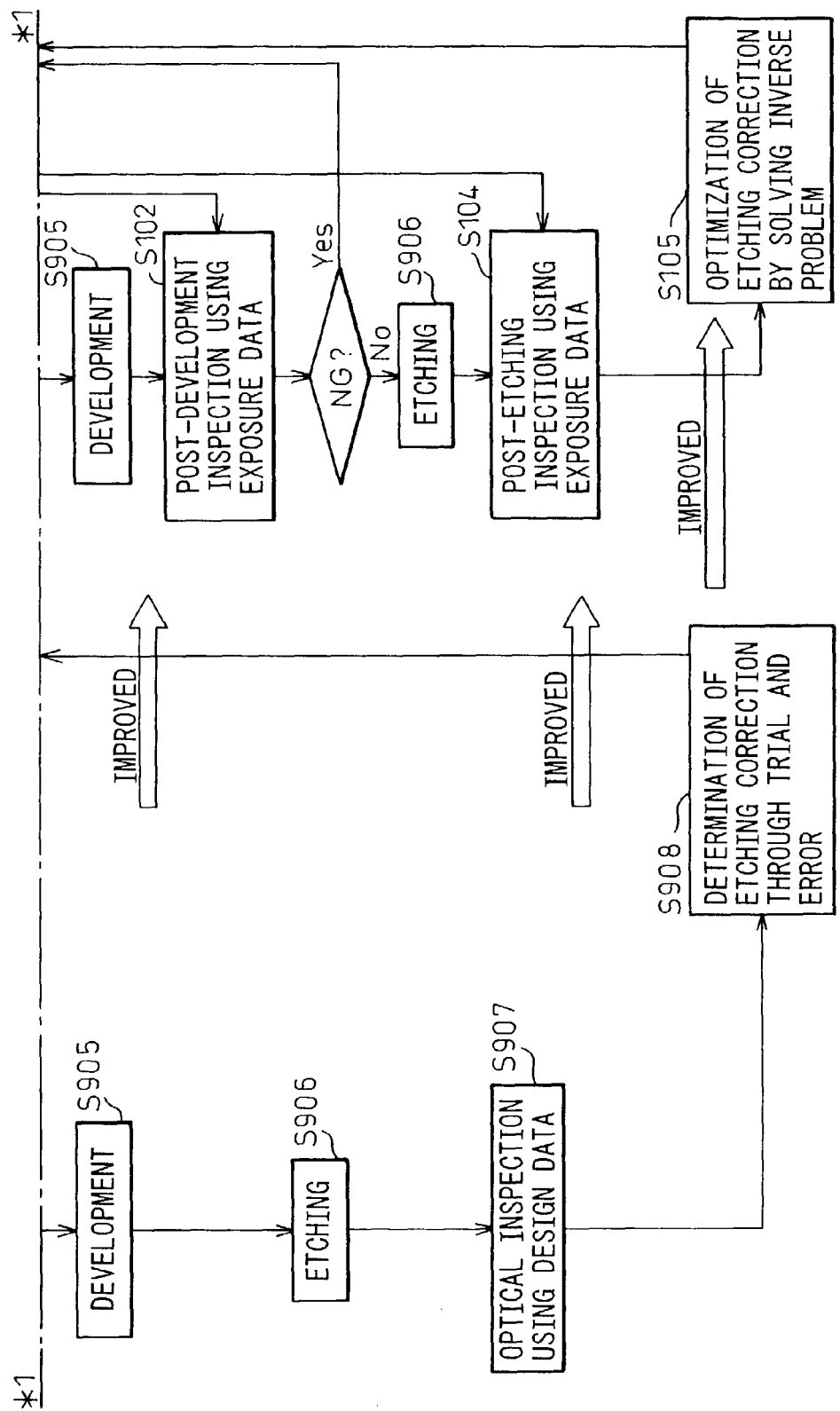

FIGS. 14 and 15 are diagrams for explaining the wiring forming system according to the first embodiment of the present invention in comparison with the prior art example.

In the prior art wiring forming system, the scaling correction and the etching correction have been fixed for the trial board being produced, and the optimum scaling correction value and etching correction value have been determined through trial and error by repeating the steps of mask making (S903), exposure (S904), and correction/remaking several times.

In comparison, in the wiring forming system according to the first embodiment of the present invention, the scaling correction is performed dynamically by processing the design data as needed and accumulating the correction information.

Further, the board layout work (S902) in the prior art example is replaced by the creation of a simple job deck file in the present embodiment; this serves to save labor and reduce the cost and time required for the layout design work.

Furthermore, in the wiring forming system according to the first embodiment of the present invention, as use is made of the maskless exposure (S101) that does not use a photomask, the need for the trial production for determining the process, periodical cleaning before use, and remaking due to the limited lifetime of the photomask, as required in the prior art, can be eliminated completely.

Moreover, in the wiring forming system according to the first embodiment of the present invention, as the routing can be performed dynamically, alignment with the underlying layer pattern can be easily accomplished, especially when forming wiring for a multilayer board. Further, wiring mounting density increases because the margin for the alignment can be reduced. Besides, using the dynamic routing offers the potential of being able to achieve an entirely new mounting method never before known.

Further, in the first embodiment of the present invention, as the board inspect (S102) can be performed after the development (S905), the reliability of the wiring forming system can be easily enhanced. In this post-development inspect (S102), as the developed board is tested using the data actually used in the exposure process, the chance of incurring false errors can be reduced.

Likewise, in the first embodiment of the present invention, as the post-etching inspect is performed using the data generated by considering various factors that can occur during the exposure and etching, the chance of incurring false errors during the post-etching inspect can be reduced.

Furthermore, as the etching correction (resizing) is converted into a rule by using a mathematical technique known as "the solution of an inverse problem", the need to correct errors through trial and error relying on the experience of a skilled worker can be eliminated, and the work efficiency and accuracy can thus be enhanced.

Next, a description will be given of a first modified example of the first embodiment of the present invention.

As described above, the maskless exposure unit used in the first embodiment of the present invention has the function of measuring a condition, such as shrinkage or expansion and distortion, of the board during the exposure. This function calculates how much the data obtained by capturing the image of the board differs from the reference data, and detects the result as information relating to the shrinkage or expansion, distortion, etc. of the board. As previously explained, in the first embodiment of the present invention, the auto scaling data for making delicate corrections to the position and shape of the graphic data to be used for exposure (that is, for drawing) is generated from the information relating to the condition, such as shrinkage or expansion and distortion, of the board being exposed.

The unexposed board is exposed by being placed at a prescribed position on the exposure stage inside the maskless exposure unit. However, there are cases where, when the unexposed board is actually placed on the exposure stage, the position as viewed from the exposure head is displaced from the reference position on the exposure stage at which the unexposed board should normally be placed when viewed from the exposure head. In such cases, in the first embodiment of the present invention described above, auto scaling data is generated that corresponds to the displacement between the reference position on the exposure stage at which the unexposed board should normally be placed and the position on the exposure stage at which the unexposed board is actually placed, and this auto scaling data is used for the correction of the exposure data in the raster image processor.

In contrast, in the first modified example of the first embodiment of the invention, correction is applied by directly rotating and/or moving the exposure stage in the maskless exposure unit in such a manner as to bring the actual position of the unexposed board, relative to the exposure head, as close as possible to the reference position at which the board should normally be placed. Here, the reference position on the exposure stage at which the unexposed board should normally be placed is determined by such factors as the design data, the exposure data, and the mechanical characteristics of the maskless exposure unit.

Figure 16:
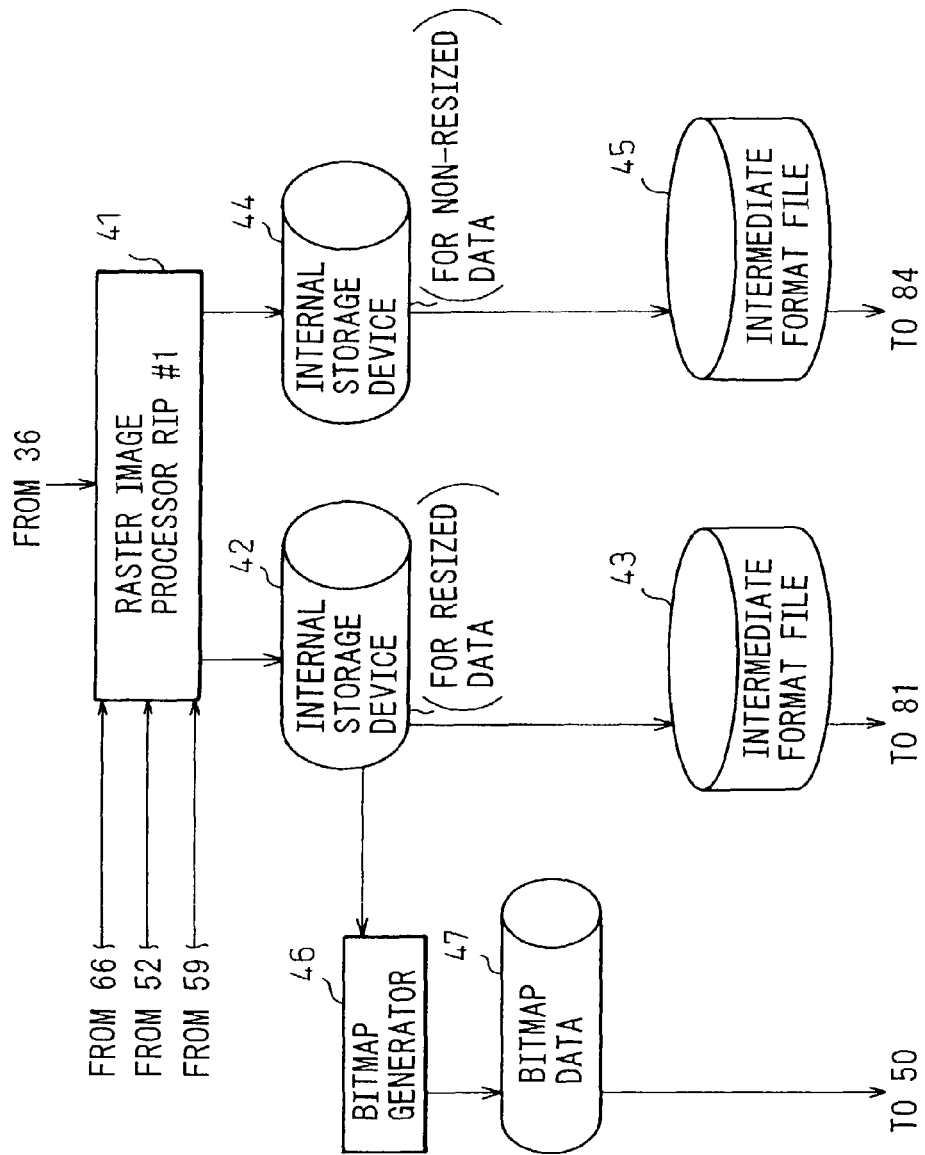
FIG. 16 is a system block diagram (part 1) showing a wiring forming system according to a first modified example of the first embodiment of the present invention.
Figure 17:
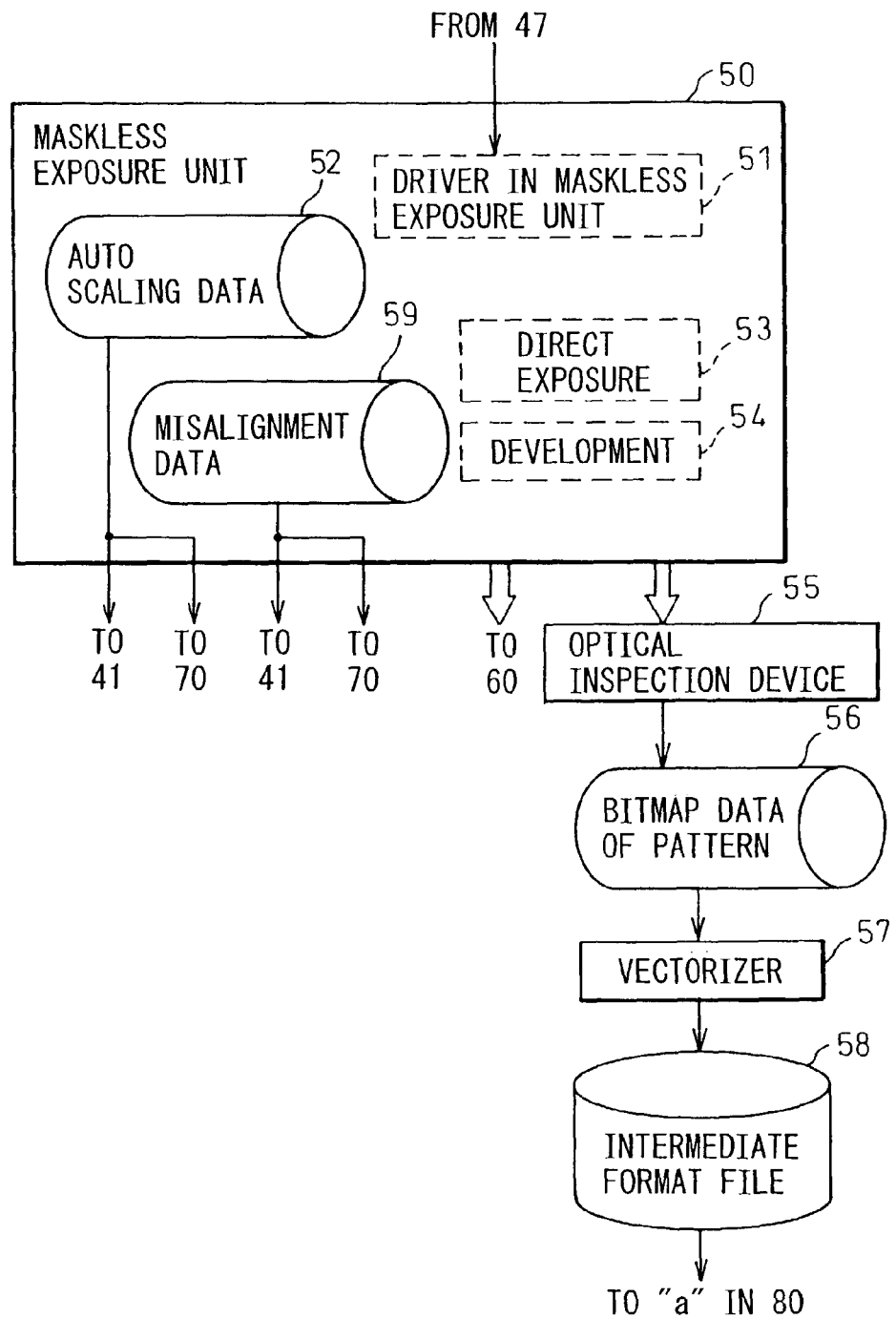
FIG. 17 is a system block diagram (part 2) showing the wiring forming system according to the first modified example of the first embodiment of the present invention.
Figure 18:
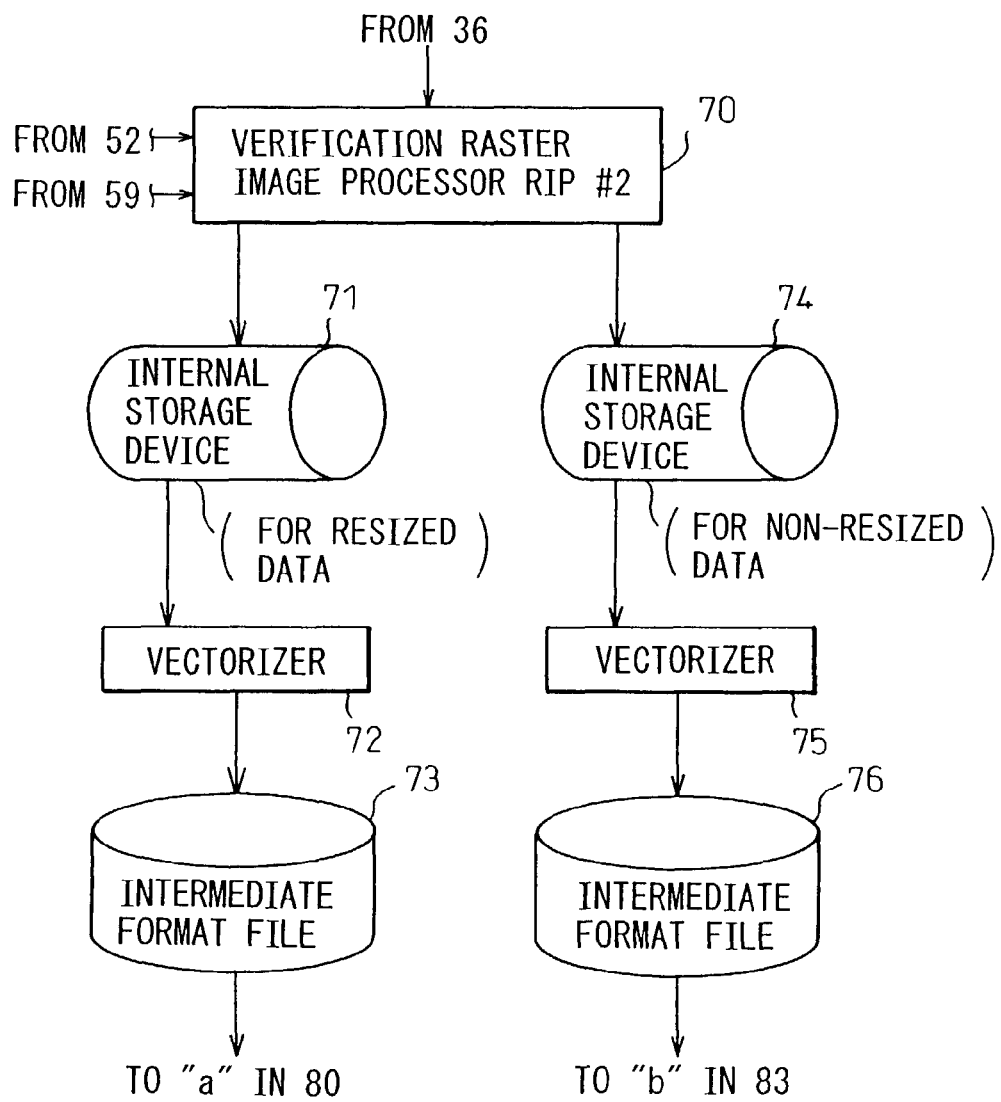
FIG. 18 is a system block diagram (part 3) showing the wiring forming system according to the first modified example of the first embodiment of the present invention.

FIGS. 16 to 18 are system block diagrams showing the wiring forming system according to the first modified example of the first embodiment of the present invention.

As earlier described, the maskless exposure unit has the function of measuring the condition, such as shrinkage/expansion and distortion, of the board during the exposure. In this modified example, the maskless exposure unit 50 in FIG. 17 measures the difference between the reference position on the exposure stage at which the unexposed board should normally be placed and the position on the exposure stage at which the unexposed board is actually placed. Then, based on this difference, misalignment data 59 is generated. The misalignment data 59 is data describing the difference in terms of a function that includes as parameters the angle $\delta\theta$ indicating the difference in the direction of rotation and the distance ($\delta x$, $\delta y$) indicating the spatial difference in the horizontal directions.

In this modified example, it is preferable that the maskless exposure unit further includes a mechanical correcting unit (not shown) for mechanically moving the exposure stage on which the unexposed board is actually placed, in accordance with the above misalignment data. The mechanical correcting unit rotates and/or moves the exposure stage in the horizontal direction to correct the position so as to bring the mounting position of the unexposed board as close as possible to the reference position. The mechanical correcting unit may be constructed using the known art, for example, a stepping motor and its drive circuitry.

In this way, the modified example can accomplish two kinds of corrections, that is, the "data processing correction" which corrects the exposure data by using the auto scaling data, and the "mechanical correction" which corrects the position by moving the exposure stage in accordance with the misalignment data. These two corrections may be performed in combination, or either one or the other may be performed singly.

When performing the data processing correction and the mechanical correction in combination, the data processing correction may be used in such a manner as to complement the job of the mechanical correction. Alternatively, a correction, that can be relatively large, to the exposure data may be performed using the mechanical correction, and the remaining correction may be done using the data processing correction. This has the effect of being able to reduce the processing time compared with the case of using the data processing correction alone, especially when there is a large deviation between the actual board and the exposure data.

The misalignment data 59 is sent to the raster image processor 41 of FIG. 16 together with the auto scaling data 52.

The details of the raster image processor 41 have already been described previously with reference to the first embodiment. In the modified example, the reading unit (not shown) in the raster image processor 41 of FIG. 16 reads out the misalignment data in synchronism with the operation of the maskless exposure unit, in addition to the previously described design data, resized design data, auto scaling data 52 (scaling correction value), and dynamic routing rules data.

Using the auto scaling data 52, the dynamic routing rules data 66, and the misalignment data 59, the raster image processor 41 distorts the graphic data of the resized design data and non-resized design data, dislocates the position of the graphic data, and thus generates the exposure data for the designated exposure area on the unexposed board surface. Here, when the mechanical correction by the mechanical correcting unit is already done, the raster image processor 41 distorts the graphic data of the resized design data and non-resized design data and dislocates the position of the graphic data, by using the auto scaling data 52 and the dynamic routing rules data 66, but not using the misalignment data 59. On the other hand, when the mechanical correction is not done, the raster image processor 41 distorts the graphic data of the resized design data and non-resized design data and dislocates the position of the graphic data, by using the misalignment data 59, the auto scaling data 52, and the dynamic routing rules data 66.

The exposure data generated as described above is thereafter processed in the same manner as described in the first embodiment.

The misalignment data 59 is also sent to the verification raster image processor 70 of FIG. 18 together with the auto scaling data 52.

The details of the verification raster image processor 70 have already been described previously with reference to the first embodiment. The verification raster image processor 70 generates the verification exposure data by using the same inputs as those to the raster image processor 41 of FIG. 16. Here, when the mechanical correction by the mechanical correcting unit is already done, the raster image processor 70, like the raster image processor 41, distorts the graphic data of the resized design data and non-resized design data and dislocates the position of the graphic data, by using the auto scaling data 52 and the dynamic routing rules data 66, but not using the misalignment data 59. On the other hand, when the mechanical correction is not done, the raster image processor 70, like the raster image processor 41, distorts the graphic data of the resized design data and non-resized design data and dislocates the position of the graphic data, by using the misalignment data 59, the auto scaling data 52, and the dynamic routing rules data 66.

The verification exposure data generated as described above is thereafter processed in the same manner as described in the first embodiment.

As described above, in the first modified example of the first embodiment of the invention, the mechanical correction is applied by directly rotating and/or moving the exposure stage in the maskless exposure unit in such a manner as to bring the actual position of the unexposed board, relative to the exposure head, as close as possible to the reference position at which the board should normally be placed. This mechanical correction has the effect of being able to reduce the processing time compared with the case of the data processing correction alone, especially when there is a large deviation between the actual board and the exposure data. If the mechanical correction is combined appropriately with the already described data processing correction according to the number of the board to be manufactured (in lots), the purpose, characteristics, etc. the wiring can be formed more efficiently.

Next, a description will be given of a second modified example of the first embodiment of the present invention.

Figure 19:
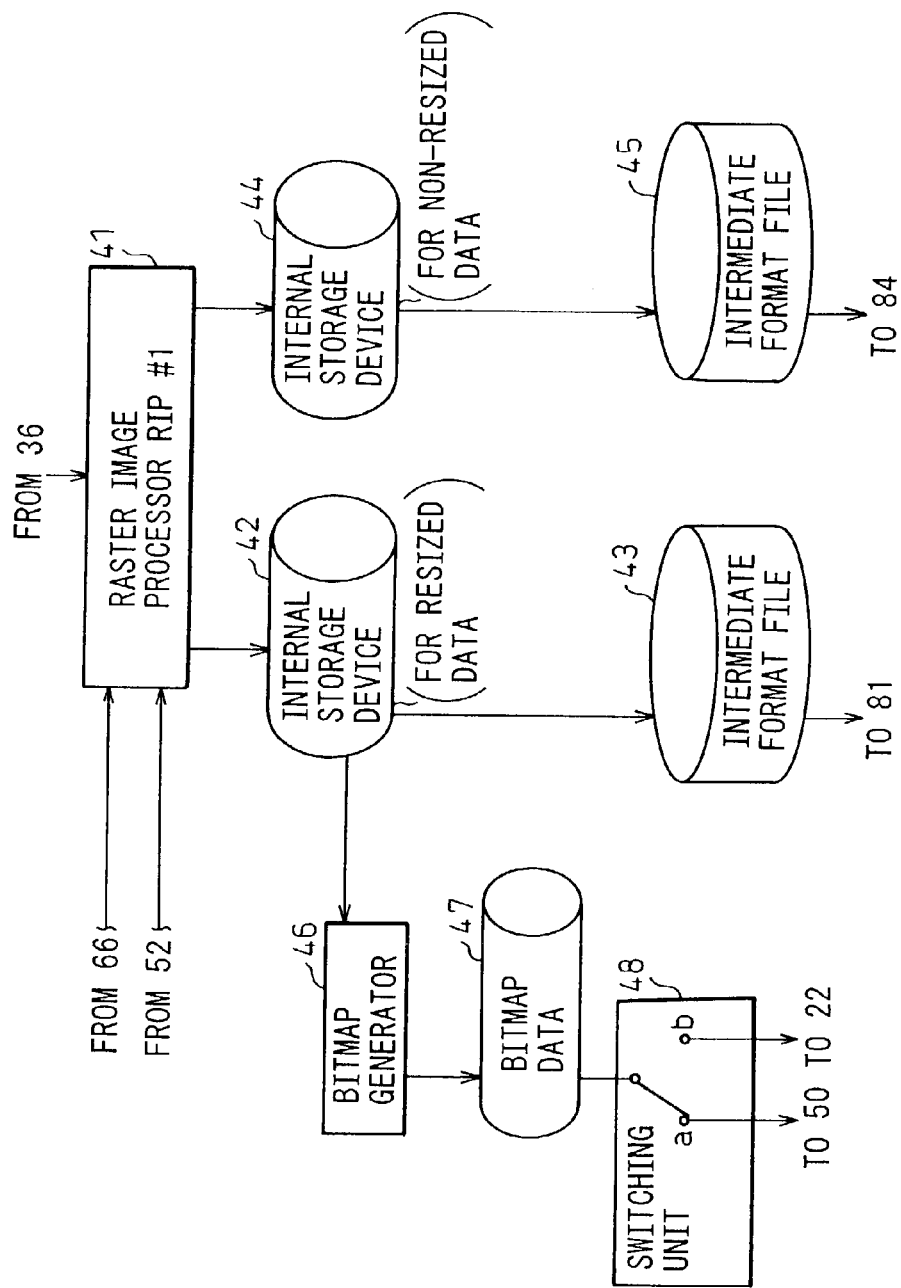
FIG. 19 is a system block diagram (part 1) showing a wiring forming system according to a second modified example of the first embodiment of the present invention.
Figure 20:
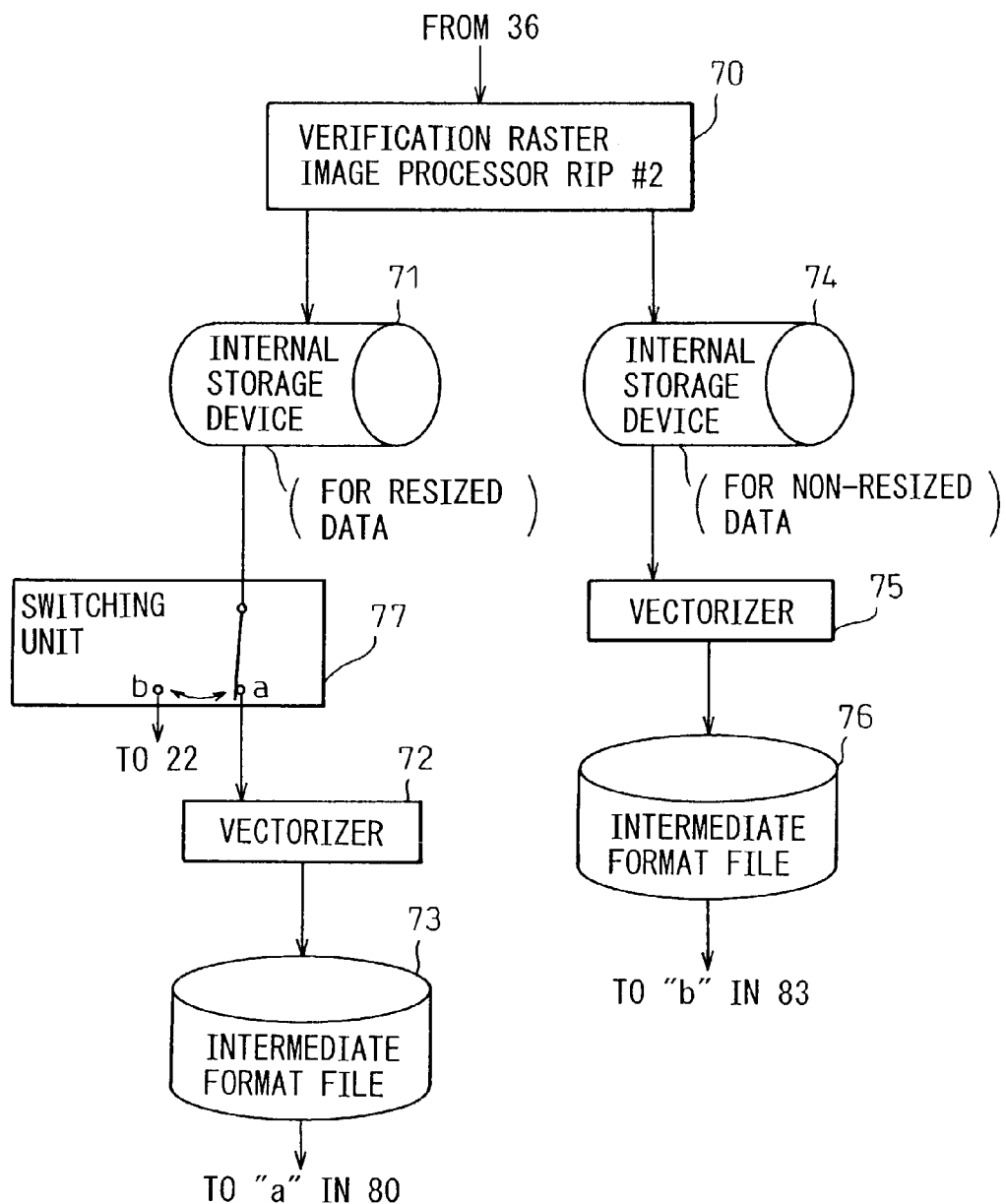
FIG. 20 is a system block diagram (part 2) showing the wiring forming system according to the second modified example of the first embodiment of the present invention.
Figure 21:
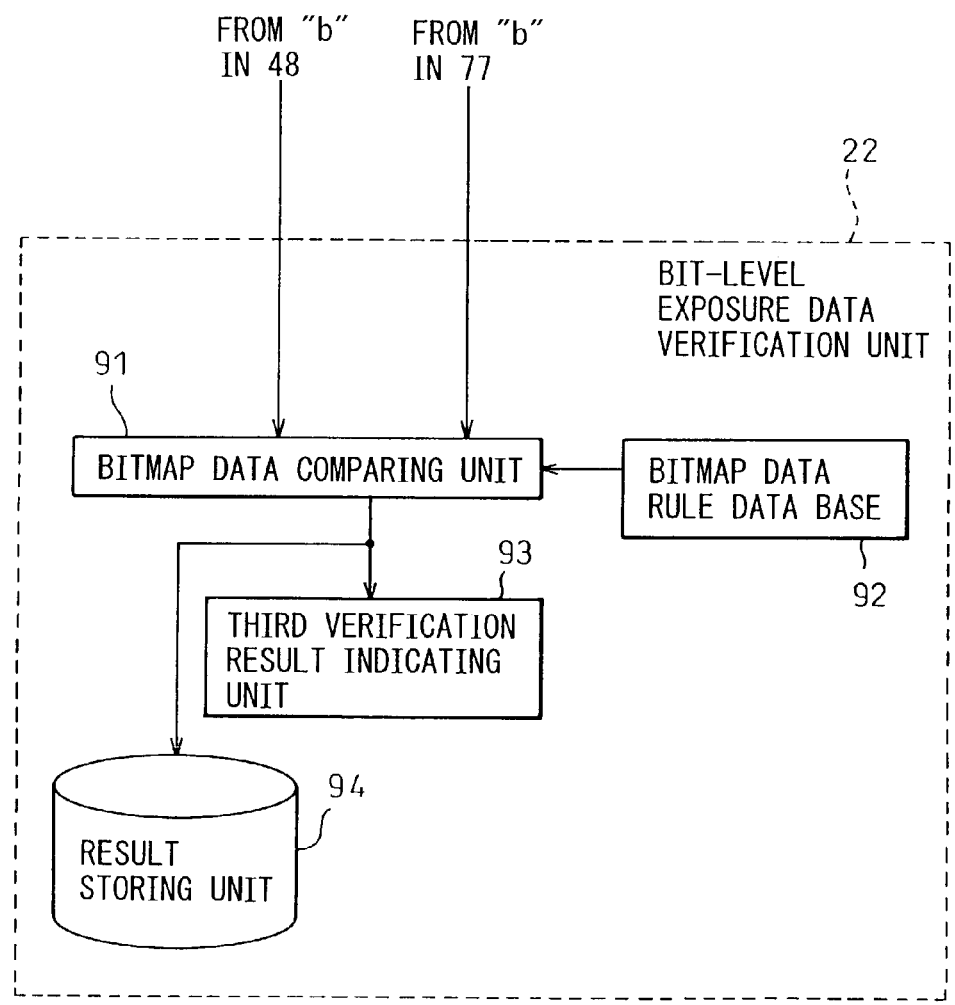
FIG. 21 is a system block diagram (part 3) showing the wiring forming system according to the second modified example of the first embodiment of the present invention.

FIGS. 19 to 21 are system block diagrams showing the wiring forming system according to the second modified example of the first embodiment of the present invention.

The verification raster image processor 70 in FIG. 19 is functionally the same as the raster image processor 41 in FIG. 19 for the generation of bitmap data, but the algorithm for its operation and the method of its implementation are entirely different.

As already described, in the first embodiment of the present invention, the accuracy of the wiring forming system of the invention has been verified by geometrically comparing and examining the post-exposure board and the post-etching board.

In contrast, in the modified example, the same functions of the computing devices are realized using different algorithms and different implementation methods and, by checking whether the exposure data created in bitmap format using the computing devices having entirely different algorithms match each other, the accuracy of the exposure data generated in bitmap format in the wiring forming system according to the first embodiment of the invention is further verified, thereby aiming to achieve a further precise and accurate wiring forming system.

As earlier described, in the first embodiment of the present invention, the bitmap generator 46 in FIG. 8 reads out the exposure data stored in the internal storage device 42, and converts the data, which was in the vector data format, into bitmap data 47 as needed. The second modified example of the present embodiment further includes a process for verifying the accuracy of the bitmap data 47.

As shown in FIG. 19, the modified example differs from the system block previously shown in FIG. 8 by the inclusion of a switching unit 48. When the switching unit 48 in FIG. 19 is switched from "b" to "a", the bitmap data 47 is sent to the maskless exposure unit 50, as in the case of FIG. 8. On the other hand, when the switching unit 48 in FIG. 19 is switched from "a" to "b", the bitmap data 47 is sent to a bit-level exposure data verification unit 22 in FIG. 21.

Further, as shown in FIG. 20, the modified example differs from the system block previously shown in FIG. 11 by the inclusion of a switching unit 77. When the switching unit 77 in FIG. 20 is switched from "b" to "a", the bitmap data generated by the verification raster image processor 70 and temporarily stored in the internal storage device 71 is sent to the vectotizer 72, and when the switching unit 77 in FIG. 20 is switched from "a" to "b", the bitmap data is sent to the bit-level exposure data verification unit 22 in FIG. 21.

The bit-level exposure data verification unit 22 of FIG. 21 verifies the accuracy, at the bit level, of the exposure data generated in the wiring forming system of the present invention, by using the bitmap data of the exposure data generated by the raster image processor 41 of FIG. 15 and the bitmap data of the verification exposure data generated by the verification raster image processor 70 of FIG. 20.

A bitmap data comparing unit 91 compares, at the bit level, the exposure data generated by the raster image processor 41 and transferred via "b" in the switching unit 48 in FIG. 19, with the verification exposure data generated by the verification raster image processor 70 and transferred via "b" in the switching unit 77 in FIG. 20. Here, the comparison may be made for the bit map of the entire exposure data or the bit map of a portion thereof.

If it is determined that the exposure data and the verification exposure data match each other, this means that the exposure data generated in the wiring forming system of the present invention is also reliable at the bit level; on the other hand, if it is determined that they do not match, this means that some problem may exist.

In the modified example, the bit-level exposure data verification unit 22 further includes a bitmap data rule data base 92 which stores a inspect rule that defines the allowable level of difference between the bitmap data of the exposure data generated by the raster image processor 41 of FIG. 19 and the bitmap data of the verification exposure data generated by the verification raster image processor 70 of FIG. 20. The bitmap data comparing unit 91 in the bit-level exposure data verification unit 22 verifies the accuracy of the exposure data at the bit level in accordance with the inspect rule stored in the bitmap data rule data base 92.

If an unallowable error is detected by the bitmap data comparing unit 91, a third verification result indicating means 93 in the bit-level exposure data verification unit 22 indicates the result of the bit-level verification. The third verification result indicating means 93 may report the result to the user by outputting text information or an image to a printer or a display monitor or the like. Further, the result of the verification may be stored in a result storing unit 94.

By verifying the bit-level accuracy of the exposure data in the wiring forming system of the present embodiment as described above, the reliability of the system can be further enhanced.

As in the case of the previously described verification process, when the design data is changed, or when forming wiring for an entirely new board, for example, if the verification process of the modified example is executed before putting the wiring forming system into full operation, the wiring can be formed with higher precision and higher accuracy. After the verification is done, the switches in the respective switching unit should be switched back to the normal operating positions.

In the modified example, the bit-level exposure data verification unit has been implemented using a single verification raster image processor having a different algorithm from that of the raster image processor, but it will be recognized that two or more verification raster image processors may be provided; in that case, as the number of verification processors increases, the reliability of the verification process increases correspondingly.

The first modified example and the second modified example may be implemented in combination.

Next, a wiring forming system according to a second embodiment of the present invention will be described.

In the foregoing first embodiment of the present invention, the wiring for the wiring board has been formed using maskless exposure. By contrast, in the second embodiment of the present invention, the wiring for the wiring board is formed using inkjet technology.

FIGS. 22 to 26 are system block diagrams showing the wiring forming system according to the second embodiment of the present invention.

The second embodiment of the present invention will be described below by taking as an example the wiring forming system for an electronic component (IC) package, but it will be appreciated that the second embodiment of the invention is applicable not only to the production of semiconductor packages but also to the production of conventional wiring boards.

Figure 22:
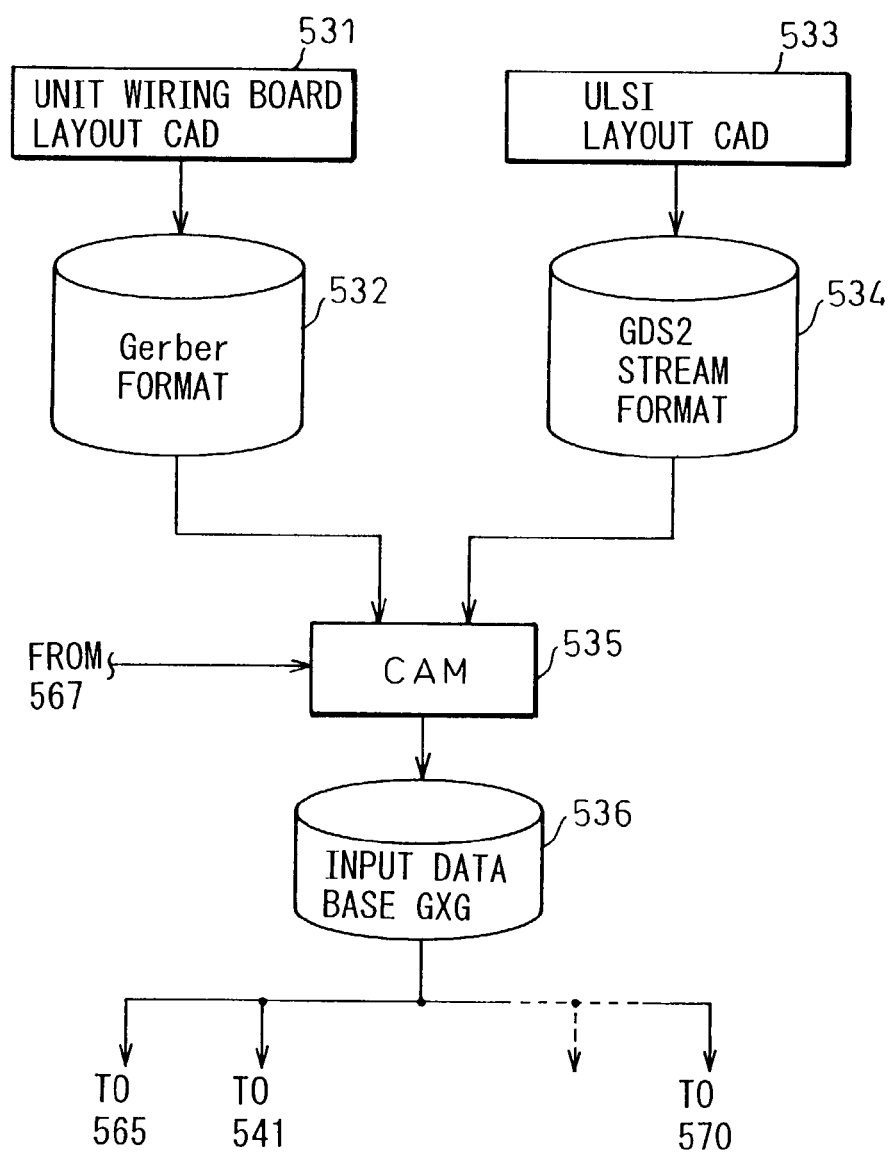
FIG. 22 is a system block diagram (part 1) showing a wiring forming system according to a second embodiment of the present invention.

First, in FIG. 22, a unit wiring board layout CAD block 531 performs electrical characteristic simulation and routing for a semiconductor package or a unit wiring board on a wiring board. The resultant design data is output in a standard Gerber format 532. This design data constitutes main input data for the wiring forming system.

Layout information for the pads to be formed where the IC chip is to be mounted is generated by a ULSI layout CAD block 533 in FIG. 22. The resultant design data is output in a GDS2 stream format 534 which is generally used in IC layout design.

A CAM block 535 takes as inputs the Gerber format 532 and the GDS2 stream format 534, and receives a resizing rule from a resizing rule data base 567 and performs variable resizing (the resizing) in order to correct for the dimensional change of the wiring that occurs during inkjet patterning. In this way, resized design data is obtained by correcting the above design data in accordance with the resizing rule.

Further, the CAM block 535 edits data relating to job deck information by performing an imposition job. The imposition job performed in the present invention is simple since it is only necessary to determine the rows and columns in which the individual unit wiring boards are arranged on the wiring board.

The CAM block 535 also edits data relating to additional information such as alignment information.

In this way, in the second embodiment of the present invention, as in the foregoing first embodiment, the non-resized design data, resized design data, job deck information data, and additional information data are consolidated as input data to the wiring forming system 501. Here, as earlier described, the design data includes the predetermined wiring information for the plurality of unit wiring boards to be formed on the large-sized wiring board and the predetermined pad layout information for the electronic component (IC) to be mounted on each unit wiring board. These data are stored in consolidated form in an input data base (GXG) 536. When a passive component such as a capacitor is to be mounted on the unit wiring board together with the electronic component such as the IC chip described above, schematic data for such a component is also stored in the input data base 536.

An inkjet patterning unit 550 (shown in FIG. 24) used in the present invention comprises one or more inkjet heads (that is, drawing engines) which are arranged so as to form patterns in designated areas on the surface of a pre-patterning board, that is, the board yet to be formed with patterns, and which perform patterning in parallel fashion. With the respective inkjet heads arranged to form inkjet patterns in the designated areas in parallel fashion, the pattern formation can be accomplished at faster speed than the conventional exposure unit.

Inkjet technology is a technology that ejects liquid droplets through nozzles in which microscopic holes are opened. Usually, the inkjet technology is used for printers, but when using inkjet printing directly for the formation of wiring patterns as in the present embodiment, the liquid droplets to be ejected from the nozzles should be formed from a liquid containing fine metal particles or a metal oxide material. There are two main types of inkjet printing: one is the piezoelectric type that utilizes a piezoelectric element which, when a voltage is applied, is caused to deform, causing a sudden increase in the liquid pressure in the ink chamber and thereby forcing a liquid droplet through the nozzle, and the other is the thermal type that forms a bubble in the liquid by a heater mounted on the head and thereby pushes out a liquid droplet. Either type can be used in the present invention.

For the inkjet patterning unit having such a plurality of inkjet heads (drawing engines), the input data base 536 stores each of the above-listed data by spatially dividing it so that the data can be allocated to each designated inkjet head.

Figure 23:
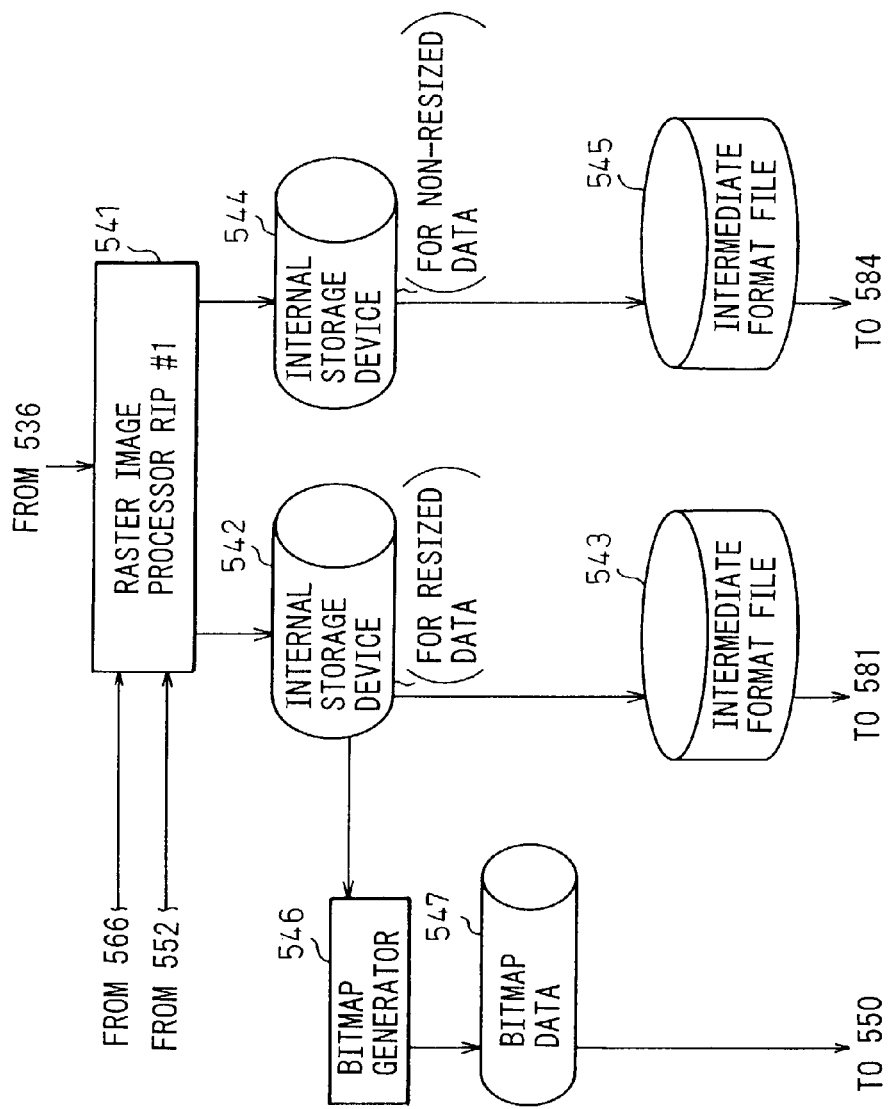
FIG. 23 is a system block diagram (part 2) showing the wiring forming system according to the second embodiment of the present invention.

Raster image processors 541 in FIG. 23 are data processing systems which are allocated to the respective inkjet heads of the inkjet patterning unit, and which perform the patterning operation in a parallel fashion. In this specification, only one raster image processor (RIP #1) is shown in FIG. 23 for simplicity of illustration, but actually, there are at least as many raster image processors as there are the inkjet heads.

Each raster image processor 541 includes a reading unit which, in synchronism with the drawing stage operation of the inkjet patterning unit 550, reads out the design data, resized design data, scaling correction value, and dynamic routing rules data allocated to the inkjet head.

Here, the auto scaling data 552 is data for making delicate corrections to the position and shape of the graphic data to be drawn by inkjet printing; this data is generated in the same manner as in the first embodiment. On the other hand, the dynamic routing rules data is data that estimates how the wiring should be changed to achieve the desired interconnection pattern, based on the design data and the information concerning the dislocation between the position on the post-patterning board at which the IC chip and/or the passive component were mounted and/or formed in the previous process and the position at which these components should normally be mounted; this data is generated in the same manner as in the first embodiment.

Using the auto scaling data 552 (that is, the scaling correction value) and the dynamic routing rules data 566, the raster image processor 541 distorts the graphic data of the resized design data, dislocates the position of the graphic data, and thus generates the drawing data for the designated patterning area on the pre-drawing board surface.

The drawing data is generated by pairing the resized graphic data with the bias data used to compensate for the dislocation and distortion. This data has a vector data format extracting the contour of the graphic, that is, it contains geometrical information. By using the vector data format, the amount of data can be reduced, and hence the processing speed of the processor can be increased. The inkjet patterning unit forms wiring patterns by inkjet printing on the pre-drawing board based on the drawing data. The drawing data is converted into data for use in an inkjet device.

With the inkjet technology, fine wiring lines, for example, with line width of 10 μm or less can be formed by ejecting fine metal particles. This contributes to further reductions in the semiconductor package size.

Further, since various materials can be sprayed onto the board, elements having such functions as a capacitor, a resistor, or an inductor can be formed on the board as desired. For example, when forming wiring lines, a liquid containing fine metal particles is used, and when forming a capacitor, a metal oxide material is sprayed by inkjetting; in this way, the material to be ejected should be selected according to the element to be formed. Furthermore, as the size of the material to be ejected is made smaller, the amount of metal particles to be ejected by the inkjet device can be stabilized, and thus, variations in the resistance of the wiring lines formed can be reduced.

The drawing data generated by the raster image processor 541, that is, the resized data set, is stored in an internal storage device 542, and also in an intermediate format file 543 for use in a subsequent process. The internal storage device 542 and the intermediate format file 543 are provided for each individual raster image processor, but in this specification, like the raster image processor 541, only one each is shown for simplicity of illustration.

In the raster image processor 541, the graphic data distortion and dislocation are also applied to the non-resized data, that is, the raw design data, by using the above-described bias data. The non-resized data to which the dislocation and distortion have been applied is used as post-patterning inspect data in the post-patterning inspect; the details will be described later.

Similarly to the drawing data described above, the post-patterning inspect data is generated by pairing the non-resized raw graphic data with the bias data used to compensate for the dislocation and distortion. This data has a vector data format including the contour abstracted from the graphic, that is, it contains geometrical information.

The post-patterning inspect data generated by the raster image processor 541 is stored in an internal storage device 544, and also in an intermediate format file 545 for use in a subsequent process. The internal storage device 544 and the intermediate format file 545 are provided for each individual raster image processor, but, in this specification, like the raster image processor, only one of each is shown for simplicity of illustration.

A bitmap generator 546 in FIG. 23 reads the drawing data stored in the internal storage device 542, and converts the data, which was in the vector data format, into bitmap data 547 as needed. This bitmap data 547 is the resized graphic data and the biased data described above.

Figure 24:
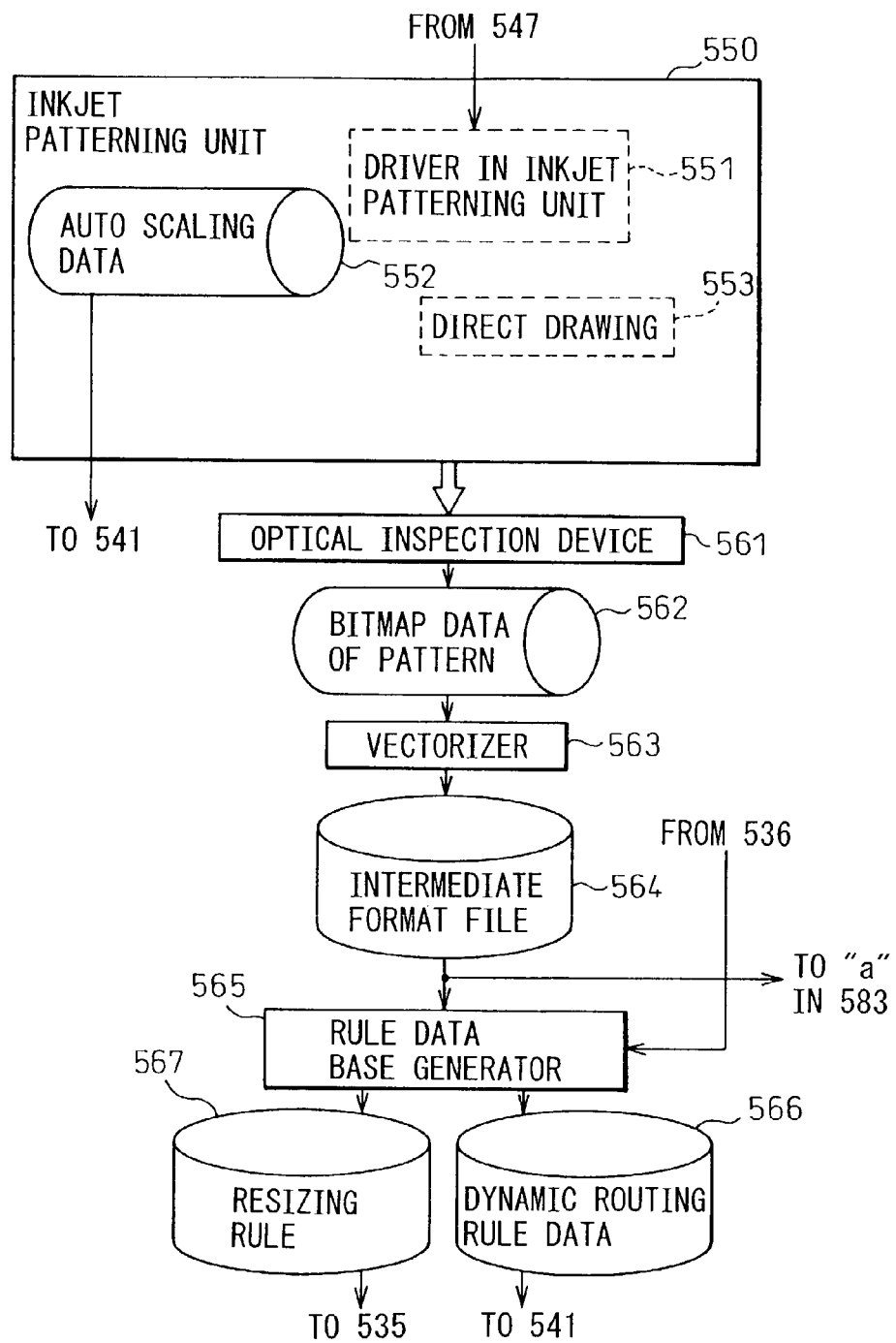
FIG. 24 is a system block diagram (part 3) showing the wiring forming system according to the second embodiment of the present invention.

The bitmap data 547 in FIG. 23 is sent to a driver 551, i.e., each inkjet head driving system in the inkjet patterning unit 550 in FIG. 24, and direct drawing 553 is performed. The inkjet patterning unit 550 used in the second embodiment of the present invention has the function of measuring the condition, such as shrinkage/expansion and distortion, of the board during the drawing. This function calculates how much the data obtained by capturing the image of the board differs from the reference data, and detects the result as information relating to the shrinkage or expansion, distortion, etc. of the board. In the present embodiment, the auto scaling data 552 for making delicate corrections to the position and shape of the graphic data to be drawn is generated from the thus obtained information relating to the condition such as the shrinkage or expansion and distortion. The auto scaling data 552 is sent to the raster image processor 541 in FIG. 23.

An optical inspect device 561 reads the wiring pattern on the post-patterning board by means of a camera, and creates bitmap data 562 of the pattern.

A vectorizer 563 reads the bitmap data 562, extracts the contour of the graphic, and converts it into vector data format. The converted data is stored in an intermediate format file 564 as the vector format image data of the post-patterning board.

The image data of the post-patterning board stored in the intermediate format file 564 is subjected to the post-patterning inspect.

Figure 26:
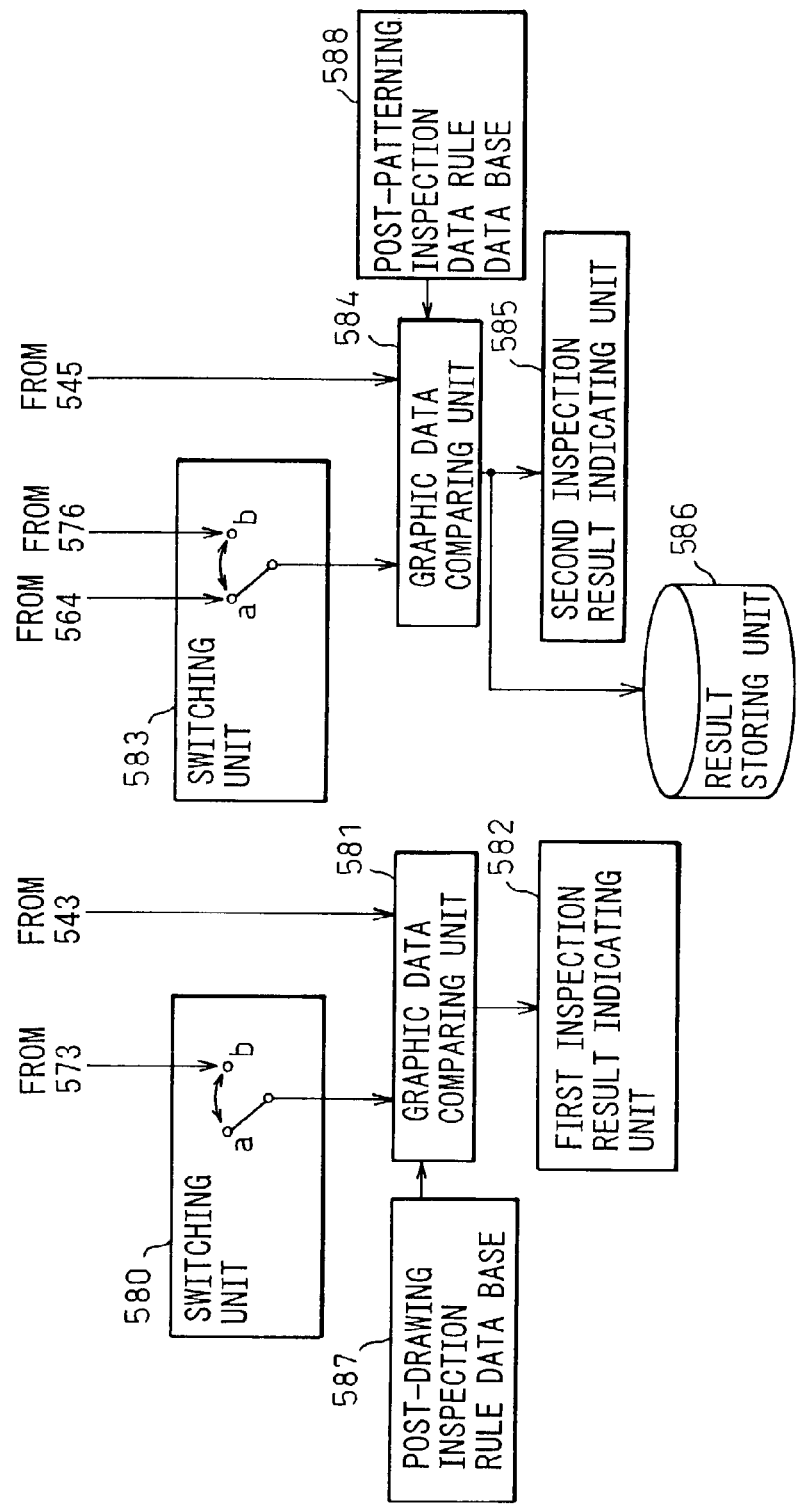
FIG. 26 is a system block diagram (part 5) showing the wiring forming system according to the second embodiment of the present invention.

A graphic data comparing unit 584 in FIG. 26 constitutes a post-patterning inspect unit which tests the post-patterning board by using the image data of the post-patterning board and the post-patterning inspect data generated by the raster image processor 541.

The graphic data comparing unit 584 reads a post-patterning inspect rule for the post-patterning inspect from a post-patterning inspect rule data base 588. Then, based on the post-patterning inspect rule, the data of the intermediate format file 564 in FIG. 24, received via "a" in a switching unit 583, that is, the image data of the post-patterning board, is compared with the data of the intermediate format file 545 in FIG. 23, that is, the post-patterning inspect data.

The post-patterning inspect data here is created by processing the design data as earlier described. More specifically, in the raster image processor 541 in FIG. 23, distortion and dislocation are applied to the non-resized data, that is, the raw design data, by using the bias data, and the resultant data is paired with the bias data used to compensate for the dislocation and distortion and is stored as the post-patterning inspect data in the intermediate format file 545. This data has a vector data format extracting the contour of the graphic.

The reason that the intermediate format file 545 is used for comparison in the post-patterning inspect is as follows.

As previously described, the CAM block 535 takes as inputs the Gerber format 532 and the GDS2 stream format 534, and performs the resizing to correct for the dimensional change of the wiring that occurs during the patterning. If this resizing is correctly done, the image data of the post-patterning board should closely resemble the post-patterning inspect data which is non-resized data. However, the resizing has no relevance to the shrinkage or expansion and distortion of the board, and when performing the post-patterning inspect, the shrinkage or expansion and distortion of the board must be taken into account.

As previously described, the inkjet patterning unit 550 has the function of measuring the condition, such as shrinkage or expansion and distortion, of the board during drawing; therefore, if the bias data used to compensate for the distortion and deformation measured here is used as-is in the post-patterning inspect, the chance of incurring false errors can be reduced to a minimum.

For the above reason, in the present invention, the intermediate format file 545, i.e., the post-patterning inspect data consisting of the non-resized graphic data and the bias data used to compensate for the distortion and deformation, is used in the post-patterning inspect.

As described above, the data of the intermediate format file 545 has a vector data format structure, and the intermediate format file 564 also is already converted by the vectorizer 563 into data that has a vector data format structure. Further, the intermediate format file 545 contains a data structure for high-speed searching for the positional relationship between the detected difference and the design pattern. Accordingly, the graphic data comparing unit 584 in FIG. 26 can perform comparisons at high speed, which also serves to ease the burden of the computing device.

If there is a difference between the image data of the post-patterning board and the post-patterning inspect data, a decision is made as to whether the difference is allowable or not, based on the post-patterning inspect rule read out from the post-patterning inspect rule data base 588. If it is not allowable, an error is reported.

If an unallowable error is detected by the graphic data comparing unit 584, a second inspect result indicating unit 585 indicates the result of the detection. The second inspect result indicating unit 585 may report the result to the user by outputting text information or an image to a printer or a display monitor or the like. If it is determined in the above post-patterning inspect that the post-patterning board contains an error, the board is rendered defective and sorted out from non-defectives, and the result is stored in a result storing unit 586.

As previously described, the graphic pattern of the post-patterning board is stored in the vector data format in the intermediate format file 564. The data stored in the intermediate format file 564 is not only subjected to the post-patterning inspect described above, but it is also input to a rule data base generator 565 in FIG. 24.

Based on the design data and the position on the post-patterning board at which each component is to be mounted on the designated unit wiring board, the rule data base generator 565 generates dynamic routing rules data 566 that indicates how the wiring should be changed to achieve the desired interconnection pattern. More specifically, the dynamic routing rules data 566 is generated using the image data of the post-patterning board, stored in the intermediate format file 564, and the non-resized data stored in the input data base 536. The rule data base 565 is also used to generate dynamic routing rules data 566 that indicates how the wiring on an upper layer should be changed so as to align with the wiring on a lower layer for connection when forming the wiring on the multilayer wiring board. The generated dynamic routing rules data 566 is sent to the raster image processor 541 in FIG. 23.

As earlier noted, it is desirable that the image data of the post-patterning board be very close to the non-resized data and ideally, coincide with it.

However, since the inkjet wiring pattern forming process is greatly affected by fluid dynamic and/or chemical parameters, modeling of the system is extremely difficult, and hence, it is difficult to estimate the optimum design data through simulation using the modeling of various parameters.

In view of this, in the present embodiment, in order to optimize the resizing, there is further provided the rule data base generator 565 as a resizing rule generating unit that generates a resizing rule for obtaining optimum design data by solving an inverse problem of how the input data should be modified in order to achieve the desired result, while fixing all the parameters related to the inkjet wiring formation.

The rule data base generator 565 first performs a plurality of comparisons between the image data of the post-patterning board, stored in the intermediate format file 564, and the non-resized data stored in the input data base 536. Based on the results of the comparisons, the inverse problem of how the current design data should be corrected in order to obtain design data optimum for obtaining the desired post-patterning board is solved by using a known mathematical technique; then, based on the solution thus obtained, the correction to be applied to the design data is converted into a rule, which is stored as the resizing rule 567.

In the wiring forming system of the present invention, the resizing rule 567 is used off-line, and is sent to the CAM block 535 in FIG. 22. That is, the CAM block 535 applies the resizing to the design data by using the resizing rule 567.

The above has described the system from the design data creation to the post-patterning inspect in the wiring forming system according to the second embodiment of the present invention.

Next, a description will be given of a system for verifying the accuracy of the wiring forming system according to the second embodiment of the present invention. The principle of the system for verifying the accuracy of the wiring forming system of this embodiment is the same as that of the verification system described in the foregoing first embodiment. That is, the same functions of the computing devices are realized using different algorithms and different implementation methods, and the accuracy of the post-patterning inspect in the system of the invention is verified by checking whether the data created using the computing devices having entirely different algorithms match each other.

Figure 25:
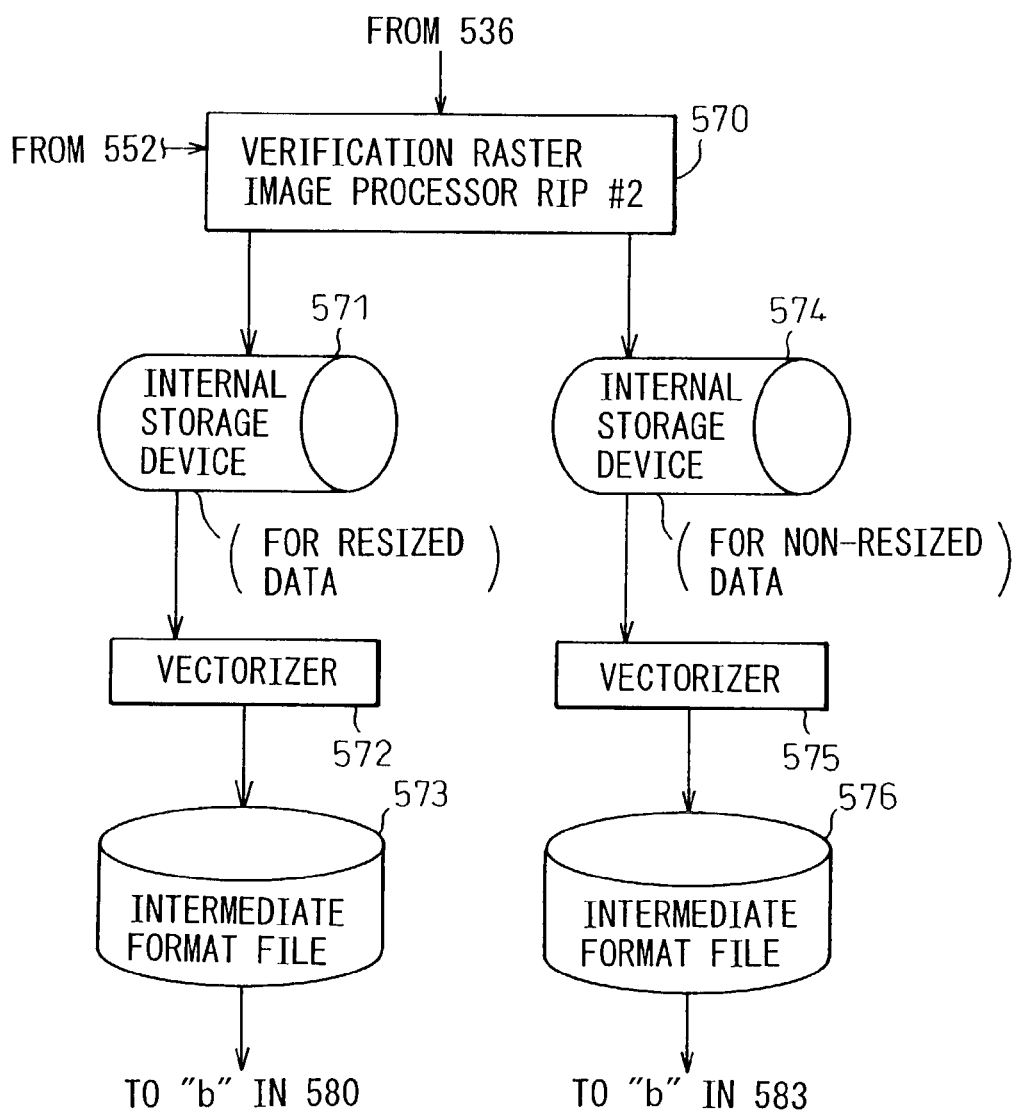
FIG. 25 is a system block diagram (part 4) showing the wiring forming system according to the second embodiment of the present invention.

A verification raster image processor 570 in FIG. 25 has an entirely different algorithm from that of the raster image processor 541 in FIG. 23. The verification raster image processor 570 is functionally the same as the raster image processor 541 for the generation of bitmap data, but the algorithm for its operation and the method of its implementation are entirely different.

The verification raster image processor 570 generates drawing data by using the same inputs as those to the raster image processor 541. These data are called the verification drawing data and the verification post-patterning inspect data, respectively.

Each data spatially divided and stored in the input data base 536 in FIG. 22 is also supplied to the verification raster image processor (RIP #2) 570 in FIG. 25.

The verification raster image processor 570 in FIG. 25 reads the resized design data stored in the input data base 536 in FIG. 22, and converts it into bitmap data, which is stored in an internal storage device 571. The bitmap data is further converted by a vectorizer 572 into data having a vector data format structure. This data is stored as the verification drawing data in an intermediate format file 573.

Further, the verification raster image processor 570 reads the non-resized design data stored in the input data base 536 in FIG. 22, and converts it into bitmap data, which is stored in an internal storage device 574. The bitmap data is further converted by a vectorizer 575 into data having a vector data format structure. The converted data is stored as the verification post-patterning inspect data in an intermediate format file 576.

On the other hand, as already explained, the intermediate format file 543 and the intermediate format file 545 are created using the raster image processor 541 in FIG. 23. As previously described, the data in the intermediate format file 543 corresponds to the drawing data, and the data in the intermediate format file 545 corresponds to the post-patterning inspect data; both data have a vector data format structure.

When verifying the drawing data in the wiring forming system of the present invention, a drawing data verification unit such as described below is activated. When the wiring forming system is operating normally, the switch in the switching unit 580 in FIG. 26 is at the position "a". Here, to activate the drawing data verification unit, the switch in the switching unit 580 of FIG. 26 is switched from "a" to "b". The verification drawing data is thus input to the graphic data comparing unit 581 together with the drawing data.

The graphic data comparing unit 581 reads a drawing data inspect rule for testing the drawing data from a drawing data inspect rule data base 587. Based on this drawing data inspect rule, the graphic data comparing unit 581 compares the drawing data, that is, the data of the intermediate format file 543 in FIG. 23, with the verification drawing data, that is, the data of the intermediate format file 573 in FIG. 25, input via "b" in the switching unit 580.

If it is determined that the drawing data and the verification drawing data match each other, this means that the drawing process of the wiring forming system is reliable; on the other hand, if it is determined that they do not match, this means that there may be some problem in the drawing data creation.

Further, as described above, the data of the intermediate format file 543 has a vector data format structure, and the intermediate format file 573 is already converted by the vectorizer 572 into data that has a vector data format structure. Since the vector data format is data that contains geometrical information extracting the contour of the graphic, the amount of data is small enough compared with the graphic data of bitmap format. Further, the intermediate format file 543 contains a data structure for high-speed searching for the positional relationship between the detected difference and the design pattern. Accordingly, the graphic data comparing unit 581 can perform comparisons at high speed, which also serves to ease the burden of the computing device.

If there is a geometrical difference in information contents between the drawing data and the verification drawing data, a decision is made based on the readout drawing inspect rule as to whether the difference is allowable or not. If it is not allowable, an error is reported.

If an unallowable error is detected by the graphic data comparing unit 581, a first inspect result indicating unit 582 indicates the result of the detection. The first inspect result indicating unit 582 may report the result to the user by outputting text information or an image to a printer or a display monitor or the like, or may also store the result of the detection in a data base.

When verifying the inkjet patterning process of the wiring forming system according to the second embodiment of the present invention, a post-patterning inspect data verification unit such as described below is activated. First, the switch in the switching unit 583 of FIG. 26 is switched from "a" to "b". The data to be input to the graphic data comparing unit 584 together with the post-patterning inspect data is thus switched from the image data of the post-patterning board to the verification post-patterning inspect data.

The graphic data comparing unit 584 compares the post-patterning inspect data, that is, the data of the intermediate format file 545 in FIG. 23, with the verification post-patterning inspect data, that is, the data of the intermediate format file 576 in FIG. 25, input via "b" in the switching unit 583.

If it is determined that the post-patterning inspect data and the verification post-patterning inspect data match each other, this means that the inkjet patterning process of the wiring forming system is reliable; on the other hand, if it is determined that they do not match, this means that there may be some problem in the patterning process.

By verifying the accuracy of the wiring forming system of the second embodiment as described above, the reliability of the system can be enhanced. In particular, when the design data is changed, or when forming wiring for an entirely new board, for example, if the above verification process is executed before putting the wiring forming system into full operation, the wiring can be formed with higher precision. Switching between the operation of the wiring forming system and the verification of the accuracy of the system can be easily done by just operating the switch in the switching unit.

In the present embodiment, the switching unit 583 is provided so that the graphic data comparing unit 584 used for the post-patterning inspect can also be used for the verification of the post-patterning inspect data, but instead, a dedicated graphic data comparing unit may be provided.

Further, only either one of the verification unit, the drawing data verification unit or the post-patterning inspect data verification unit, may be provided.

In the present embodiment, the verification unit has been implemented using a single verification raster image processor having a different algorithm from that of the raster image processor, but it will be recognized that two or more verification raster image processors may be provided; in that case, as the number of verification processors increases, the reliability of the verification process increases correspondingly.

Next, a description will be given of a first modified example of the second embodiment of the present invention. This modified example corresponds to the earlier described first modified example of the first embodiment.

In the first modified example of the second embodiment of the present invention, correction is applied by directly rotating and/or moving the drawing stage in the inkjet patterning unit in such a manner as to bring the actual position of the pre-drawn board, relative to the inkjet head, as close as possible to the reference position at which the board should normally be placed. Here, the reference position on the drawing stage at which the pre-drawn board should normally be placed is determined by such factors as the design data, the drawing data, and the mechanical characteristics of the inkjet patterning unit.

Figure 27:
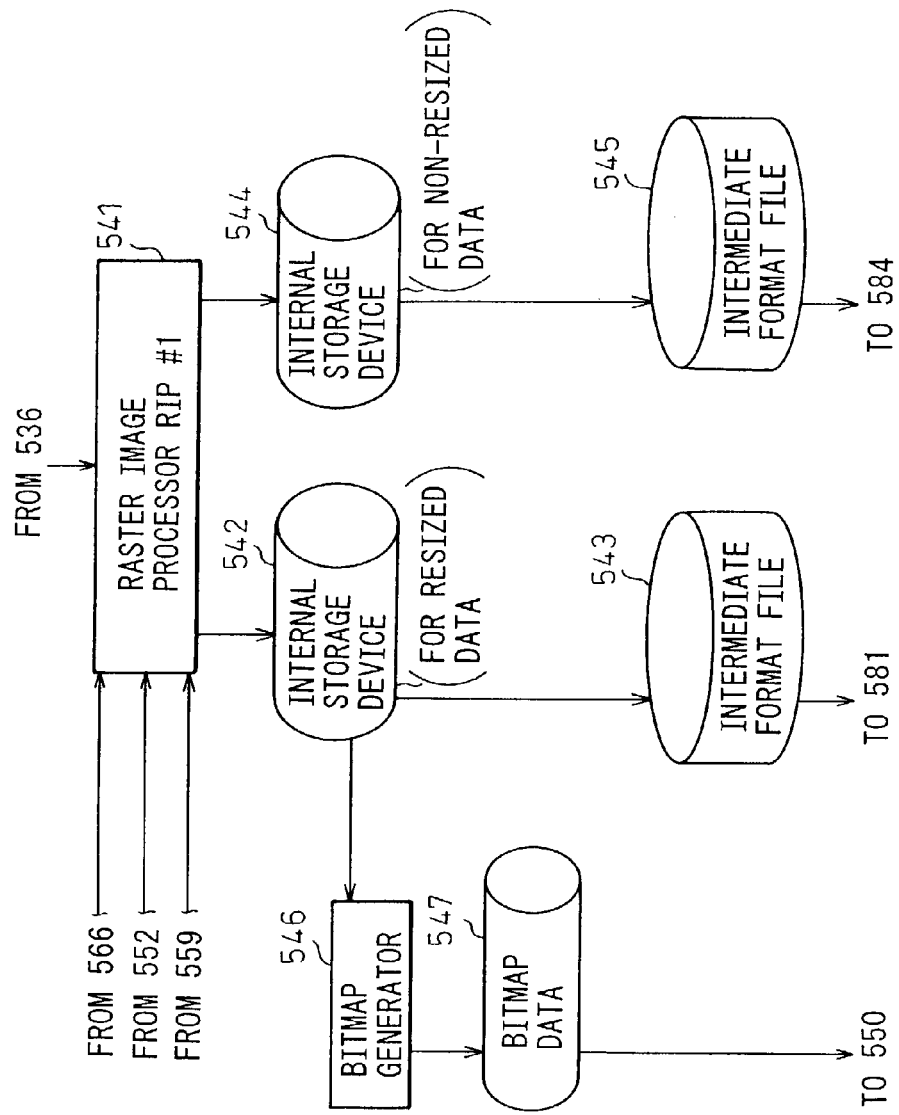
FIG. 27 is a system block diagram (part 1) showing a wiring forming system according to a first modified example of the second embodiment of the present invention.
Figure 28:
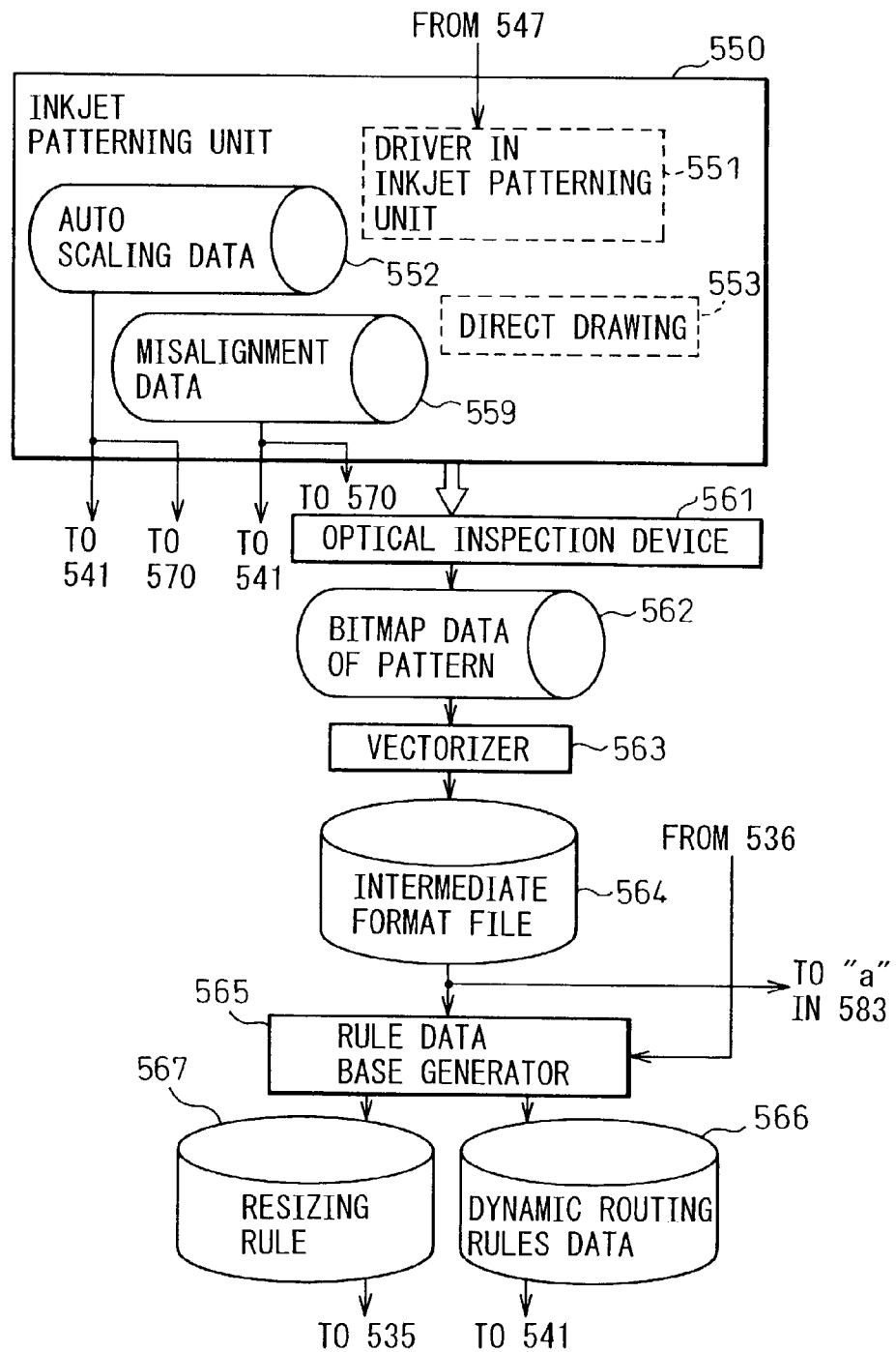
FIG. 28 is a system block diagram (part 2) showing the wiring forming system according to the first modified example of the second embodiment of the present invention.
Figure 29:
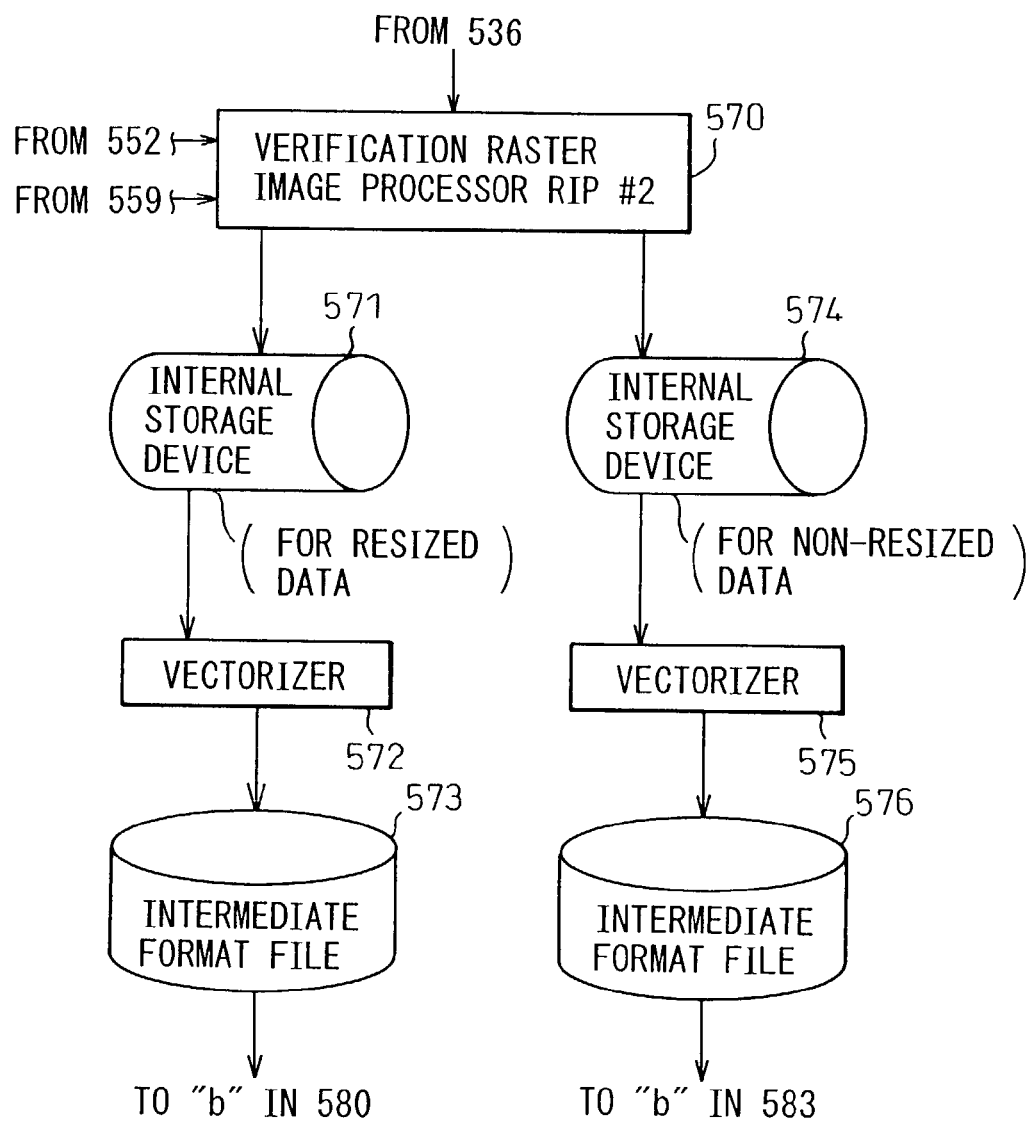
FIG. 29 is a system block diagram (part 3) showing the wiring forming system according to the first modified example of the second embodiment of the present invention.

FIGS. 27 to 29 are system block diagrams showing the wiring forming system according to the first modified example of the second embodiment of the present invention.

As earlier described, the inkjet patterning unit has the function of measuring the condition, such as shrinkage/expansion and distortion, of the board during the drawing. In this modified example, the inkjet patterning unit 550 in FIG. 28 measures the difference between the reference position on the drawing stage at which the pre-drawing board should normally be placed and the position on the drawing stage at which the pre-drawing board is actually placed. Then, based on this difference, misalignment data 559 is generated.

In this modified example, it is preferable that the inkjet patterning unit further includes a mechanical correcting unit (not shown) for mechanically moving the drawing stage on which the pre-drawing board is actually placed, in accordance with the above misalignment data. The mechanical correcting unit rotates and/or moves the drawing stage in the horizontal direction to correct the position so as to bring the mounting position of the pre-drawing board as close as possible to the reference position. The mechanical correcting unit can be constructed using the known art, for example, a stepping motor and its drive circuitry.

This modified example, like the earlier described first modified example of the first embodiment, can accomplish two kinds of corrections, that is, the data processing correction which corrects the drawing data by using the auto scaling data, and the mechanical correction which corrects the position by moving the drawing stage in accordance with the misalignment data.

The misalignment data 559 is sent to the raster image processor 541 of FIG. 27 together with the auto scaling data 552.

The details of the raster image processor 541 have already been described previously with reference to the second embodiment. In the modified example, the reading unit (not shown) in the raster image processor 541 of FIG. 27 reads out the misalignment data 559 in synchronism with the operation of the inkjet patterning unit, in addition to the previously described design data, resized design data, auto scaling data 552 (scaling correction value), and dynamic routing rules data.

Using the auto scaling data 552, the dynamic routing rules data 566, and the misalignment data 559, the raster image processor 541 distorts the graphic data of the resized design data and non-resized design data, dislocates the position of the graphic data, and thus generates the drawing data for the designated drawing area on the pre-drawing board surface. Here, when the mechanical correction by the mechanical correcting unit is already done, the raster image processor 541 distorts the graphic data of the resized design data and non-resized design data and dislocates the position of the graphic data, by using the auto scaling data 552 and the dynamic routing rules data 566, but not using the misalignment data 559. On the other hand, when the mechanical correction is not done, the raster image processor 541 distorts the graphic data of the resized design data and non-resized design data and dislocates the position of the graphic data, by using the misalignment data 559, the auto scaling data 552, and the dynamic routing rules data 566.

The drawing data generated as described above is thereafter processed in the same manner as described in the second embodiment.

The misalignment data 559 is also sent to the verification raster image processor 570 of FIG. 29 together with the auto scaling data 552.

The details of the verification raster image processor 570 have already been described previously with reference to the second embodiment. The verification raster image processor 570 generates the verification drawing data by using the same inputs as those to the raster image processor 541 of FIG. 27. Here, when the mechanical correction is already done, the raster image processor 570, like the raster image processor 541, distorts the graphic data of the resized design data and non-resized design data and dislocates the position of the graphic data, by using the auto scaling data 552 and the dynamic routing rules data 566, but not using the misalignment data 559. On the other hand, when the mechanical correction is not done, the raster image processor 570, like the raster image processor 541, distorts the graphic data of the resized design data and non-resized design data and dislocates the position of the graphic data, by using the misalignment data 559, the auto scaling data 552, and the dynamic routing rules data 566.

The verification drawing data generated as described above is thereafter processed in the same manner as described in the second embodiment.

As described above, in the first modified example of the second embodiment of the present invention, the mechanical correction is applied by directly rotating and/or moving the drawing stage in the inkjet patterning unit in such a manner as to bring the actual position of the pre-drawn board, relative to the drawing head, as close as possible to the reference position at which the board should normally be placed. This mechanical correction has the effect of being able to reduce the processing time compared with the case of the data processing correction alone, especially when there is a large deviation between the actual board and the drawing data. If the mechanical correction is combined appropriately with the already described data processing correction according to the number of the board to be manufactured, the purpose, characteristics, etc., the wiring can be formed more efficiently.

Next, a description will be given of a second modified example of the second embodiment of the present invention. This modified example corresponds to the earlier described second modified example of the first embodiment. That is, in this modified example, the same functions of the computing devices are realized using different algorithms and different implementation methods and, by checking whether the drawing data created in bitmap format using the computing devices having entirely different algorithms match each other, the accuracy of the drawing data generated in bitmap format in the wiring forming system according to the second embodiment of the present invention is further verified, thereby aiming to achieve a further precise and accurate wiring forming system.

Figure 30:
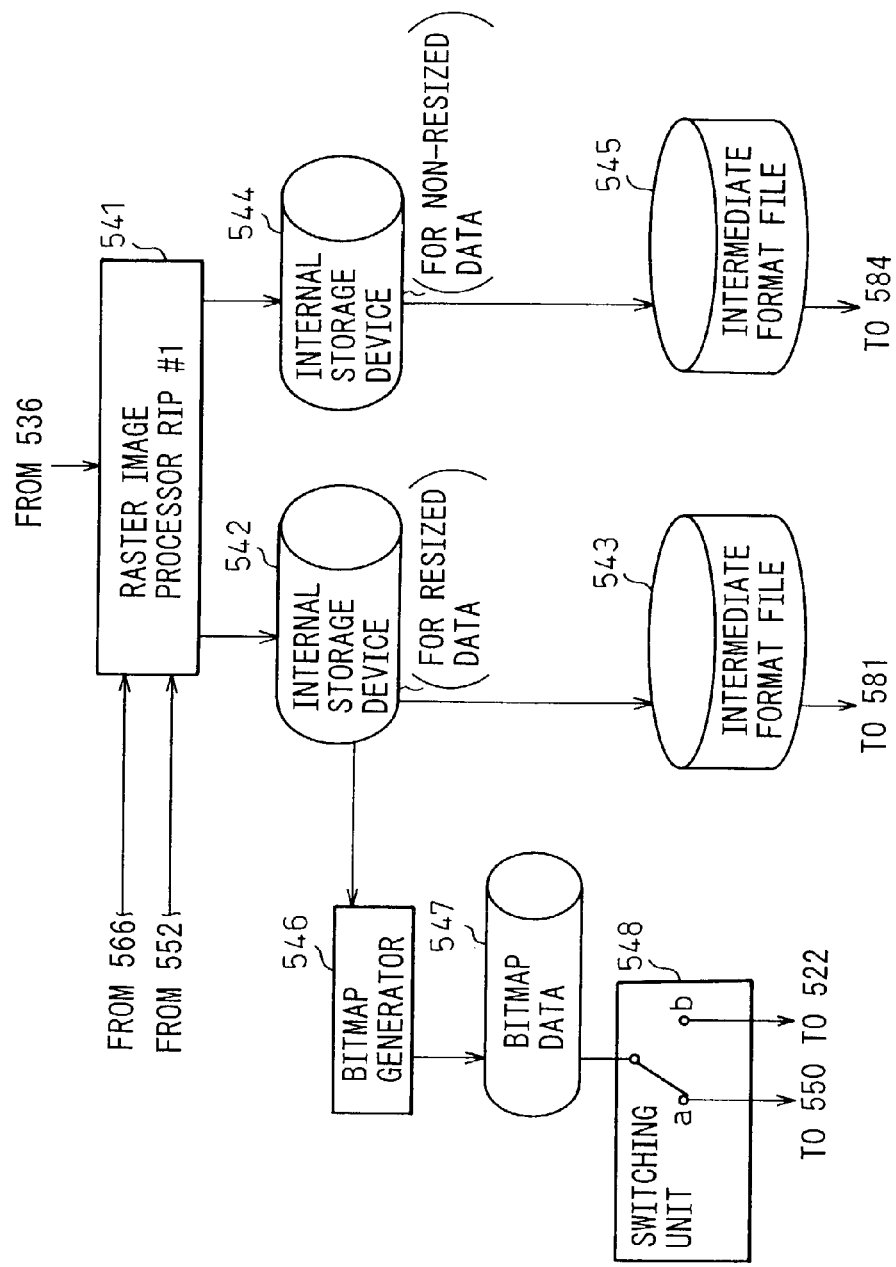
FIG. 30 is a system block diagram (part 1) showing a wiring forming system according to a second modified example of the second embodiment of the present invention.
Figure 31:
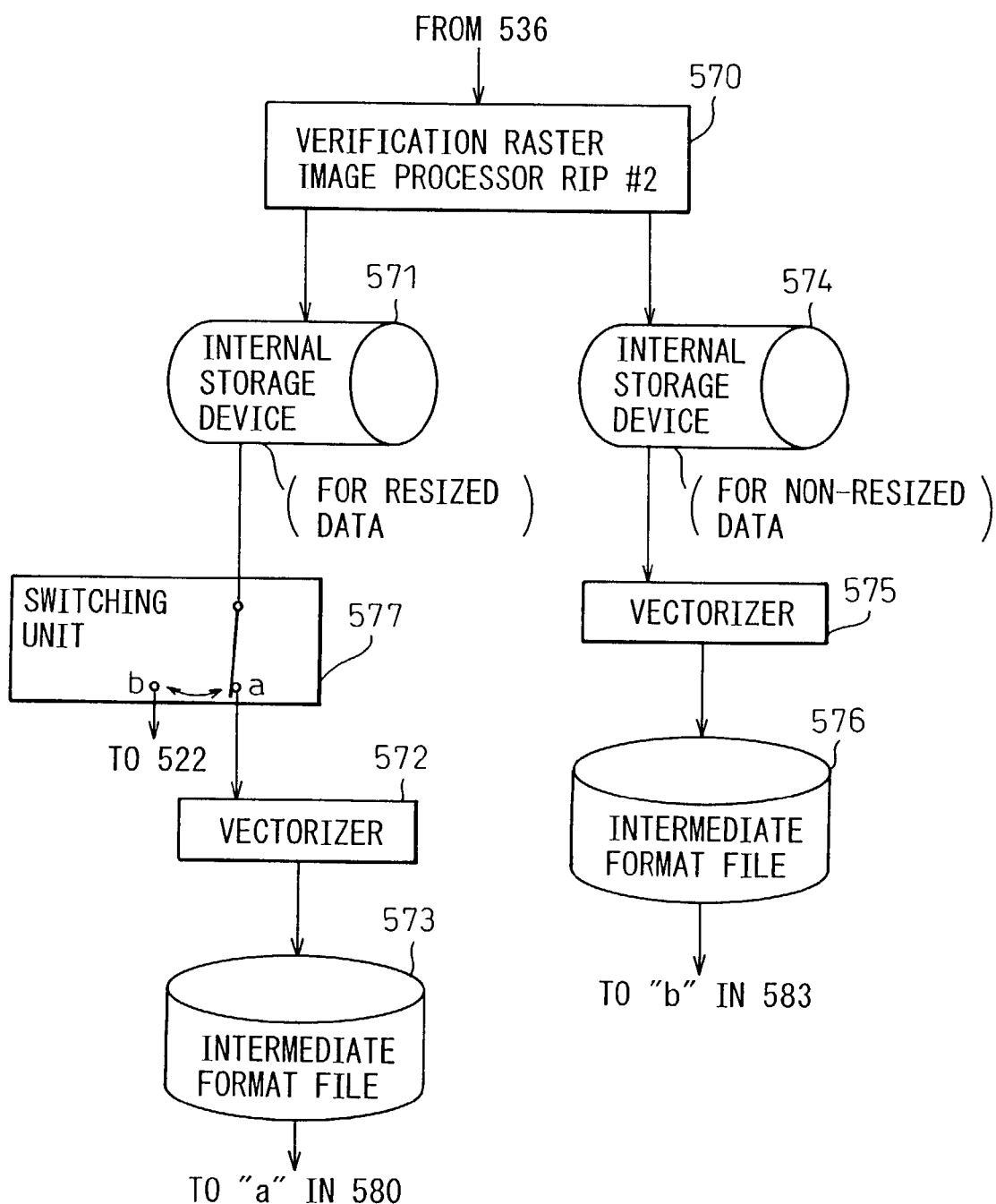
FIG. 31 is a system block diagram (part 2) showing the wiring forming system according to the second modified example of the second embodiment of the present invention.
Figure 32:
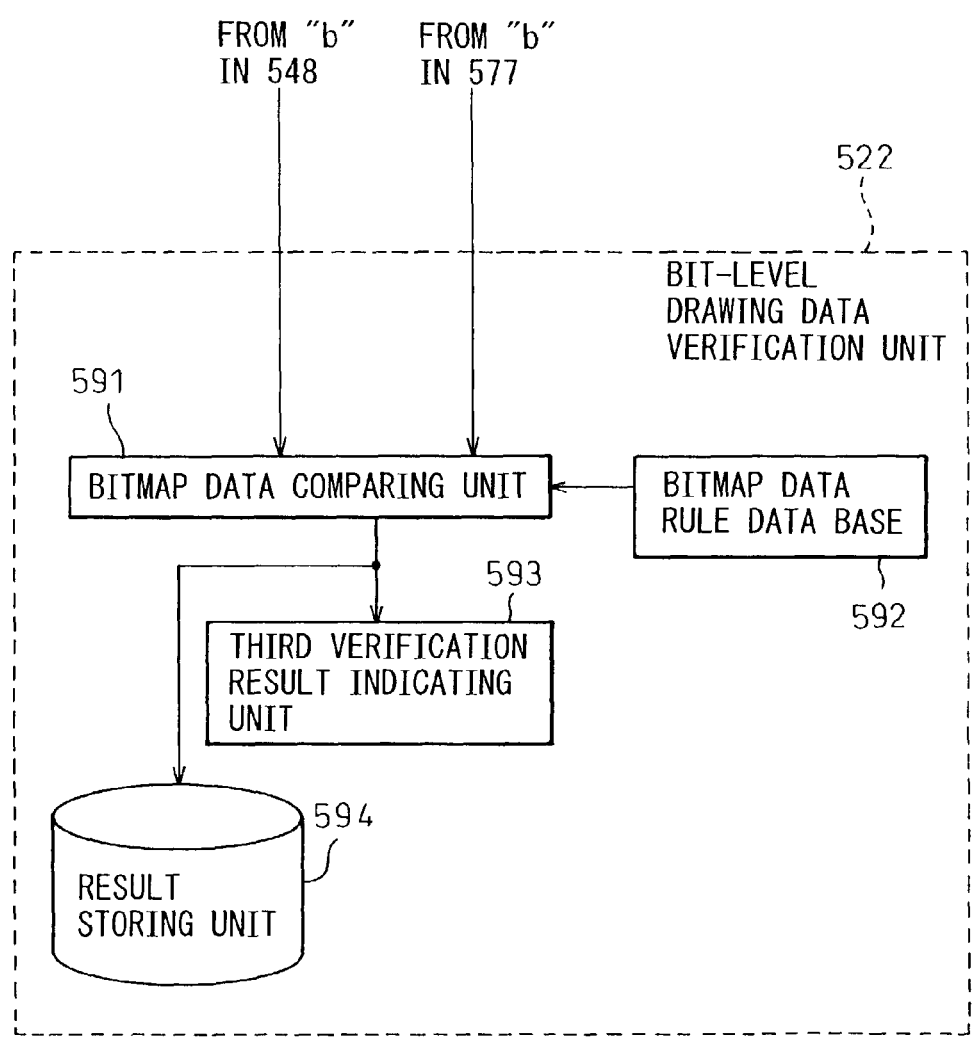
FIG. 32 is a system block diagram (part 3) showing the wiring forming system according to the second modified example of the second embodiment of the present invention.
Figure 33:
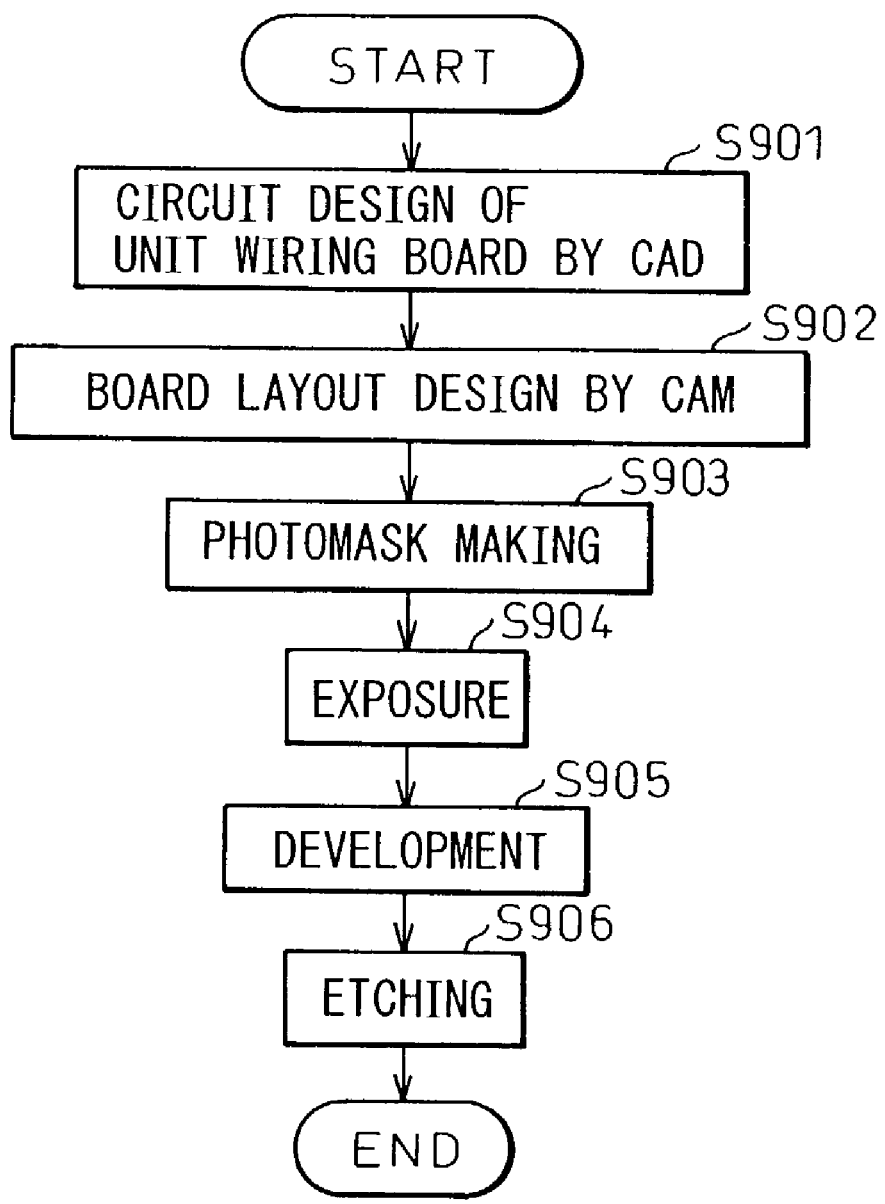
FIG. 33 is a flowchart illustrating a prior art wiring forming process.
Figure 34:
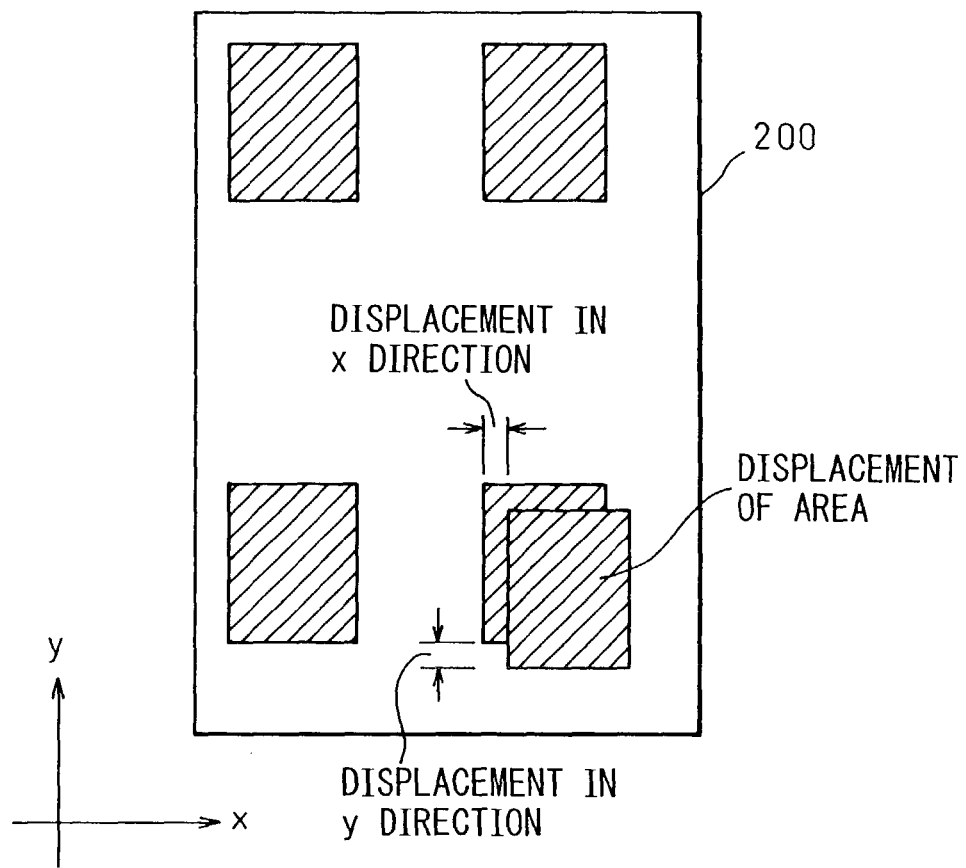
FIG. 34 is a top plan view showing a distorted board as an example.
Figure 35:
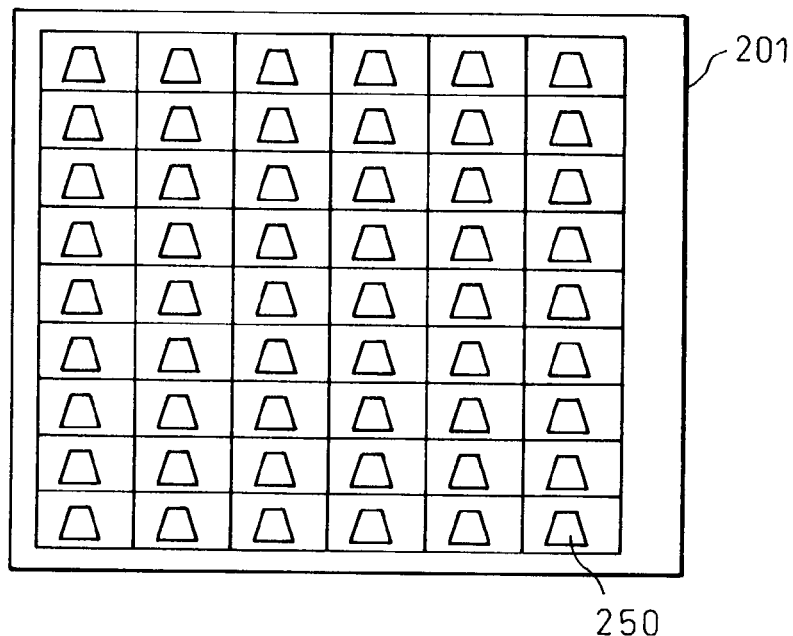
FIGS. 35 and 36 are diagrams schematically explaining when exposure is performed on a distorted board.
Figure 36:
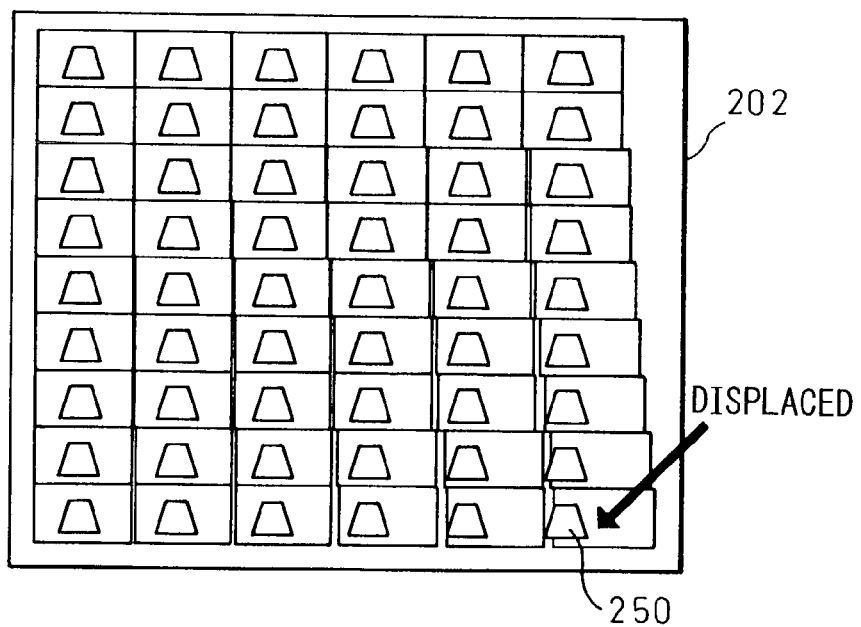

FIGS. 30 to 32 are system block diagrams showing the wiring forming system according to the second modified example of the second embodiment of the present invention.

The second modified example of the present embodiment further includes a process for verifying the accuracy of the bitmap data 547.

As shown in FIG. 30, the modified example differs from the system block previously shown in FIG. 23 by the inclusion of a switching unit 548. When the switching unit 548 in FIG. 30 is switched from "b" to "a", the bitmap data 547 is sent to the inkjet patterning unit 550, as in the case of FIG. 23. On the other hand, when the switching unit 548 in FIG. 30 is switched from "a" to "b", the bitmap data 547 is sent to a bit-level drawing data verification unit 522 in FIG. 32.

Further, as shown in FIG. 31, the modified example differs from the system block previously shown in FIG. 25 by the inclusion of a switching unit 577. When the switching unit 577 in FIG. 31 is switched from "b" to "a", the bitmap data generated by the verification raster image processor 570 and temporarily stored in the internal storage device 571 is sent to the vectorizer 572, and when the switching unit 577 in FIG. 31 is switched from "a" to "b", the bitmap data is sent to the bit-level drawing data verification unit 522 in FIG. 32.

The bit-level drawing data verification unit 522 of FIG. 32 verifies the accuracy, at the bit level, of the drawing data generated in the wiring forming system of the present invention, by using the bitmap data of the drawing data generated by the raster image processor 541 of FIG. 30 and the bitmap data of the verification drawing data generated by the verification raster image processor 570 of FIG. 31.

A bitmap data comparing unit 591 compares at the bit level the drawing data generated by the raster image processor 541 and transferred via "b" in the switching unit 548 in FIG. 30, with the verification drawing data generated by the verification raster image processor 570 and transferred via "b" in the switching unit 577 in FIG. 31. Here, the comparison may be made for the bit map of the entire drawing data or the bit map of a portion thereof.

If it is determined that the drawing data and the verification drawing data match each other, this means that the drawing data generated in the wiring forming system of the present invention is also reliable at the bit level; on the other hand, if it is determined that they do not match, this means that some problem may exist.

In the modified example, the bit-level drawing data verification unit 522 further includes a bitmap data rule data base 592 which stores a inspect rule that defines the allowable level of difference between the bitmap data of the drawing data generated by the raster image processor 541 of FIG. 30 and the bitmap data of the verification drawing data generated by the verification raster image processor 570 of FIG. 31. The bitmap data comparing unit 591 in the bit-level drawing data verification unit 522 verifies the accuracy of the drawing data at the bit level in accordance with the inspect rule stored in the bitmap data rule data base 592.

If an unallowable error is detected by the bitmap data comparing unit 591, a third verification result indicating means 593 in the bit-level drawing data verification unit 522 indicates the result of the bit-level verification. The third verification result indicating means 593 may report the result to the user by outputting text information or an image to a printer or a display monitor or the like. Further, the result of the verification may be stored in a result storing unit 594.

By verifying the bit-level accuracy of the drawing data in the wiring forming system of the present embodiment as described above, the reliability of the system can be further enhanced.

As in the case of the previously described verification process, when the design data is changed, or when forming wiring for an entirely new board, for example, if the verification process of the modified example is executed before putting the wiring forming system into full operation, the wiring can be formed with higher precision and higher accuracy. After the verification is done, the switches in the respective switching unit should be switched back to the normal operating positions.

In the modified example, the bit-level drawing data verification unit has been implemented using a single verification raster image processor having a different algorithm from that of the raster image processor, but it will be recognized that two or more verification raster image processors may be provided; in that case, as the number of verification processors increases, the reliability of the verification process increases correspondingly.

The first modified example and the second modified example may be implemented in combination.

As described above, according to the wiring forming system of the present invention, the design, inspect, and formation of high-precision wiring can be accomplished easily and at high speed; furthermore, as the margin for alignment can be reduced, wiring mounting density increases. Accordingly, the present invention can sufficiently address the need for further miniaturization of wiring expected in the future.

Further, as the scaling correction and the routing are performed dynamically by processing the design data as needed and accumulating the correction information, the invention can flexibly cope with design changes.

In particular, when forming wiring on a multilayer board, the dynamic routing makes it easy to align wiring patterns between layers. Furthermore, using the dynamic routing offers the potential of being able to achieve an entirely new mounting method never before known.

In the wiring forming system of the present invention, the board layout work is replaced by the creation of a simple job deck file; this serves to save labor and reduce the cost and time required for the design work.

By verifying the accuracy of the wiring forming system by using the verification unit according to the present invention, the reliability of the system can be enhanced. In particular, when the design data is changed, or when forming wiring for an entirely new board, for example, if the verification process is executed before putting the wiring forming system into full operation, the wiring can be formed with higher precision.

Furthermore, as the etching correction is converted into a rule by using a mathematical technique known as "the solution of an inverse problem", the need to correct errors through trial and error relying on the experience of a worker can be eliminated, and the work efficiency and accuracy can thus be enhanced.

Moreover, as the present invention does not use a photomask which is required in the prior art, the need for the trial production for determining the process, periodical cleaning before use, and remaking due to the limited lifetime of the photomask, as required in the prior art, can be eliminated completely. The invention can also save resources as the process of the invention does not involve discarding unnecessary boards during the scaling correction.

According to the first embodiment of the present invention, as the board can be inspected after development, the reliability of the wiring forming system can be enhanced easily. Further, in the post-development inspect, as the developed board is tested using the data actually used in the exposure process, the chance of incurring false errors can be reduced.

Furthermore, in the first embodiment of the present invention, the chance of incurring false errors during the inspect after the etching can be further reduced, because the post-etching inspect is performed using the data generated by considering various factors that can occur during the exposure and etching.

According to the second embodiment of the present invention, as the board can be easily inspected after the inkjet patterning, the reliability of the wiring forming system can be enhanced easily. Further, as the post-patterning board is tested using the data actually used in the inkjet patterning process, the chance of incurring false errors can be reduced.

What is claimed is:

1. A wiring forming system for forming wiring on a wiring board, comprising:

a maskless exposure unit which directly exposes an unexposed board by using exposure data generated based on design data relating to said wiring board, said design data comprising predetermined wiring information for a unit wiring board to be formed in said wiring board and predetermined pad layout information for an electronic component to be mounted or formed on said unit wiring board wherein said maskless exposure unit comprises:

- a scaling correction value generating unit which measures shrinkage/expansion of said developed board relative to said unexposed board and generates a scaling correction value correcting the position and shape of said exposure data based on said measured shrinkage/expansion,
- a misalignment data generating unit which measures a displacement between a reference position on an exposure stage at which said unexposed board should normally be placed for exposure and a position on said exposure board at which said unexposed board is actually placed, and which generates misalignment data based on said measured displacement, and
- a plurality of exposure heads which are arranged so as to expose, respectively designated areas on a surface of said unexposed board, and which perform parallel exposure;

a post-development inspect unit which tests said board after development, by using said exposure data and image data of said board exposed and developed by said maskless exposure unit;

an etching unit which etches said developed board;

a post-etching inspect unit which tests an etching pattern formed on said etched board, by using etching inspect data generated based on said design data and image data of said board etched by said etching unit;

a resizing rule generating unit which, based on said design data and the image data of said board etched by said etching unit, estimates optimum design data for obtaining said etched board with a desired result, and generates a resizing rule that indicates how said design data currently used should be corrected to obtain said optimum design data;

a dynamic routing rules data generating unit which, based on said design data and a position on said etched board at which said electronic component is to be mounted or formed on said unit wiring board, generates dynamic routing rules data that indicates how said wiring should be changed to achieve a desired interconnection pattern;

an input data base which stores resized design data generated by correcting said design data in accordance with said resizing rule, said input data base stores said data by dividing each kind of data so as to allocate the data to said respective exposure heads; and a raster image processor which is provided for each of said exposure heads, and which drives said exposure head by taking as an input said each kind of data allocated to said exposure head, wherein, using at least one of said scaling correction value, said dynamic routing rules data, and said misalignment data, said raster image processor distorts graphic data of said resized design data, dislocates the position of said graphic data, and thereby generates said exposure data allocated to said designated area on the surface of said unexposed board.

2. A wiring forming system as claimed in claim 1, wherein said maskless exposure unit includes a mechanical correcting unit which performs correction so as to bring the position of said unexposed board as close as possible to said reference position, by mechanically displacing, based on said misalignment data, said exposure stage on which said unexposed board is actually placed.

3. A wiring forming system as claimed in claim 1, wherein said input data base further stores at least one kind of data selected from the group consisting of: job deck information data indicating how data relating to said unit wiring board should be arranged on said wiring board; position alignment information data; and wiring and placement information data for a passive device to be mounted or formed on said unit wiring board.

4. A wiring forming system as claimed in claim 3, wherein said raster image processor includes a reading unit which, in synchronism with operation of said maskless exposure unit, reads out said design data, said resized design data, and said scaling correction value, allocated to said exposure head.

5. A wiring forming system as claimed in claim 4, wherein said reading unit further reads out said misalignment data in synchronism with operation of said maskless exposure unit.

6. A wiring forming system as claimed in claim 5, wherein, using at least one of said scaling correction value, said dynamic routing rules data, and said misalignment data, said raster image processor distorts graphic data of said design data, dislocates the position of said graphic data, and thereby generates said etching inspect data.

7. A wiring forming system as claimed in claim 6, wherein said etching inspect data has a vector data format extracting a contour of said graphic data.

8. A wiring forming system as claimed in claim 7, further comprising a vectorizer which extracts the image data of said etched board etched by said etching unit, and generates image data having a vector data format.

9. A wiring forming system as claimed in claim 6, further comprising a verification raster image processor which, based on an algorithm different from the algorithm of said raster image processor for generating said etching inspect data, generates etching inspect data and outputs the same as verification etching inspect data, and wherein said post-etching inspect unit includes
- a switching unit which switches data to be input together with said etching inspect data between the image data of said etched board and said verification etching inspect data, and
- an etching inspect data verification unit which verifies the accuracy of said etching inspect data by using said etching inspect data and said verification etching inspect data when an input to said post-etching inspect unit is switched to said verification etching inspect data by said switching unit.

10. A wiring forming system as claimed in claim 9, wherein said etching inspect data verification unit includes second verification result outputting means which outputs a verification result for the accuracy of said etching inspect data.

11. A wiring forming system as claimed in claim 6, further comprising:
- a verification raster image processor which, based on an algorithm different from the algorithm of said raster image processor for generating said etching inspect data, generates etching inspect data and outputs the same as verification etching inspect data; and
- an etching inspect data verification unit which verifies the accuracy of said etching inspect data by using said etching inspect data and said verification etching inspect data.

12. A wiring forming system as claimed in claim 11, wherein said etching inspect data verification unit includes second verification result outputting means which outputs a verification result for the accuracy of said etching inspect data.

13. A wiring forming system as claimed in claim 5, wherein said exposure data has a vector data format extracting a contour of said graphic data.

14. A wiring forming system as claimed in claim 13, further comprising a vectorizer which extracts the contour of said image data of said developed board, and generates image data having a vector data format.

15. A wiring forming system as claimed in claim 5, further comprising a verification raster image processor which, based on an algorithm different from the algorithm of said raster image processor for generating said exposure data, generates exposure data and outputs the same as verification exposure data, and wherein said post-development inspect unit includes a switching unit which switches data to be input together with said exposure data between the image data of said developed board and said verification exposure data, and an exposure data verification unit which verifies the accuracy of said exposure data by using said exposure data and said verification exposure data when an input to said post-development inspect unit is switched to said verification exposure data by said switching unit.

16. A wiring forming system as claimed in claim 15, wherein said exposure data verification unit includes first verification result outputting means which outputs a verification result for the accuracy of said exposure data.

17. A wiring forming system as claimed in claim 15, further comprising:

first bitmap data generating means which generates bitmap data for said exposure data;

second bitmap data generating means which generates bitmap data for said verification exposure data generated by said verification raster image processor; and a bit-level exposure data verification unit which verifies the accuracy of said exposure data at the bit level by using the bitmap data of said drawing data generated by said first bitmap data generating means and the bitmap data of said verification drawing data generated by said second bitmap data generating means.

18. A wiring forming system as claimed in claim 17, wherein said bit-level exposure data verification unit includes third verification result outputting means which outputs a verification result for the accuracy of said exposure data at the bit level.

19. A wiring forming system as claimed in claim 17, wherein said bit-level exposure data verification unit further includes an inspect rule data base which stores an inspect rule that defines an allowable level of difference between the bitmap data of said drawing data generated by said first bitmap data generating means and the bitmap data of said verification drawing data generated by said second bitmap data generating means, and wherein said bit-level exposure data verification unit verifies the accuracy of said exposure data at the bit level in accordance with said inspect rule.

20. A wiring forming system as claimed in claim 5, further comprising:

a verification raster image processor which, based on an algorithm different from the algorithm of said raster image processor for generating said exposure data, generates exposure data and outputs the same as verification exposure data; and an exposure data verification unit which verifies the accuracy of said exposure data by using said exposure data and said verification exposure data.

21. A wiring forming system as claimed in claim 20, wherein said exposure data verification unit includes first verification result outputting means which outputs a verification result for the accuracy of said exposure data.

22. A wiring forming system as claimed in claim 20, further comprising:

first bitmap data generating means which generates bitmap data for said exposure data;

second bitmap data generating means which generates bitmap data for said verification exposure data generated by said verification raster image processor; and a bit-level exposure data verification unit which verifies the accuracy of said exposure data at the bit level by using the bitmap data of said drawing data generated by said first bitmap data generating means and the bitmap data of said verification drawing data generated by said second bitmap data generating means.

23. A wiring forming system as claimed in claim 22, wherein said bit-level exposure data verification unit includes third verification result outputting means which outputs a verification result for the accuracy of said exposure data at the bit level.

24. A wiring forming system as claimed in claim 22, wherein said bit-level exposure data verification unit further includes an inspect rule data base which stores an inspect rule that defines an allowable level of difference between the bitmap data of said drawing data generated by said first bitmap data generating means and the bitmap data of said verification drawing data generated by said second bitmap data generating means, and wherein said bit-level exposure data verification unit verifies the accuracy of said exposure data at the bit level in accordance with said inspect rule.

25. A wiring forming system as claimed in claim 1, wherein said post-development inspect unit includes first inspect result outputting means which outputs a inspect result for said developed board.

26. A wiring forming system as claimed in claim 1, wherein said post-etching inspect unit includes second inspect result outputting means which outputs a inspect result for said etched board.

27. A wiring forming system as claimed in claim 1, wherein said post-etching inspect unit includes a result storing unit which stores information relating to said etched board if said etched board is tested defective.

28. A wiring forming system as claimed in claim 1, further comprising an exposure data verification unit which verifies the accuracy of said exposure data generated based on said design data.

29. A wiring forming system as claimed in claim 28, wherein said exposure data verification unit includes first verification result outputting means which outputs a verification result for the accuracy of said exposure data.

30. A wiring forming system as claimed in claim 1, further comprising an etching inspect data verification unit which verifies the accuracy of said etching inspect data generated based on said design data.

31. A wiring forming system as claimed in claim 30, wherein said etching inspect data verification unit includes second verification result outputting means which outputs a verification result for the accuracy of said etching inspect data.

* * * * *

UNITED STATES PATENT AND TRADEMARK OFFICE
CERTIFICATE OF CORRECTION

| | | |
|---|---|---|
| PATENT NO. | : 7,890,203 B2 | Page 1 of 1 |
| APPLICATION NO. | : 10/444974 | |
| DATED | : February 15, 2011 | |
| INVENTOR(S) | : Masatoshi Akagawa et al. | |

It is certified that error appears in the above-identified patent and that said Letters Patent is hereby corrected as shown below:

Column 11, Line 37 delete "via a in" and insert -- via "a" in --, therefor.

Column 20, Line 50 delete "vectotizer" and insert -- vectorizer --, therefor.

Signed and Sealed this
Tenth Day of May, 2011

David J. Kappos
*Director of the United States Patent and Trademark Office*